United States Patent
Hong et al.

(10) Patent No.: US 9,196,356 B2
(45) Date of Patent: Nov. 24, 2015

(54) STACKABLE NON-VOLATILE MEMORY

(71) Applicant: GLOBALFOUNDRIES Singapore Pte. Ltd., Singapore (SG)

(72) Inventors: Yang Hong, Singapore (SG); Yong Wee Francis Poh, Singapore (SG); Tze Ho Simon Chan, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 321 days.

(21) Appl. No.: 13/802,899

(22) Filed: Mar. 14, 2013

(65) Prior Publication Data

US 2014/0268990 A1 Sep. 18, 2014

(51) Int. Cl.
| | |
|---|---|
| G11C 11/00 | (2006.01) |
| G11C 13/00 | (2006.01) |
| G11C 11/56 | (2006.01) |
| H01L 45/00 | (2006.01) |
| H01L 27/22 | (2006.01) |
| H01L 27/24 | (2006.01) |
| G11C 8/16 | (2006.01) |
| G11C 11/16 | (2006.01) |

(52) U.S. Cl.
CPC .............. *G11C 13/0004* (2013.01); *G11C 8/16* (2013.01); *G11C 11/161* (2013.01); *G11C 11/1675* (2013.01); *G11C 11/5607* (2013.01); *G11C 11/5678* (2013.01); *G11C 11/5685* (2013.01); *G11C 13/0002* (2013.01); *G11C 13/003* (2013.01); *G11C 13/0007* (2013.01); *H01L 27/228* (2013.01); *H01L 27/2436* (2013.01); *H01L 27/2481* (2013.01); *H01L 45/04* (2013.01); *H01L 45/06* (2013.01); *H01L 45/08* (2013.01); *H01L 45/126* (2013.01); *H01L 45/1226* (2013.01); *H01L 45/144* (2013.01); *H01L 45/146* (2013.01); *H01L 45/1675* (2013.01); *G11C 2213/71* (2013.01); *G11C 2213/78* (2013.01); *G11C 2213/79* (2013.01)

(58) Field of Classification Search
CPC .... G11C 11/16; G11C 2213/79; G11C 13/03; G11C 8/16; G11C 13/002; G11C 13/004; G11C 8/08
USPC .............. 365/148, 158, 171, 173, 185.05, 63
See application file for complete search history.

(56) References Cited

U.S. PATENT DOCUMENTS

| | | | |
|---|---|---|---|
| 6,697,294 B1 | 2/2004 | Qi et al. | |
| 2009/0267212 A1* | 10/2009 | Wada et al. | 257/687 |
| 2010/0283028 A1* | 11/2010 | Brubaker et al. | 257/2 |
| 2012/0079330 A1* | 3/2012 | Kawaguchi et al. | 714/718 |
| 2014/0268990 A1 | 9/2014 | Hong et al. | |

\* cited by examiner

*Primary Examiner* — Gene Auduong
(74) *Attorney, Agent, or Firm* — Horizon IP Pte. Ltd.

(57) ABSTRACT

A multi-bit NVM cell includes a storage unit having resistive elements, such as phase change resistive elements. The NVM cell may be configured as a single port or dual port multi-bit cell. The NVM cell includes a cell selector. The cell selector selects the multi-bit cell. When appropriate signals are applied to the NVM cell, the cell selector selects an appropriate resistive element of the storage unit. A plurality of storage units can be commonly coupled to the cell selector, facilitating high density applications.

23 Claims, 37 Drawing Sheets

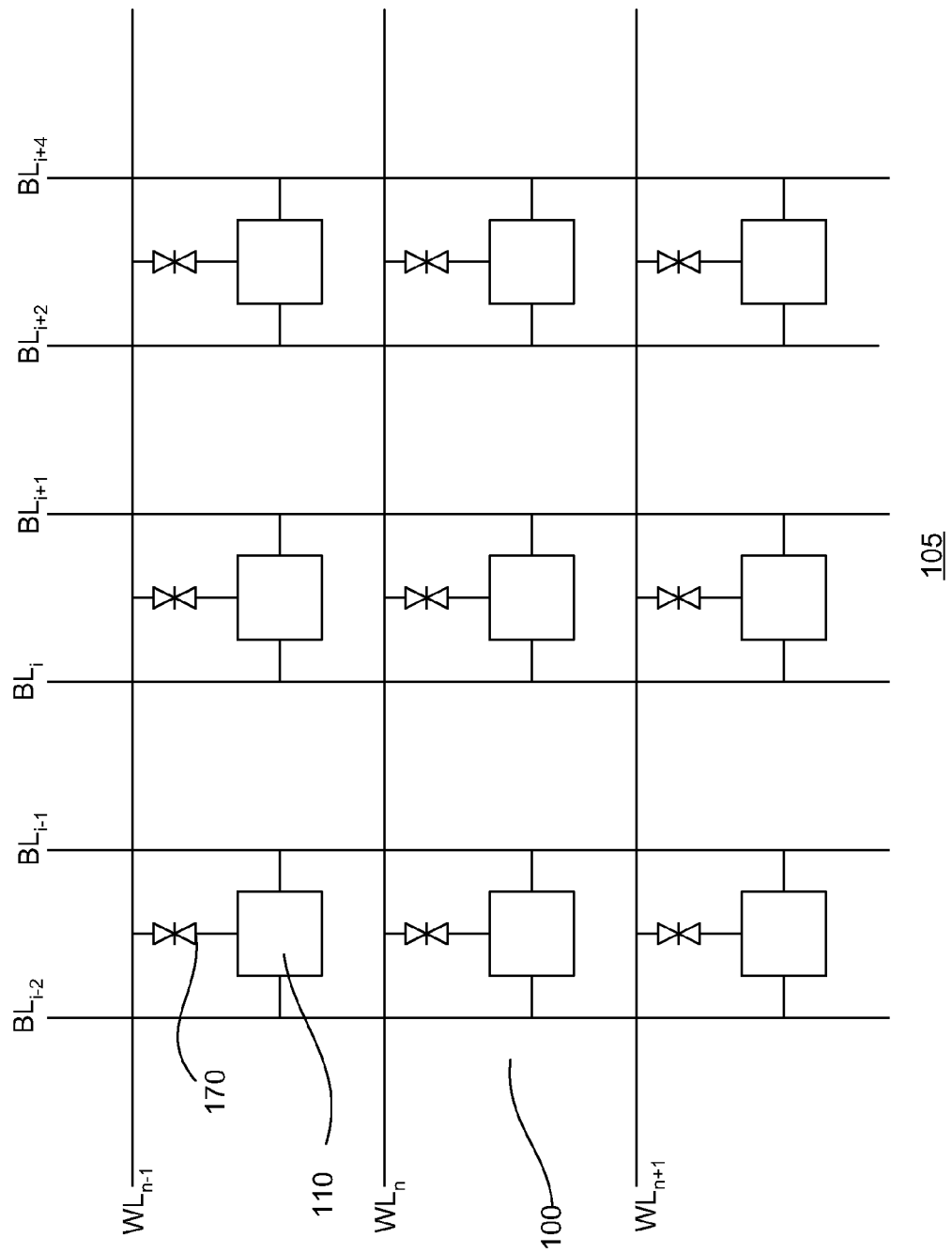

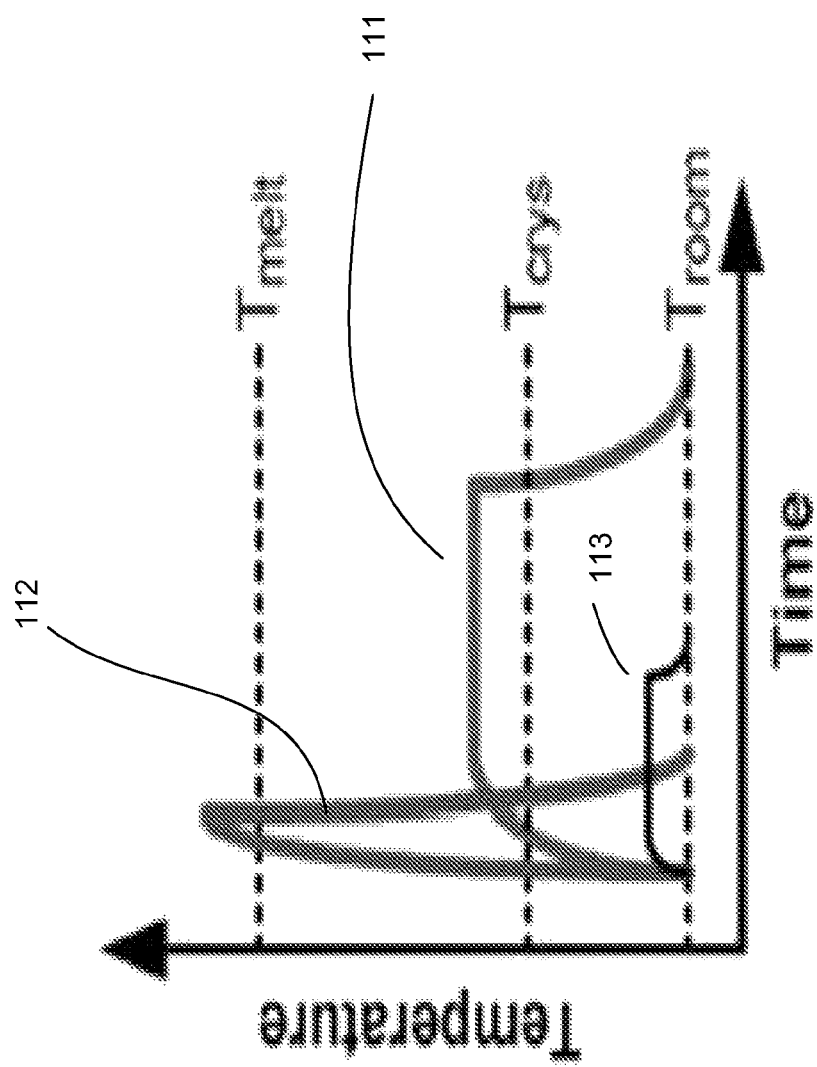

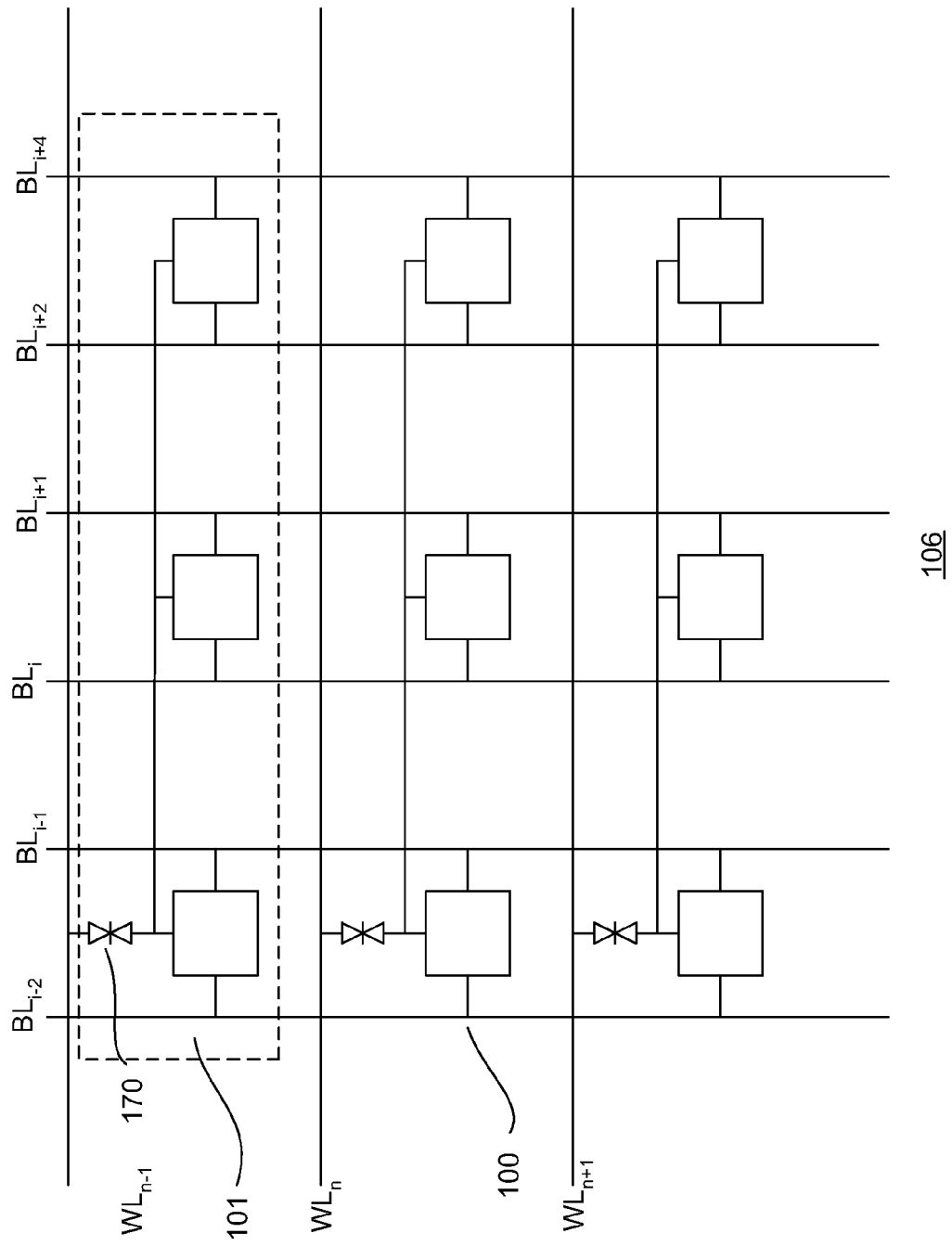

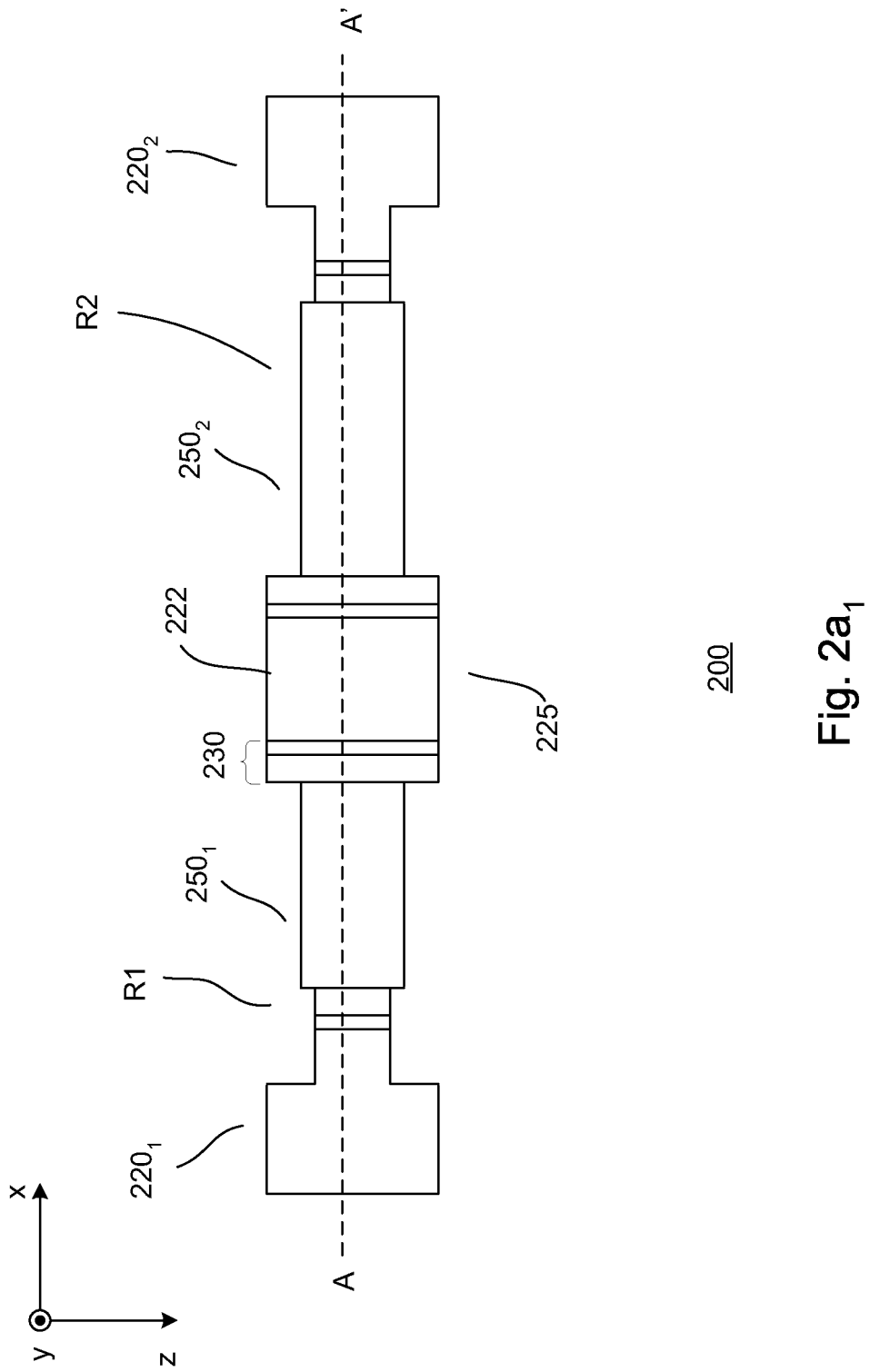
Fig. 2a₁

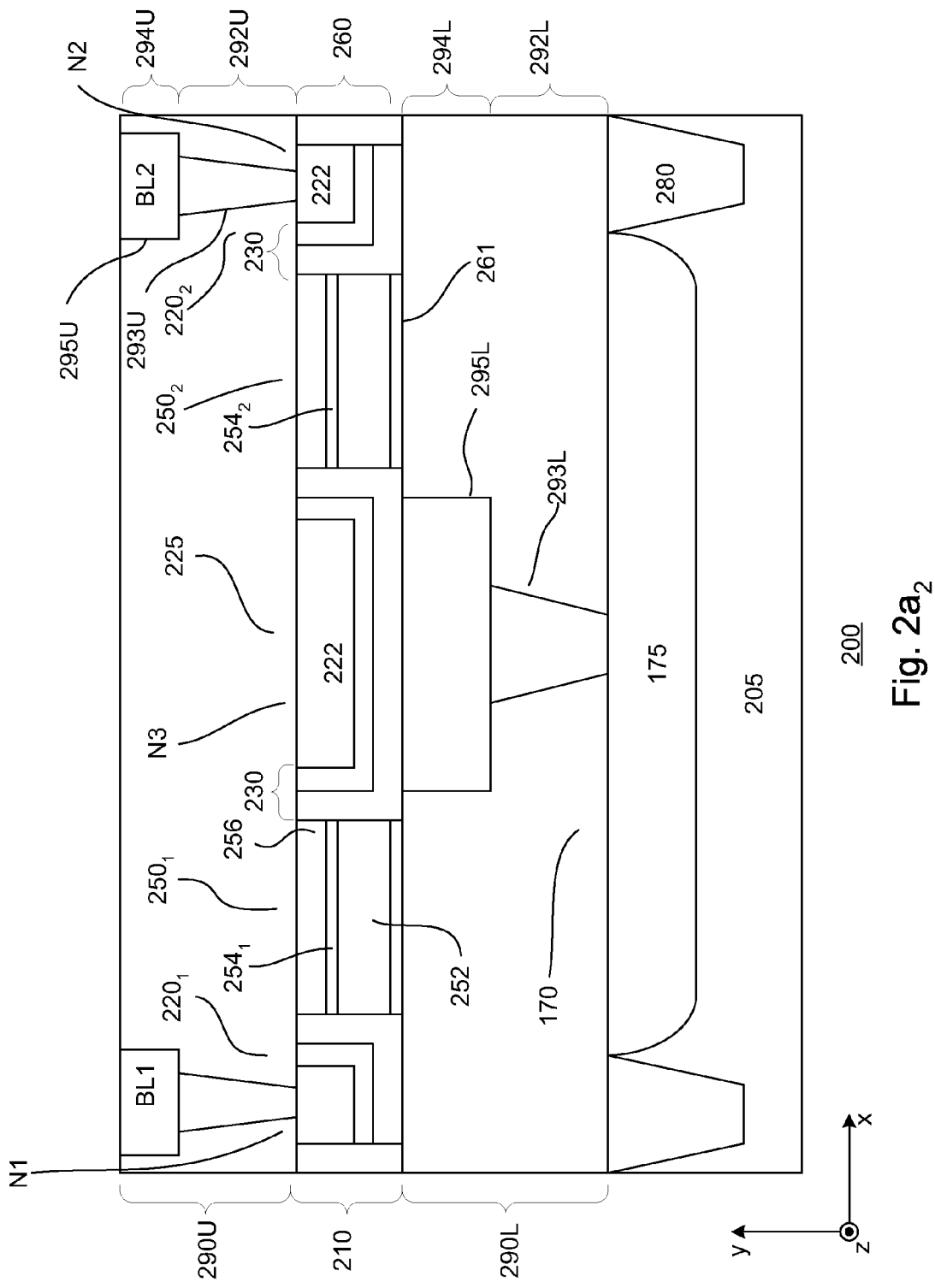
Fig. 2a₂

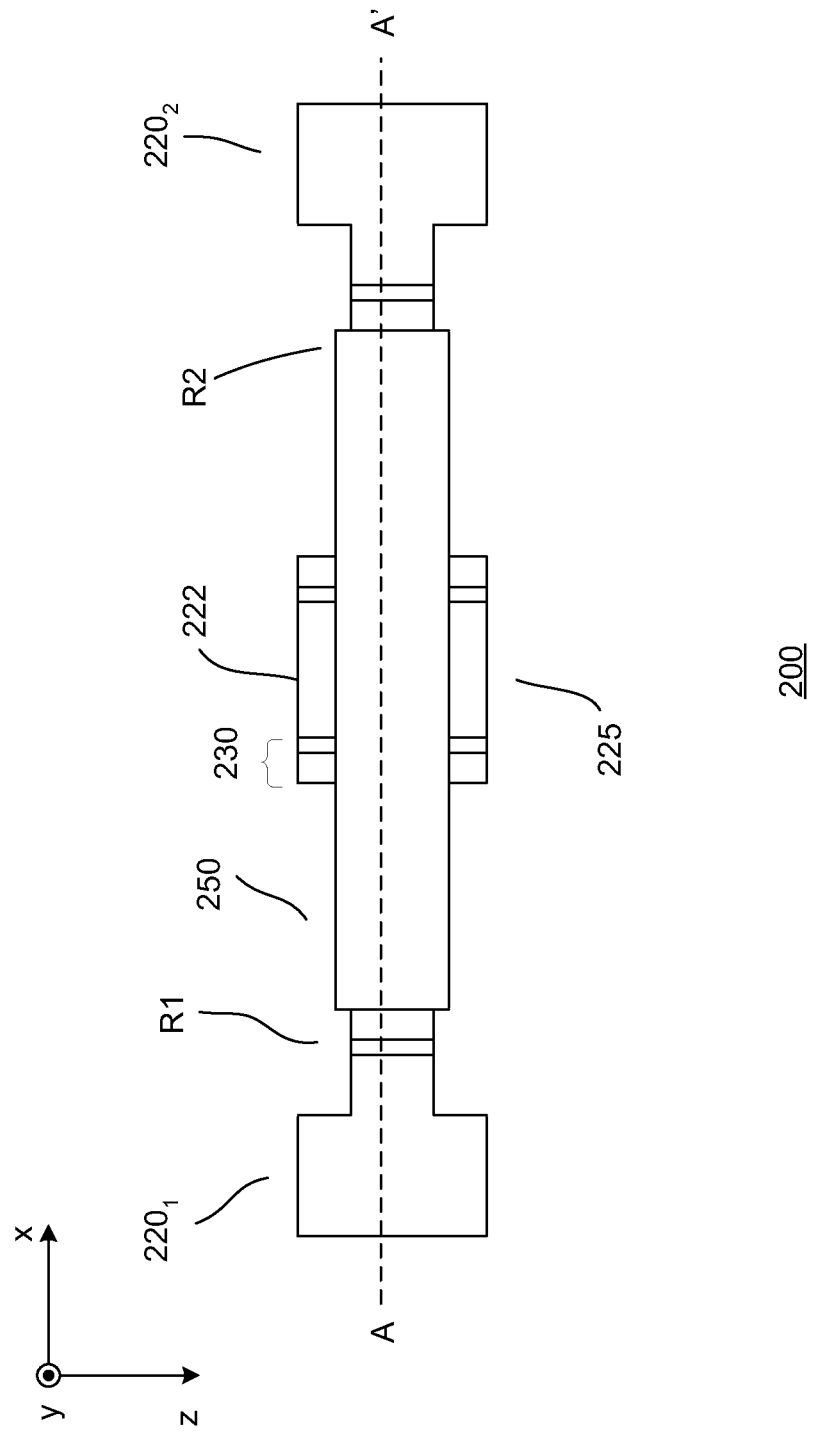

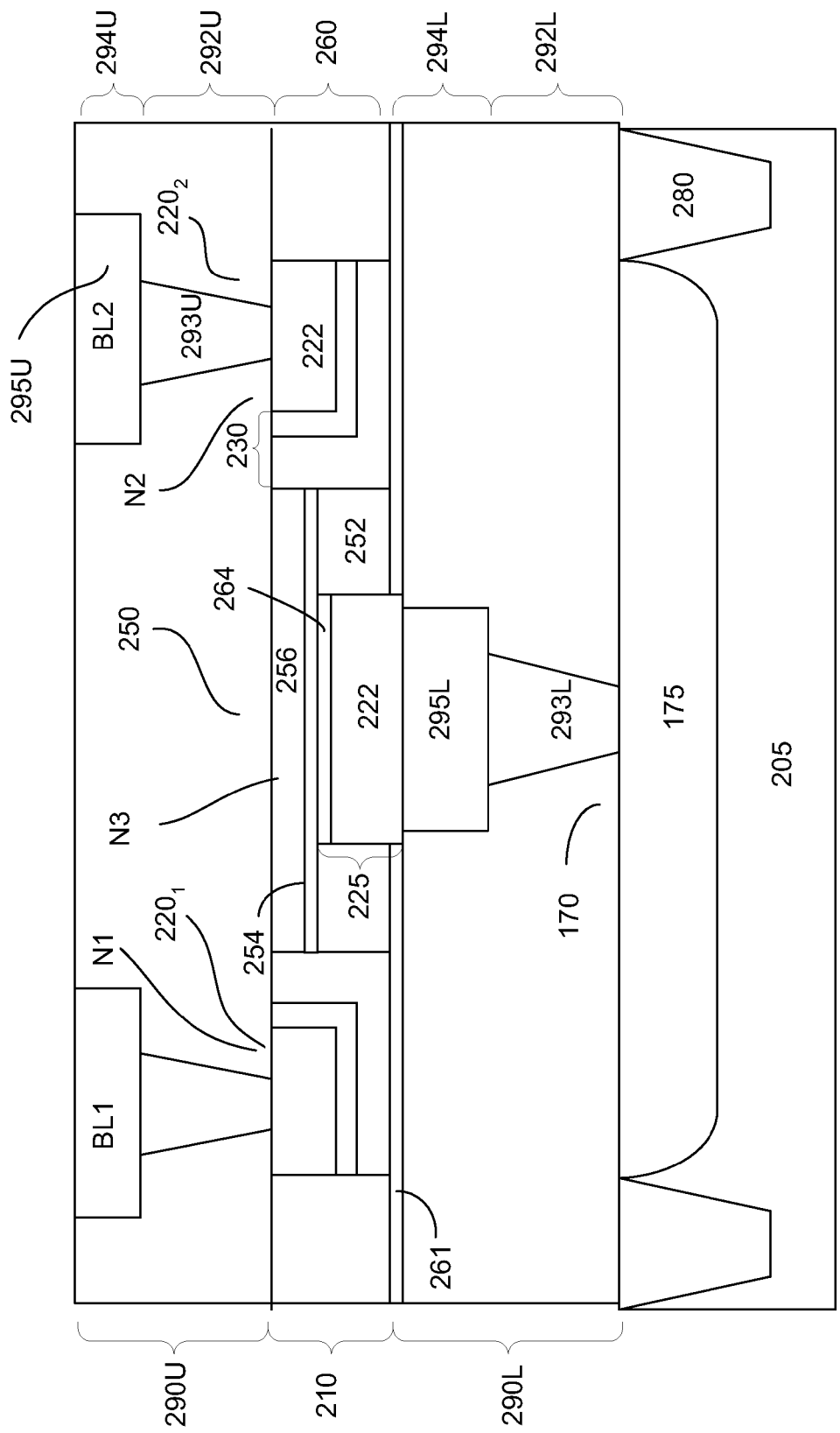
Fig. 2d₂

US 9,196,356 B2

STACKABLE NON-VOLATILE MEMORY

CROSS-REFERENCE TO RELATED APPLICATION

This application cross-references to US patent application, titled "RESISTIVE NON-VOLATILE MEMORY" (application Ser. No. 13/802,841); that is concurrently filed and assigned to the same assignee as this application, which is herein incorporated by reference for all purposes.

BACKGROUND

Resistive-type non-volatile memories (NVMs), such as phase change random access memories (PCRAMs), employ memory elements having different stable resistive states. Such resistive elements enable data corresponding to the different resistive states to be stored. The memory element switches between one resistive state to another. For PCRAMs, the switching between the states involves switching between an amorphous to a crystalline phase. The switching between two phases is achieved by heating the memory element using a heater.

However, conventional resistive NVMs have drawbacks. For example, conventional resistive NVMs, such as PCRAMS, require large programming currents to switch from one resistive state to the other. To produce the necessary programming currents, a large transistor is needed. This results in a large cell size. Furthermore, the memory elements are disposed in close proximity with various heat sinks, for example metal lines as well as top and bottom electrodes, contributing to undesired heat loss and low heating efficiency. Inefficient heating and heat loss, as well as the proximity effect on the neighboring cells result in a decrease in reliability performance and an increase in power consumption due to large programming current requirements.

Therefore, there is a need to improve resistive NVMs.

SUMMARY

A memory cell is disclosed. In one embodiment, the memory cell includes a storage unit having a plurality of resistive elements. The memory cell also includes a cell selector coupled to the storage unit. The selector, when active, selects the memory cell for access. When appropriate signals are applied to the memory cell, the cell selector selects an appropriate resistive element of the storage unit.

In one embodiment, a method of forming a memory cell is disclosed. The method includes providing a substrate. The cell stack includes a cell stack layer disposed between upper and lower cell stack dielectric layers. The method also includes forming first and second bitline (BL) connection units at opposing first sides of the cell stack. The BL connection units are coupled to the cell stack layer, wherein resistive elements are disposed at the interfaces of the cell stack layer and the first and second BL connection units.

In yet another embodiment, a method of forming a memory cell is disclosed. The method includes providing a substrate with a lower metal level. The method also includes forming a cell stack over the lower metal level. The cell stack includes a cell stack layer disposed between upper and lower cell stack dielectric layers. The cell stack layer comprises a phase change material. The method also includes forming first and second bitline (BL) connection units at opposing first sides of the cell stack. The BL connection units are coupled to the cell stack layer by cell stack connectors disposed between the ends of the cell stack layer and BL connection units. The cell stack connectors serve as heaters for the cell stack layer.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the disclosure. In the following description, various embodiments of the present disclosure are described with reference to the following

FIGS. 1c-d show portions of a memory cell array;

FIG. 1e shows an embodiment of temperature-time plot;

FIGS. 1h-i show portions of a memory array;

Figure 2B:
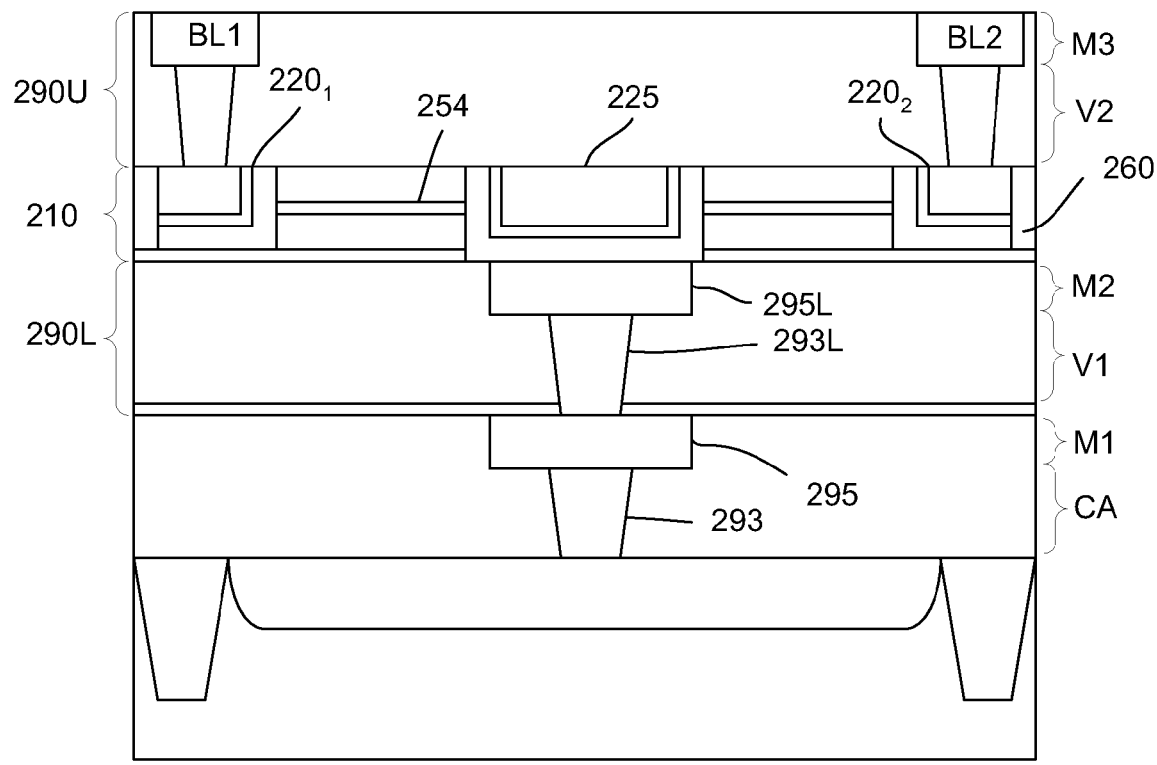
Figure 2C:
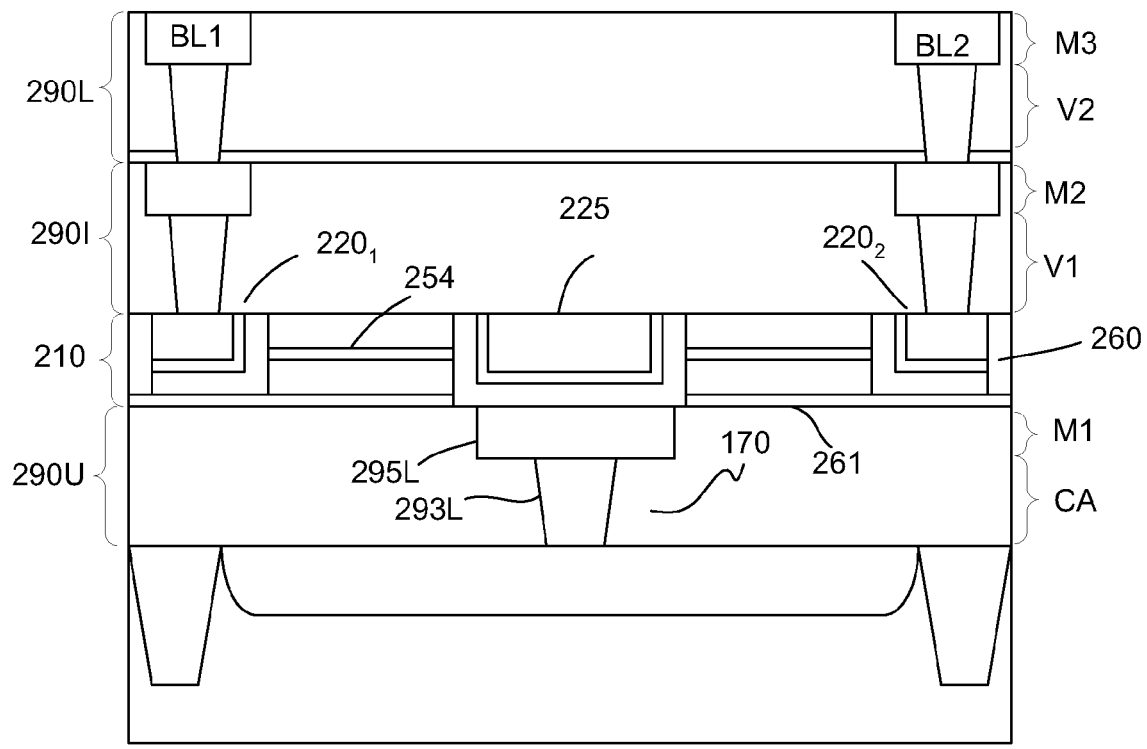
Figure 2E:
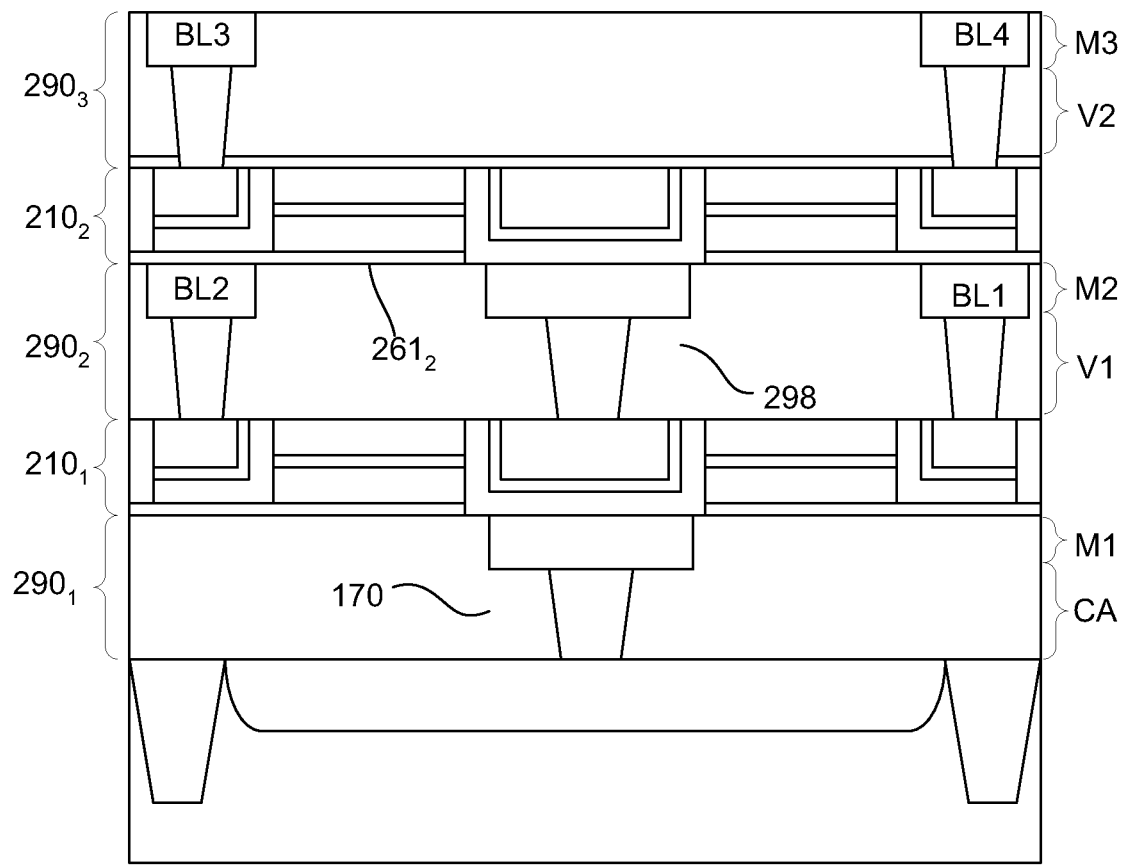
Figure 2F:
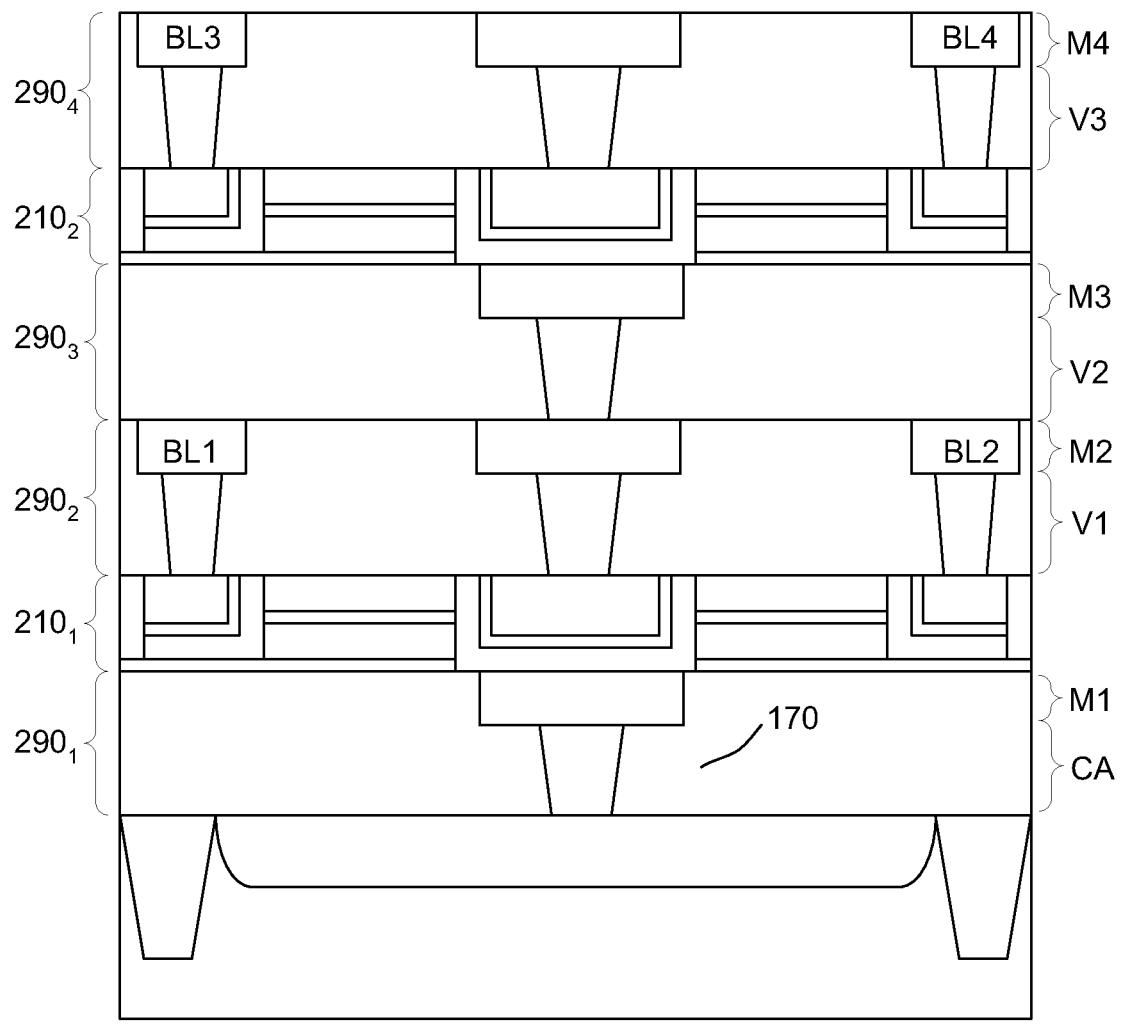
Figure 2G:
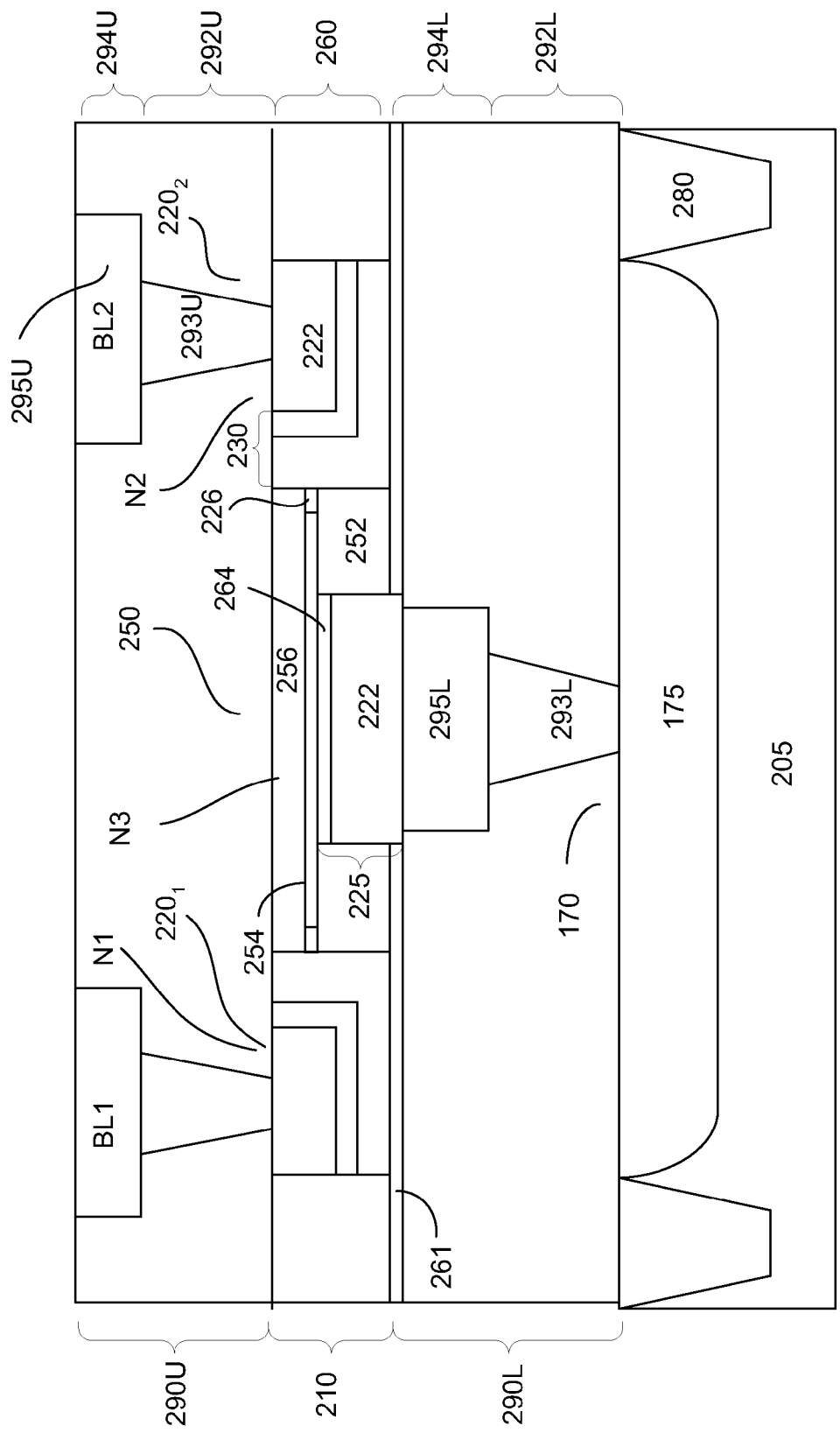

FIGS. $2a_{1-2}$ show various views of an embodiment of a device;

FIGS. 2b-c show various exemplary configurations of storage unit being disposed in metal levels;

FIGS. $2d_{1-2}$ show various views of another embodiment of a device;

FIGS. 2e-f show various exemplary configurations of storage unit being disposed in metal levels;

FIG. 2g shows another embodiment of a device;

FIGS. 3a-i show cross-sectional views of an exemplary process of forming a device; and FIGS. 4a-j show cross-sectional views of another exemplary process of forming a device.

DETAILED DESCRIPTION

Embodiments generally relate to semiconductor devices. More particularly, some embodiments relate to memory devices, such as non-volatile memory (NVM) devices. Such memory devices, for example, can be incorporated into standalone memory devices, such as USB or other types of portable storage units, or ICs, such as microcontrollers or system on chips (SoCs). The devices or ICs can be incorporated into or used with, for example, consumer electronic products, or relate to other types of devices.

Figure 1A:
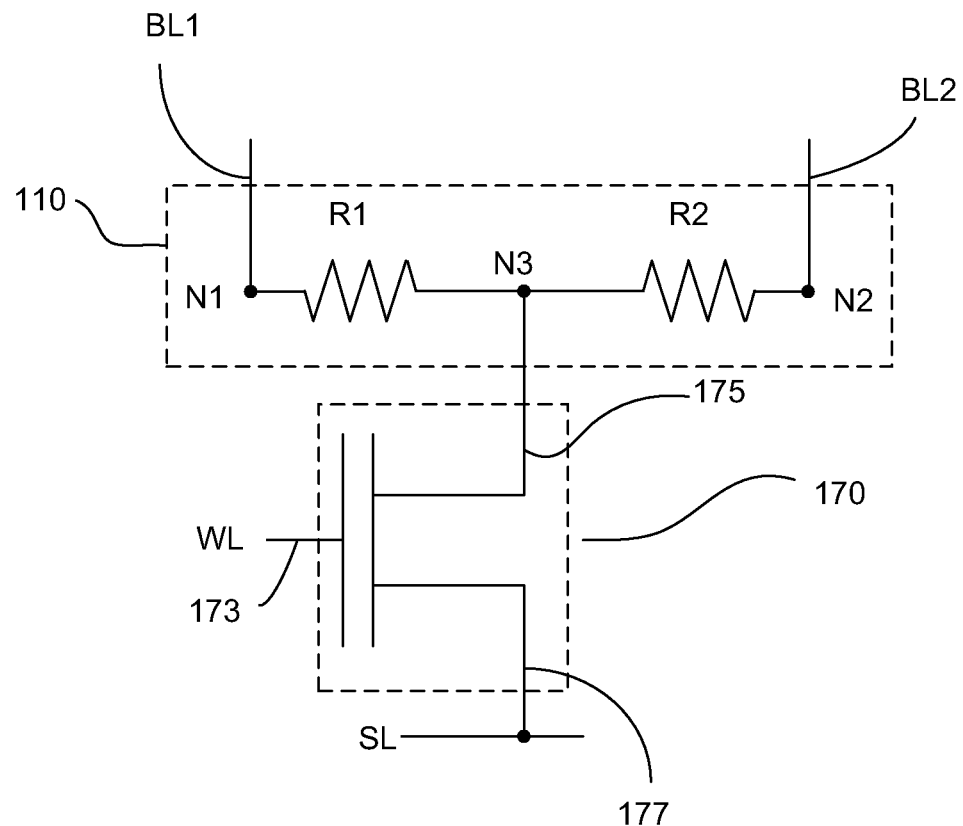
FIG. 1a shows a circuit diagram in accordance with an embodiment of a device.

FIG. 1a shows a schematic diagram of an embodiment of a device. In one embodiment, the device includes a memory cell 100. The memory cell, in one embodiment, is a resistive-type memory cell. In one embodiment, the memory cell is a multi-bit memory cell.

As shown, the memory cell includes a plurality of resistive elements. In one embodiment, the memory cell includes first and second resistive elements R1 and R2. Providing other number of resistive elements may also be useful. The resistive elements are employed for storing information.

A resistive element is a programmable resistive element. The programmable resistive element has multiple stable resistive states. In one embodiment, the resistive element is a bi-stable resistive element having first and second stable resistive states. For example, the resistive element has a stable high resistive state and a stable low resistive state, with one corresponding to a logic "0" and the other corresponding to a logic "1". For example, the high resistive state may represent a logic 0 while the low resistive state may represent a logic 1. Having the high resistive state representing a logic 1 and the low resistive state representing a logic 0 may also be useful. Other configurations of data storage for the resistive element may also be useful. For example, the resistive element may have more than two stable states. For example, the resistive element may have $2^n$ resistive states, where n is a whole number greater than 1. For example, the resistive element may have 4 resistive states (n=2), representing 00, 01, 10 and 11. Other number of resistive states may also be useful.

In one embodiment, the resistive elements include a phase change (PC) material to form PCRAM. Other types of resistive elements forming other types of RAMs may also be useful. The PC material (PCM) has stable first and second phases. For example, the PCM can be in first or second phases, corresponding to resistive states. For example, the first phase is a high resistive state and the second phase is a low resistive state. In one embodiment, the high resistive state is an amorphous phase and the low resistive state is a crystalline phase. One resistive state represents a logic "0" while the other resistive state represents a logic "1". For example, the high resistive state may represent a logic "0" while the low resistive state may represent a logic "1". Other configurations of PCMs may also be useful. In other embodiments, a PCM may have $2^n$ resistive states, where n is a whole number greater than 1. For example, the PCM may have 4 resistive states (n=2), representing 00, 01, 10 and 11. Other number of resistive states may also be useful.

The PCM, in either phase or state, is stable until reset or set. The PCM, for example, is stable at below a threshold temperature. For example, the threshold temperature is about 85° C. Other threshold temperatures may also be useful and may depend on the type of PCM employed. The threshold temperature, for example, should be above normal operating temperature of the device. The retention of the PCM should be, for example, 10 years. The PCM may be reset to the amorphous phase from the crystalline phase by exposing it to a reset condition or set from the amorphous phase to the crystalline phase by exposing it to a set condition.

In one embodiment, the set condition includes heating the PCM at its amorphous phase to a crystallization temperature for a sufficient time to transform it to a crystalline phase. On the other hand, the reset condition includes heating to melt the crystalline PCM and rapidly cooling it so it becomes amorphous. Heating the PCM includes appropriately passing current to a heater or a heating element.

The PCM, in one embodiment, is a chalcogenide material. In one embodiment, the chalcogenide material is a GeSbTe alloy. In one embodiment, the chalcogenide material is $Ge_2Sb_2Te_5$ (GST). Other types of chalcogenide or PCMs may also be employed.

The resistive elements are interconnected to form a resistive circuit or a storage unit 110 of the memory cell. A resistive element includes first and second resistive element terminals (RETs). In one embodiment, first RETs of the first and second resistive elements are commonly coupled. For example, first RETs of R1 and R2 are commonly coupled, forming node N3 of the storage unit. Second RETs of R1 and R2 form node N1 and node N2.

A cell selector 170 is coupled to the storage unit. The cell selector, in one embodiment, is a transistor. As shown, the cell selector is a metal oxide semiconductor (MOS) transistor. The transistor includes gate and first and second transistor terminals 173, 175 and 177. The first transistor terminal is coupled to N3. The second transistor terminal is coupled to a select line SL and the gate terminal is coupled to a wordline WL. First and second bitlines BL1 and BL2 are coupled to the resistive elements. In one embodiment, BL1 is coupled to N1 and BL2 is coupled to N2.

Figure 1B:
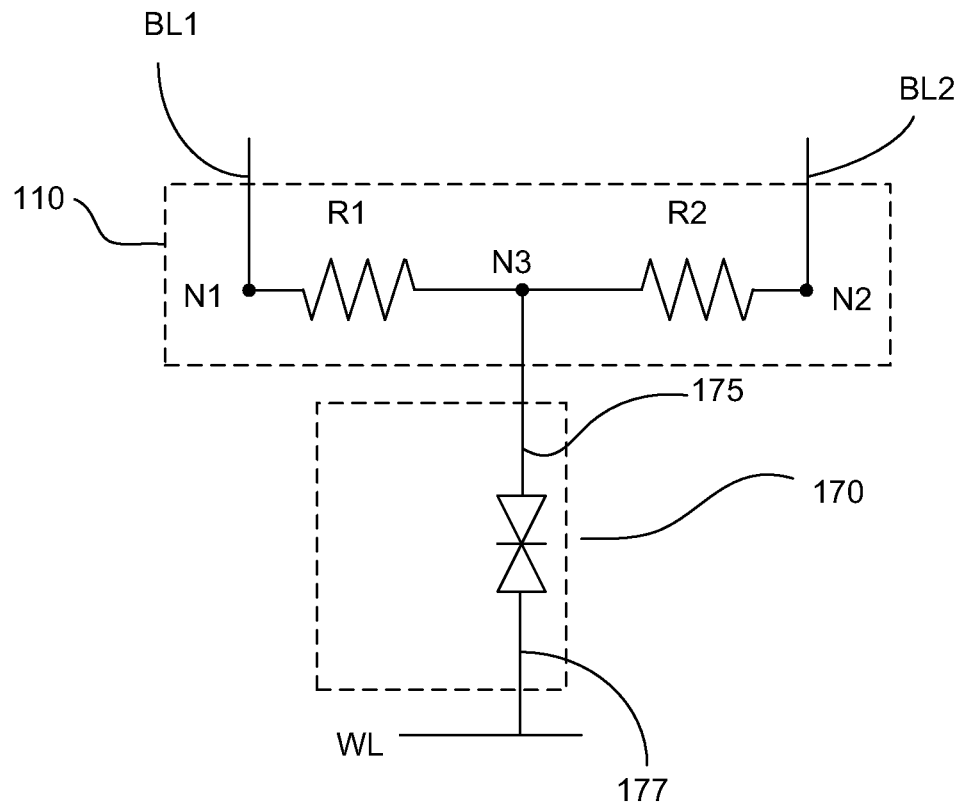
FIG. 1b shows a circuit diagram in accordance with another embodiment of a device.

Alternatively, the transistor of the cell selector may be a bipolar junction transistor (BJT). For example, a first terminal of the BJT may be coupled to N3 while a second terminal may be coupled to SL while the base of the BJT is coupled to a WL. The first and second terminals, for example, are the collector and emitter terminals of the BJT. For example, for a NPN BJT, the collector is coupled to the N3 and the emitter is coupled to the SL. Other types of cell selectors may be employed. For example, in some cases, a diode may be used as a cell selector, as shown in FIG. 1b. In such cases, the diode is provided between N3 and WL, forming a cross-point type of memory cell. For example, a first terminal 175 of the diode is coupled to N3 while a second terminal 177 of the diode is coupled to WL. No SLs are employed for cell selectors which are diodes.

Figure 1C:
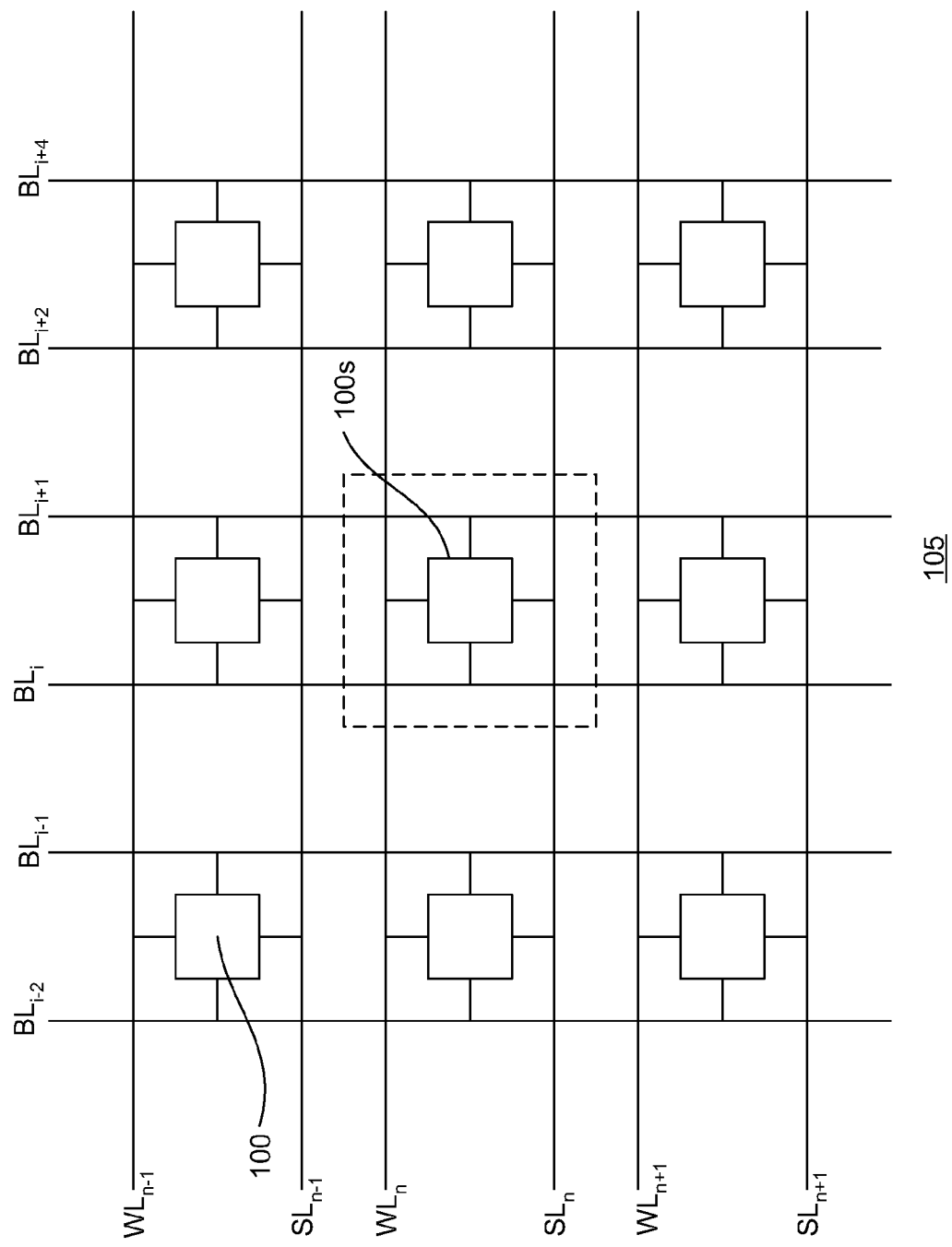

FIG. 1c shows a portion of a memory cell array 105. The portion, as shown, is a 3×3 array of memory cells 100, as described in FIG. 1. The memory cells are interconnected by WLs, BLs and SLs. The array, for example, includes WLs and SLs in the row direction and BLs in the column direction. A memory cell 100s may be selected by applying the appropriate signals to $WL_n$, $BL_i$ and $BL_{i+1}$. For BLs of unselected cells, they are floated or in a high impedance state (Z state). As for the SLs, they may be coupled to the substrate well or ground, effectively forming a common SL. Other configurations of SLs may also be useful. FIG. 1d shows a portion of an array for the case where the cell selector is a diode. As shown, the cell selector 170 is coupled to the storage unit of a memory cell.

The memory cell may be configured as a dual port single-bit or a single port dual bit memory cell. In the case of a dual port configuration, BL1 and BL2 serve as first and second ports while R1 and R2 form the bit of the memory cell. The two resistive states of R1 and R2 in the dual port mode are in opposite states. For example, one is in the high resistance state (RESET state) while the other is in the low resistance state (SET state). One port may be referred to as the true port while the other port may be referred to as the complementary port. For example, the first port is the true port and reflects the data stored in R1 and the second port reflects the complementary data stored in R2. Providing the first port as the complementary port and the second port as the true port may also be useful.

An active signal at the WL selects a row of cells associated with the activated WL. To select a cell within the row of the activated WL, appropriate voltages are provided at BL1 and BL2 associated with the selected cell. As shown, an appropriate positive voltage selects the first bit (R1) while an appropriate negative voltage selects the second bit (R2). The appropriate voltage, in one embodiment, has a magnitude which is larger than the sum of the threshold of the cell selector and the threshold of the PCM. For bit 1, the polarity is positive while for bit 2, the polarity is negative. Other configurations of voltages applied to the BLs for selecting the desired bit of the cell may also be useful.

As described, the dual port memory cell employs the BLs polarity to select the appropriate resistors to access. This results in faster operation as well a larger sensing margin without the need of a reference cell. Thereby, increased performance is achieved. Additionally, larger sensing margin leads to simpler or less complex peripheral circuits, resulting in smaller area needed.

Table 1a below shows signals at BLs, WL and SL for a program access for the memory cell configured as a dual port single bit cell:

TABLE 1a

| Program Access | BL1 | BL2 | WL | SL |
|---|---|---|---|---|
| Bit = 0 | RESET Pulse (R1:high R) | SET Pulse (R2:Low R) | $V_{WLA}$ | GND |
| Bit = 1 | SET Pulse (R1:low R) | RESET Pulse (R2:high R) | $V_{WLA}$ | GND |

Table 1a, as shown, reflects signals for logic 1 as being low impedance and logic 0 as being high impedance and BL1 is the true port and BL2 is the complementary port. In the case that logic 1 corresponds to high impedance and logic 0 corresponds to low impedance, the SET and RESET signals may be switched. To perform a read access, the signals applied to the bitlines (read pulses) may be similar, but lower than the threshold voltage of the PCM. For example, the magnitude of the read voltage applied to the BLs is less than the melt and crystallization temperature of the PCM. As for $V_{WLA}$ signal, it is equal to the active signal at the WL to select a row of cells. For non-selected rows, an inactive WL signal $V_{WLI}$ is provided. For example $V_{WLA}$ may be a logic 1 signal and a $V_{WLI}$ is a logic 0 signal. For example, in the case of FIG. 1b, $V_{WLA}$ is applied to $WL_n$, and SET and RESET signals are applied to $BL_i$ and $BL_{i+1}$. Other configurations of $V_{WLA}$ and $V_{WLI}$ may also be useful.

As discussed, the memory cell may also be configured as a single port dual-bit memory cell. The bit of the selected cell is selected based on the voltage applied to the BL1 and BL2. In the case of a single port dual-bit memory cell, BL1 accesses R1 while BL2 accesses R2. Table 1b below shows a signals applied to the WL, SL and BLs for a program access:

TABLE 1b

| Program Access | BL1 | BL2 | WL | SL |
|---|---|---|---|---|
| Bit 1 = 0 | RESET Pulse (R1:high R) | Floating or High Z | $V_{WLA}$ | GND |
| Bit 1 = 1 | SET Pulse (R1:low R) | Floating or High Z | $V_{WLA}$ | GND |
| Bit 2 = 0 | Floating or High Z | RESET Pulse (R2:high R) | $V_{WLA}$ | GND |
| Bit 2 = 1 | Floating or High Z | SET pulse (R2:low R) | $V_{WLA}$ | GND |

Table 1b, as shown, reflects signals for logic 1 as being low impedance and logic 0 as being high impedance. In the case that logic 1 corresponds to high impedance and logic 0 corresponds to low impedance, the SET and RESET signals may be switched. To perform a read access, the signals applied to the bitlines (read pulses) may similar, but lower than the threshold voltage of the PCM. For example, the magnitude of the read voltage applied to the BLs is less than the melt and crystallization temperature of the PCM. As for $V_{WLA}$ signal, it is equal to the active signal at the WL to select a row of cells. For non-selected rows, an inactive WL signal $V_{WLI}$ is provided. For example $V_{WLA}$ may be a logic 1 signal and a $V_{WLI}$ is a logic 0 signal. In the case of FIG. 1b, $V_{WLA}$ is applied to $WL_n$, and SET and RESET signals are applied to $BL_i$ and $BL_{i+1}$. Other configurations of $V_{WLA}$ and $V_{WLI}$ may also be useful.

FIG. 1e shows an embodiment of temperature-time plot 108 for the SET, RESET and READ pulses. Referring to FIG. 1e, curve 111 is the SET pulse. As shown, the SET pulse has a slow rise time to above the crystallization temperature of the PCM. The SET pulse, once it reaches the peak temperature, has a linear portion and a slow fall time to room temperature. This is to ensure that the PCM sufficiently crystallizes after being above the crystallization temperature. As for the RESET pulse 112, it has a fast rise time to above the melting temperature of the PCM and a fast fall time to room temperature. This is to ensure that the PCM melts and does not have a chance to crystallize. As for the read pulse 113, it has a peak voltage below the crystallization temperature. The read pulse remains at the peak read voltage sufficiently long to perform the read access. This ensures that the phase of the PCM is not changed.

Table 1c shows various voltage values for the different signals of BLs and WL. The voltages are exemplary values and may differ, depending on the technology.

TABLE 1c

| Signals | Value (V) |
|---|---|
| $V_{WLA}$ | About 1.8 |
| $V_{WLI}$ | 0 |
| $V_{SL}$ | 0 |
| $V_{BL}$(unselected) | Floating or high-Z state |
| $V_{BL}$ RESET Pulse | About 50 ns duration with peak V of about 1.8 ~ 2.5 V |
| $V_{BL}$ SET Pulse | About 100 ~ 300 ns duration with peak V of about 1.8 ~ 2.8 V |
| $V_{BL}$ Read Pulse | About 50 ~ 150 ns duration at about 1.2 ~ 1.5 V |

The values of the signal provided in Table 1c are exemplary. These values may change, depending on, for example, the technology. The various signals should be sufficient to achieve the objective, such as performing the memory access (e.g., programming and reading) on the desired bit of the memory cell. Furthermore, it is understood that the stimuli for setting and resetting is the current which is produced by the voltage pulses. The voltage pulses are provided to produce the desired SET and RESET currents. For example, in the case of a SET current, it may be about 120 μA while the RESET current is about 200 μA for 40 nm node. Other SET and RESET current values may also be useful. As for the Read pulse, it may have a shorter duration, such as about 12~25 ns for a resistive element set at about 500~1000 ohms. Other Read pulse durations may also be useful.

Figure 1F:
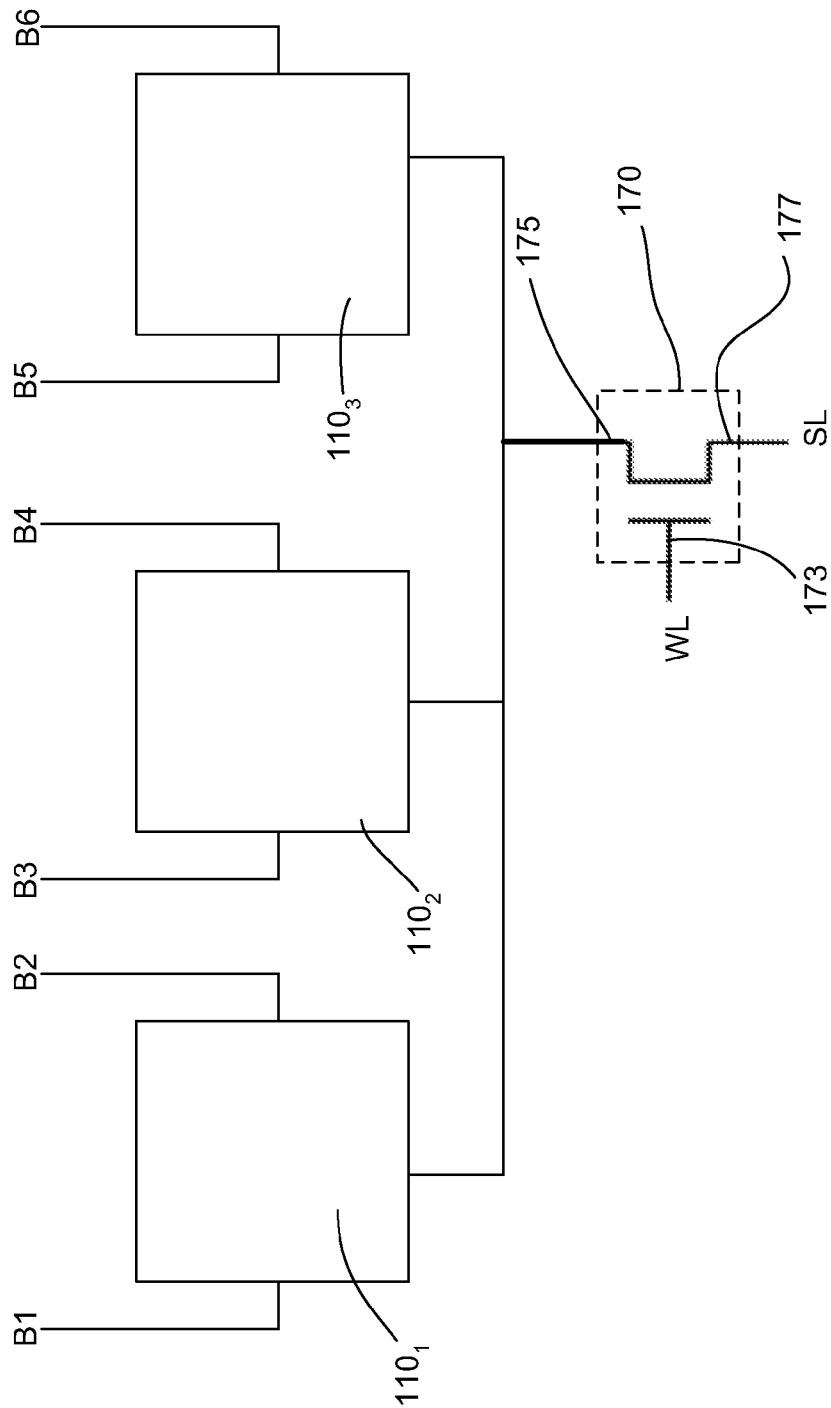
FIGS. 1f-g show exemplary embodiments of a memory cell.

FIG. 1f shows an alternative embodiment of a memory cell 101. The memory cell is similar to that described in FIG. 1a. Common elements may not be described or described in detail. As shown, the memory cell includes a cell selector 170 coupled to a plurality of storage units 110. As an example, the cell selector is coupled to first, second and third storage units $110_{1-3}$. Providing other numbers of storage units may also be useful. The number of storage units, for example, may depend on the number of metal level in the IC.

Figure 1G:
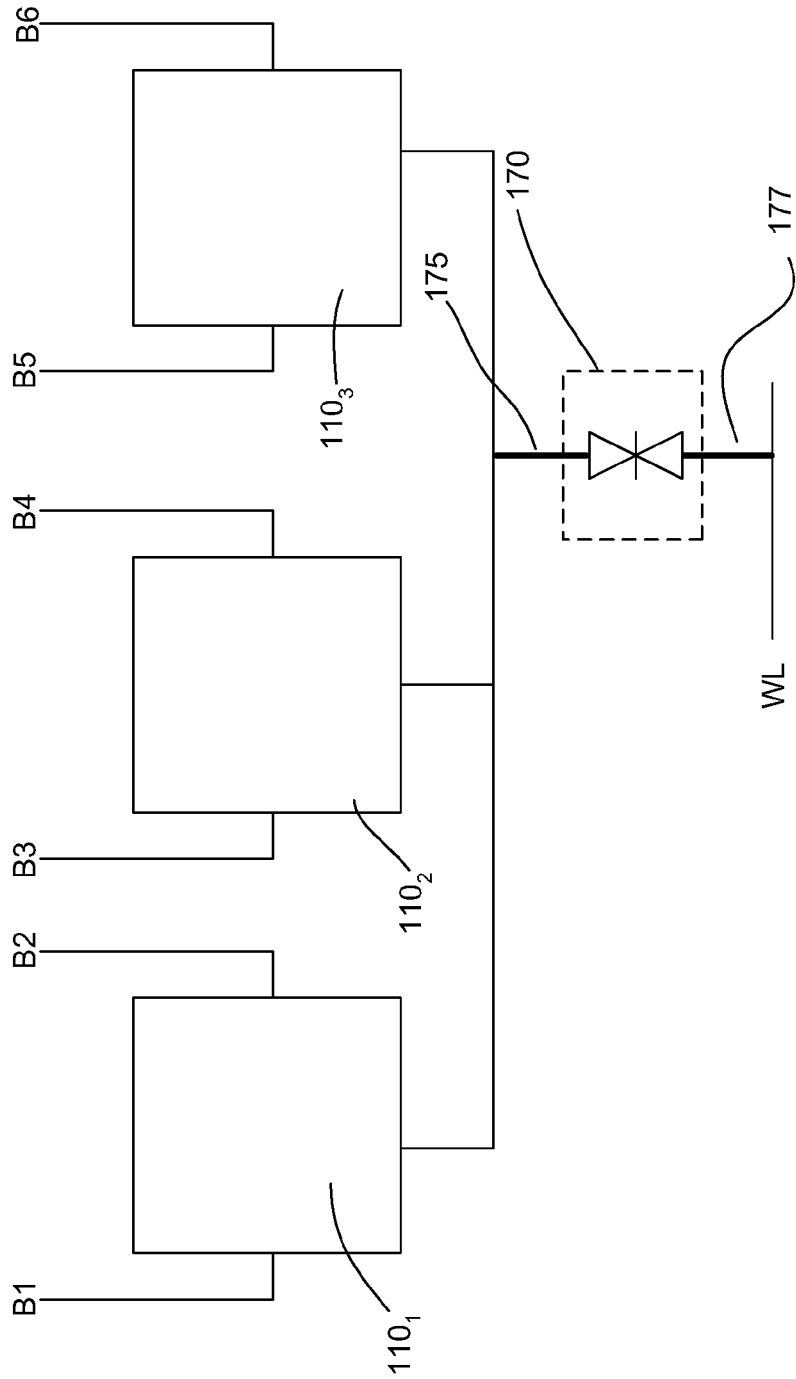

The cell selector, for example, may be a MOS transistor. Other types of cell selectors may also be useful. As shown, a first terminal 175 of the cell selector is coupled to N3 of the plurality of storage units. When a WL coupled to a control terminal of the cell selector, the various storage units coupled to it are selected. FIG. 1g shows an alternative embodiment of the memory cell 101. As shown, the cell selector 170 is a diode coupled to a plurality of storage units. For example, the cell selector is coupled to first, second and third storage units $110_{1-3}$.

Figure 1H:
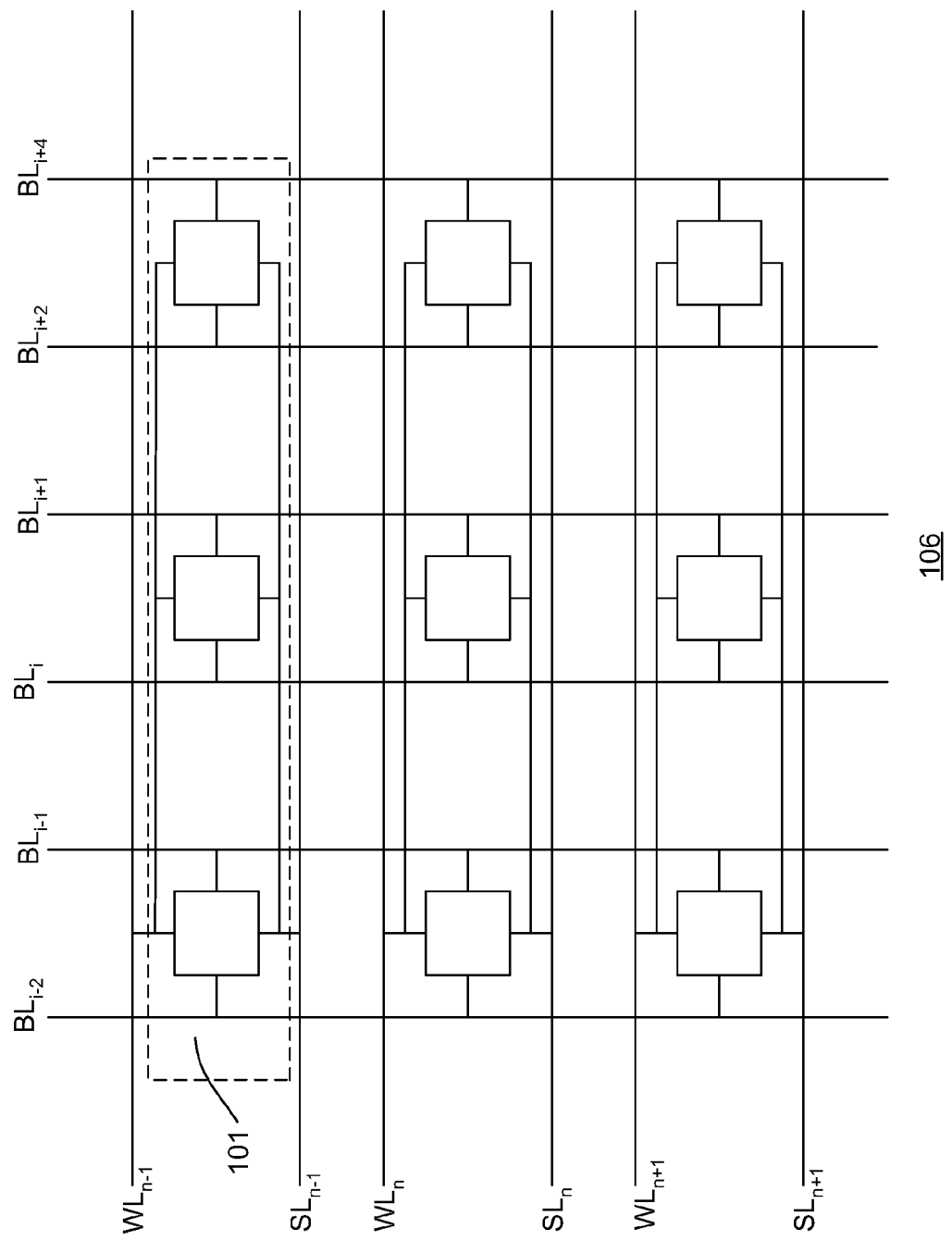

FIG. 1h shows a portion of a memory array 106. The portion, as shown, is a 1×3 array of memory cells 101, as described in FIG. 1f. The memory cells are interconnected by WLs, BLs and SLs. The array, for example, includes WLs and SLs in the row direction and BLs in the column direction. Alternatively, the WLs and SLs may be in the column direction and BLs in the row direction. Other configurations of WLs, SLs and BLs may also be useful. A row in the portion, as shown includes one memory cell with 3 storage units. For example, a storage unit is coupled to first and second BLs. The storage units of a memory cell are selected by activating primary selector of the memory cell. Selecting a bit of the selected storage units is achieved by applying the appropriate voltages to the BLs of the memory cell. FIG. 1*i* shows another embodiment of a memory array 106. The array includes memory cells, as described in FIG. 1*g*.

As described, the resistive elements include a PCM. In other embodiments, the resistive element may be formed of a resistive material to form resistive RAMs (ReRAMs) or a magnetic resistive material to form a spin torque transfer RAM (STT-RAMs). Other types of resistive materials or RAMs having changeable resistive states may also be useful for the resistive elements. For example, any 2-terminal resistor-based RAM which uses a resistor's changeable resistance to represent logic states, such as "0" or "1" may be useful.

In the case of the resistive material (RM), it is a dielectric material which has first and second resistive states. For example, the first state is a high resistive state and the second state is a low resistive state. One resistive state represents a logic "0" while the other resistive state represents a logic "1". For example, the high resistive state may represent a logic "0" while the low resistive state may represent a logic "1". Other configurations of data storage for the ReRAM may also be useful.

The RM may be a material which can form filaments. For example, the RM may be a non-stoichiometric metal oxide layer, such as hafnium oxide ($HfO_2$) or tantalum oxide ($TaO_x$ or $Ta_2O_x$, where x is not an integer) layer. Other types of RMs may also be useful. A RM is subjected to a forming procedure which creates conduction paths of filaments. The filaments can be reset or broken by subjecting the fin to a reset procedure or condition; the filaments can be set or re-formed by subjecting the RM to a set procedure or condition. A reset RM with broken filaments results in a high resistive state (e.g., logic "0") while a set RM with formed or re-formed filaments results in a low resistive state (e.g., logic "1").

Generally, the SET and RESET currents for RM are in the opposite direction. For example, the RM uses bipolar currents for SET and RESET. One polarity may be provided at the BL while the other may be provided at the SL. Providing unipolar currents for SET and RESET may also be useful.

As for the magnetic resistive material (MRM), it is a magnetic material having first and second resistive states. The resistive states may depend on the magnetization polarity or direction of the MRM. In one embodiment, the MRM includes first and second MRM layers, one with fixed magnetization polarity or direction (fixed or pinned layer) and one with active or switchable magnetization polarity or direction (active or free layer). A tunneling layer may be provided between the first and second MRM layers, forming a MR stack. The free MRM layer may be, for example, CoFeB, the tunneling layer may be MgO and the pinned layer may be CoFeB/Ru/CoFeB. Other types of MRM stack may also be useful. The magnetization direction of the pinned and free layers may be aligned in a direction parallel to the MR stack or perpendicular to the MR stack.

Switching of the magnetic field of the free layer may be achieved by applying a spin polarized current into the free layer to switch the orientation of the magnetic field. Depending on the direction of the current, the magnetic field switches from one direction to the other. For example, bidirection or bipolar currents are used to switch the magnetic field of the free layer to the desired direction. As such, the SET and RESET currents are in the opposite direction. In one embodiment, a high resistive state is produced when the free and pinned layers have opposite magnetization polarity (reset) and a low resistive state is produced when the free and pinned layers have coincident magnetization polarity (set). One resistive state represents a logic "0" while the other resistive state represents a logic "1". For example, the high resistive state may represent a logic "0" while the low resistive state may represent a logic "1". Other configurations of data storage for the STT-RAM may also be useful.

The RM and MRM elements may be accessed similarly to that of the PCM elements. For example, a programming access may include applying SET and RESET signals to the BLs while read signal is applied for a read access. The actual values and parameters may vary, depending on the material used. For example, the programming signals should be sufficient to perform setting and resetting the elements into low and high resistive states while the read signal does not affect the current state of the elements.

FIGS. $2a_{1-2}$ show various views of an embodiment of a device. FIG. $2a_1$ shows a top view of the device. The top view omits upper dielectric layers, including dielectric layer 256. FIG. $2a_2$ shows a cross-sectional view of the device along a first direction between A and A'. The first direction, as shown, is along a wordline direction. A perpendicular direction to the first direction may be the bitline direction.

The device includes a memory cell 200. In one embodiment, the memory cell is similar to the memory cell described in FIG. 1*a*. Common elements may not be described or described in detail.

The memory cell is disposed on a substrate 205. The substrate, for example, is a semiconductor substrate, such as a silicon substrate. For example, the substrate may be a lightly doped p-type substrate. Providing an intrinsic or other types of doped substrates, such as silicon-germanium (SiGe), germanium (Ge), gallium-arsenic (GaAs) or any other suitable semiconductor materials, may also be useful. In some embodiments, the substrate may be a crystalline-on-insulator (COI) substrate. A COI substrate includes a surface crystalline layer separated from a crystalline bulk by an insulator layer. The insulator layer, for example, may be a dielectric insulating material. The insulator layer, for example, is formed from silicon oxide, providing a buried oxide (BOX) layer. Other types of dielectric insulating materials may also be useful. The COI substrate, for example, is a silicon-on-insulator substrate. For example, the surface and bulk crystalline layers are single crystalline silicon. Other types of COI substrates may also be useful. It is understood that the surface and bulk layers need not be the same material.

The memory cell includes a storage unit 210 disposed between two interlevel dielectric (ILD) layers on the substrate. For example, the storage unit is disposed between upper and lower ILD layers 290U and 290L. The ILD layers may be formed of silicon oxide. Other types of dielectric materials may also be useful for the ILD layers. It is understood that the different ILD layers need not be formed of the same material or have the same configuration.

An ILD layer includes a metal level and a contact level. For example, the upper ILD layer includes an upper metal level 294U and an upper contact level 292U while the lower ILD layer includes a lower metal level 294L and a lower contact level 292L. Metal levels include conductors while contact levels include contacts. For example, upper metal level includes upper conductors 295U, upper contact level includes upper contacts 293U, lower metal level includes lower conductors 295L and lower contact level includes lower contacts 293L. The conductors and contacts may be formed of a metal, such as copper, copper alloy, aluminum, tungsten or a combination thereof. Other suitable types of metal, alloys or conductive materials may also be useful.

In one embodiment, the lower metal level is the first metal level M1 and the upper metal level is a second metal level M2 of the device. In such case, the lower contact level is a pre-metal dielectric (PMD) or contact (CA) level and the upper contact level is a first via level V1. Contacts at the PMD level may be tungsten contacts while contacts at the V1 level may be copper or copper alloy. Other types of conductive materials, such as aluminum, may also be useful. Other configurations of contacts at the contact levels may also be useful.

In general, the storage unit may be disposed between any two metal levels of the device. For example, the storage unit may be disposed between any two metal layers, such as M2 and M3, as shown in FIG. 2b. In such case, a contact 293 and pad 295 may be provided in CA and M1 to facilitate electrical connections to, for example, the cell selector. In some instances, the contact may be a direct contact which extends through CA and M1. Other contact configurations may also be useful. Disposing the storage unit between other metal levels may also be useful. Preferably, the storage unit is disposed between two adjacent metal layers. Disposing the storage unit between non-adjacent metal layers may also be useful. For example, the storage unit may be disposed between M1 and M3, as shown in FIG. 2c. Disposing the storage unit between other non-adjacent metal levels may also be useful. Contacts may be provided in an intermediate ILD level 2901 to facilitate connections between two non-adjacent metal layers (e.g., M1 and M3). The contact may be a direct contact or a contact at the via level (e.g., V1) and a metal pad at the metal level (e.g., M2), as shown. Other contact configurations may also be useful.

The storage unit is disposed within a cell dielectric layer 260 located between the lower metal level and upper contact level. The cell dielectric layer may be formed of silicon oxide. Other types of dielectric materials may also be useful for the cell dielectric layer. The cell dielectric layer may be formed of different dielectric layers. The different dielectric layers may be formed of the same material. Providing the dielectric layers with different materials may also be useful. For example, low k dielectric materials may be used. In some cases, bad thermal conducting dielectric materials may be used, for example, to reduce thermal cross-talk. Other configurations of the dielectric layers may also be useful. The cell dielectric layer, for example, may be considered part of the upper ILD layer.

In one embodiment, a dielectric liner 261 is disposed between the cell dielectric and lower ILD layer. The dielectric liner, for example, serves as an etch stop layer. In one embodiment, the dielectric liner is formed of a low k dielectric. For example, the dielectric liner may be nBLOK. Other types of dielectric materials for the dielectric liner may also be useful.

First and second bitline (BL) connection units $220_1$ and $220_2$ are disposed along the first direction or wordline direction. A cell connector 225 is disposed between the BL connection units. The BL connection units are employed to connect BL1 and BL2 to a cell stack 250. In one embodiment, a BL connection unit includes a bulk connector 222 and a connector liner 230. The connector liner lines at least a side of the bulk connector adjacent to the cell connector. As shown, the connector liner lines the bottom and the side of the bulk connector adjacent to the cell connector. The bulk connector facilitates connection to the BL. The bulk connector and connector liner are formed of electrical connection materials (ECMs). The ECM of the bulk connector preferably is a high conductivity material, such as TiN. Other types of high conductivity ECMs may also be useful.

As for the connector liner, it is formed of an ECM. The connector liner provides connection to a cell stack layer 254. In one embodiment, the connector liner may be formed of an ECM with high conductivity and/or low thermal conductivity. The connector liner may be formed of a plurality of ECM layers, forming a connector liner stack. For example, the connector liner may be formed of ECM layers having high conductivity and low thermal conductivity. In other embodiment, the connector liner may include layers related to a resistive element. For example, the connector liner may include layers related to a resistive element and an ECM. Other configurations of the liner may also be useful.

In one embodiment, a BL connection unit may include a neck portion which is narrower than the main portion. For example, the neck portion is narrower than the main portion along the bitline direction. The neck portion of the BL connection unit contacts the cell stack layer. Providing a neck portion advantageously reduce the cross-sectional area of the interface between the BL connection unit and the cell stack layer.

The cell connector, as shown, is disposed between the BL connection units. The cell connector may be formed of an ECM. In one embodiment, the cell connector is similar to the BL connection units. For example, the cell connector includes a bulk connector 222 and a liner 230. Providing cell connectors which are similar to the connection units simplifies processing. The dielectric liner is opened below the bottom of the cell connector. This facilitates connection to the metal level in the lower ILD.

The storage unit includes a cell stack layer 254. The cell stack layer contacts the BL connection units and the cell connector. In one embodiment, the cell stack layer includes first and second cell stack sub-layers $254_{1\text{-}2}$. A cell stack sub-layer contacts adjacent sides of a BL connection unit and the cell connector. For example, the first cell stack sub-layer contacts the adjacent sides of the first BL connection unit and cell connector while the second cell stack sub-layer contacts the adjacent sides of the second BL connection unit and cell connector. Other configurations of the cell stack layer, BL connection units and cell connector may also be useful.

The cell stack sub-layers may include capping or protective layers. For example, one or more capping layers are provided on one or both surfaces cell stack sub-layer. The capping layers may be employed to reduce oxidation or poor interface viscosity between layers. The capping layer, for example, may be silicon nitride or silicon oxynitride. Other types of capping layers, such as Ti/Ta or Co/Pd layers. Other types of capping layers, such may also be useful. The type of capping layer, for example, may depend on the type of cell stack layer.

In one embodiment, a connector liner may include a thin insulator layer lining its side which contacts the cell stack layer. For example, a thin silicon oxide layer may line the sides of the connector liners adjacent to the cell connector. The thin insulator layer may serve as a high voltage breakdown layer for initializing the procedure for the memory cell. Other configurations of connector liners may also be useful.

Lower and upper cell stack dielectric layers 252 and 256 are provided below and above the cell stack layer. As shown, the cell stack sub-layers and cell stack dielectric layers form first and second cell stacks $255_{1\text{-}2}$ between the BL connection units and cell connector. In one embodiment, the cell stacks, BL connection units and cell connector have coplanar top surfaces. Other configurations may also be useful.

A cell selector 170 is provided. The cell selector may be provided on the substrate. In one embodiment, the cell selector is a MOS transistor. Other types of primary selectors, such as BJT or diodes, may also be useful. The MOS transistor includes a gate and first and second S/D regions in the substrate adjacent to the gate. The S/D regions may include lightly doped (LD) regions. The first S/D region 175, for example, serves as a drain while the second S/D region serves as a source. In one embodiment, the source is a common source region for an adjacent transistor of an adjacent row. The gate may include dielectric sidewall spacers.

In one embodiment, the source is coupled to a SL. For example, the source is coupled to the SL via a contact. As for the drain, it is coupled to the cell connector. For example, a contact at the via or contact level and a drain connector at the metal level may be provided to couple the cell connector to the drain. Other configurations of coupling the drain and cell connector may also be useful. In the case of a diode as a cell selector, the drain connector may be a wordline forming of a row of memory cell.

Although the drain connector is shown to be narrower than the cell connector, it is understood that it can be wider. Providing a wider drain connector can reduce resistance. The drain connector should not be electrically coupled to the BL connection units. For example, the dielectric liner and lower cell stack dielectric may facilitate isolating the drain connector from the BL connection units. Other configurations may also be useful.

Isolation regions 280 are provided. In one embodiment, the isolation region is a shallow trench isolation (STI) region. Other types of isolation regions may also be useful. The isolation regions are provided to separate columns of memory cells in the bitline direction and adjacent drain regions of select transistors of memory cells in the wordline direction.

The lower ILD layer is disposed on the substrate covering the cell selector. In one embodiment, contacts are provided to the S/D regions. A SL is disposed in the lower metal level and coupled to the second S/D region by a source contact. As for the first S/D region, a drain contact couples it to a drain connector in the lower metal level. The drain connector is coupled to the cell connector. This enables the cell selector to be coupled to N3 of the storage unit via the cell connector.

The upper ILD layer is disposed over the cell dielectric layer. The upper metal level includes first and second bitlines BL1 and BL2. The first and second BLs are coupled to first and second BL connection units by first and second bitline contacts in the upper contact level. This allows the BL1 to be coupled to N1 and BL2 to be coupled to N2.

FIGS. $2d_{1\text{-}2}$ show various views of another embodiment of a device. FIG. $2d_1$ shows a top view of the device. The top view omits upper dielectric layers, including dielectric layer 256. FIG. $2d_2$ shows a cross-sectional view of the device along a first direction between A and A'. The first direction, as shown, is along a wordline direction. A perpendicular direction to the first direction may be the bitline direction. The device includes a memory cell 200. In one embodiment, the memory cell is similar to the memory cell described in FIGS. 1a and $2a_{1\text{-}2}$. Common elements may not be described or described in detail.

The memory cell includes a cell dielectric layer 260 disposed between upper and lower ILD layers 290U and 290L. A dielectric liner 261, such as a low k dielectric liner, may be provided between the cell dielectric layer and lower ILD layer. Within the cell dielectric layer is a storage unit 210 of the memory cell. The storage unit includes first and second BL connection units $220_{1\text{-}2}$ disposed along the first or wordline direction. A BL connection unit may include a bulk connector 222 and a connector liner 230. As shown, the connector liner lines bottom and side of the bulk connector adjacent to a cell connector 225.

The connector liner lines at least a side of the bulk connector adjacent to the first side of a cell stack 250. As shown, the connector liner lines the bottom and the side of the bulk connector adjacent to the first side of the cell stack. The bulk connector facilitates connection to the BL while the connector liner is connected to a cell stack layer 254 at the cell stack. The bulk connector and liner are formed of ECMs. The ECM of the bulk connector preferably is a high conductivity material, such as TiN. Other types of high conductivity ECMs may also be useful.

As for the connector liner, it is formed of an ECM. The connector liner provides connection to the cell stack layer 254. In one embodiment, the connector liner may be formed of an ECM with high conductivity and/or low thermal conductivity. The connector liner may be formed of a plurality of ECM layers, forming a connector liner stack. For example, the connector liner may be formed of ECM layers having high conductivity and low thermal conductivity. In other embodiment, the connector liner may include layers related to a resistive element. For example, the connector liner may include layers related to a resistive element and an ECM. Other configurations of the connector liner may also be useful.

The cell connector 225 is disposed between the BL connection units. The cell connector, for example, is formed of an ECM with high conductivity. For example, the cell connector is formed of TiN. Other ECMs with high conductivity may also be useful. In one embodiment, the cell connector has a height which is less than a height of the BL connection units. This allows the cell stack layer 254 to be disposed on top of the cell connector and ends connected to the connector liner of the BL connection units. As shown, the cell stack layer has a width which is narrower than the BL connection units and cell connector. The cell connector may include a liner 264. The liner may be on the top and contacts the cell stack layer. The liner, for example, is formed of an ECM with low thermal conductivity. For example, the liner may be TaN. Other types of ECMs may also be useful. The dielectric liner is opened below the bottom of the cell connector. This facilitates connection to the metal level in the lower ILD.

Unlike the memory cell of FIGS. $2a_{1\text{-}2}$, the cell stack layer is a single layer which extends from one BL connection unit to the other, contacting the cell connector in between. Lower cell stack dielectric layers 252 and an upper cell stack dielectric layer 256 are provided below and above the cell stack layer. As shown, the top surfaces of the BL connection units, upper cell stack dielectric layer, and cell dielectric layer are coplanar. Other configurations may also be useful.

The connector liner of the BL connection units may include a thin insulator layer lining the side which contacts the cell stack layer. For example, a thin silicon oxide layer may line the sides of the connector liners adjacent to the cell connector. The thin insulator layer may serve as a high voltage breakdown layer for initializing the procedure for the memory cell. Other configurations of connector liners may also be useful.

The memory cell of FIGS. $2d_{1\text{-}2}$ may be configured similarly as that described in FIGS. 2b-c. For example, the storage unit may be disposed in any two metal levels. This includes non-adjacent metal levels or levels other than the first and second metal levels.

As discussed, one embodiment of the memory cell is a PCRAM cell. In the case of a PCRAM cell, the cell stack layer is a resistive layer. The resistive layer, in one embodiment, is a PCM layer. The PCM layer, for example, may be formed of a chalcogenide material. In one embodiment, the chalcogenide material is a germanium-antimony-tellurium (GeSbTe) alloy. In one embodiment, the chalcogenide material is $Ge_2Sb_2Te_5$ (GST). Other types of chalcogenide or PCMs may also be employed. Providing other types of PCM layers may also be useful. The PCM layer may include one or more capping or protective layers on top and/or bottom surfaces. The protective layers reduce oxidation as well as improve interface viscosity issues. The capping layer or layers may, for example, be silicon nitride, silicon oxynitride. Other types of capping layers may also be useful.

The BL connection units serve as programming units. The bulk connector of a programming unit is used to connect to a BL. The bulk connector may be formed of an ECM with high conductivity. For example, the bulk connector may be formed of TiN. Other types of materials with high conductivity may also be used to form the bulk connector.

As for the liner of a connection unit, it serves as a programmer. A programmer is employed to program the PCM. For example, the programmer is used to SET and RESET the PCM. The programmer also facilitates read accesses. The programmer, for example, is a heater which is used to SET and RESET the PCM.

In one embodiment, the liner is a liner stack, having multiple liner layers. For example, the liner stack may be a 2 or 3 layered stack. Providing the liner stack having other number of layers may also be useful. The liner stack may be formed of ECMs. The liner may be configured to be in direct contact with the PCM or disposed between an ECM with high conductivity. For example, the liner may be a 2 layered stack, such as TiN/TaN, with TaN in direct contact with the PCM or a 3 layered stack, such as TiN/TaN/TiN, with TiN in direct contact with the PCM. Other configurations of the liner may also be useful.

In one embodiment, the ECM layer of the liner with bad thermal conductivity may act as a heat shield. For example, in the case where an ECM layer with high conductivity, it serves as a heater while the ECM layer with bad thermal conductivity serves as a heat shield. For example, the TiN layer which contacts the cell stack layers serves as a heater while the TaN layer serves as a heat shield to improve heating efficiency of the heater. In other cases, the layer with bad thermal conductivity serves as both a heater and a heat shield. For example, a TaN layer of the liner may contact the cell stack layers. Other configurations of the liner may also be useful.

A thin insulator layer may be disposed on the side of the liner adjacent to the first side of the cell stack. The insulator, for example, may be silicon oxide. The thin insulator layer may serve as a high voltage breakdown layer for initializing the memory cell. As for the liner on top of the cell connector, it may be TaN or other ECM materials with bad thermal conductivity. Other types of the liner may also be useful.

In some embodiments, to further increase programming efficiency, the PCM layer may be doped with insulating islands. For example, the PCM layer may be doped with silicon oxide or other insulating materials. The presence of the insulating islands in the PCM layer effectively lowers the contact area between the PCM layer and liner, making current crowding effect more obvious. As a result, lower programming (heating) current is needed for achieving melting and crystallization temperatures. Reduced programming current facilitates the use of smaller transistors, thereby reducing cell size. Alternatively, the PCM layer may be doped with heating islands, such as an ECM with high conductivity. For example, the ECM may be TiN. The heating islands act as heaters within the PCM layer and to reduce the heat loss during the heating of the PCM layer contacting the BL connection units, therefore improving heating efficiency. The insulating or heating islands may be incorporated into the PCM layer by, for example, in situ doping. Other techniques for incorporating the insulating or heating islands, such as by ion implantation, may also be useful. The islands may be about 10-20 mole percent of the PCM layer. Other mole percentages may also be useful.

The contact surface of a resistive element to the heater, as described, can be designed to be small. For example, the contact surface of a resistive element to the heater is defined by the cross-sectional area of the cell stack or PCM layer. Providing a resistive element with small contact surface to the heater reduces the SET and RESET current needed to program the resistive element, reducing power consumption. Additionally, reduced programming currents results in the need of a smaller cell selector, resulting in smaller cell size which facilitates higher density.

In other types of resistive memory cells, the cell stack layer may serve as an electrode layer for one electrode of the resistive elements. For example, in the case of a 2-terminal based RAM cell which uses a resistor's changeable resistance to represent a "0" or a "1", such as a ReRAM or a STT-RAM, the cell stack layer serves as electrode of the resistive elements. As for the liner layer, it includes one or more storage layers used for the storage elements. Additionally, it may also include an electrode layer between the bulk connector and the storage layer or layers, serving as another electrode of a resistive element.

In the case of a ReRAM cell, the cell stack layer serves as an electrode. The cell stack layer, for example, is formed of platinum (Pt) or iridium (Ir). Other types of electrode materials may also be useful. As for the liner, it includes a resistive layer which can form filaments, such as a non-stoichiometric metal oxide. For example, the resistive layer may be $Ta_2O_{5-x}$ or $TaO_x$, where x is not an integer. Other types of resistive materials which can form filaments may also be useful. The liner also includes an electrode layer, such as Pt or Ir, forming the liner stack. The electrode layer of the liner stack contacts the bulk connector while the resistive layer contacts the electrode layers of the cell stack.

A thin insulator layer may be disposed on the side of the liner adjacent to the first side of the cell stack. The insulator, for example, may be silicon oxide. The thin insulator layer may serve as a high voltage breakdown for initializing the memory cell.

In the case of a STT-RAM cell, the cell stack layer, similar to ReRAM, serves as an electrode. The cell stack layer, for example, is formed of PtMn, IrMn, or Co/Pd. Other types of electrode materials may also be useful. As for the liner, it includes a MRM stack. The MRM stack includes first and second MRM layers separated by a tunneling layer. The first MRM layer, for example, is a fixed or pinned layer having a fixed magnetization polarity while the second MRM is a free layer with a switchable magnetization polarity. In one embodiment, the pinned layer is CoFeB, the tunneling layer is MgO and the free layer is a stack which includes CoFeB/Ru/CoFeB. Other configurations of MRM stack may also be useful. The first or second MRM layer may be configured to contact an end of a cell stack layer. An electrode layer may be disposed between the MRM layer and bulk connector.

The contact surface of a resistive element to the electrode or the ReRAM or STT-RAM cell, like the PCRAM cell, can be designed to be small. For example, the contact surface of a resistive element is defined by the cross-sectional area of the cell stack or electrode layer. Providing a resistive element with small contact surface to the electrodes reduces the SET and RESET current needed to program the resistive element, reducing power consumption. Additionally, reduced programming currents results in the need of a smaller primary selector, resulting in smaller cell size which facilitates higher density.

FIG. 2e shows an alternative embodiment of a memory cell 201. As shown, the memory cell includes a primary selector 170 coupled to first and second storage units $210_{1-2}$. The storage units $210_1$ and $210_2$ are stacked one above another. As shown, the first storage unit is disposed between M1 and M2 while the second storage unit is disposed between M2 and M3. A dielectric liner $261_2$, for example, is used to isolate BL1 and BL2 from the BL connection units of the second storage unit. A contact 298 is provided in ILD $290_2$ (e.g., M2 and V1) to interconnect the cell connectors of the first and second storage units. The configuration shown may provide a storage unit between any two adjacent metal levels. Alternatively, as shown in FIG. 2f, the memory cell may be configured to provide a storage unit between every pair of metal lines. For example, a first storage unit $210_1$ may be provided between M1 and M2 and a second storage unit $210_2$ may be provided between M3 and M4. The cell connectors of the storage units are commonly coupled by contacts, for example, in ILD layers $290_{2-3}$. Other configurations of stacking storage units may also be useful. It is understood that the additional storage units may be stacked similarly as shown. Stacking storage units increases bit density or decreases bit per area. In such cases, a cell selector selects x storage units, where x is the number of storage units in the stack. As such, a cell selector is associated with x storage units and $2^X$ bitlines.

Memory cells, as described, can be arranged in rows and columns, forming an array. Rows may correspond to wordlines and columns may correspond to bitlines. Cell selectors of two adjacent rows may be configured to share a common source region while the drain regions are not common, forming a transistor pair. A plurality of transistor pairs is arranged in the row and column directions. The transistor pairs are separated from each other by isolation regions. Gate conductors are disposed on the substrate and traverse the transistor pairs in the row direction. The gate conductors, for example, are polysilicon gate conductors.

In the case where a large number of memory cells are provided in a row, strap cells may be provided. Strap cells, for example, are contacts which connect wordlines in a metal level to the gate. The use of strap cells to stitch connections between the wordlines and gate increases array performance. Strap cells, for example, may be provided at every 16 or 32 cells in the rows. Providing strap cells at other number of cells may also be useful.

In the case where strap cells are employed, it is preferable to avoid SLs and BLs in the same level. For example, WLs are provided in M1, SLs in M2 and BLs in M3, with storage units disposed between M2 and M3. Additional storage units may be stacked in metal levels above M3. Other configurations of WLs, SLs, BLs and storage units may also be useful. In the case of an array without strap cells, such as in the case of a small array, WLs are the gates, SLs are located in M1 and BLs are located in M2, with the storage units between M1 and M2. Additional storage units may be stacked in metal levels above M2. Other configurations of WLs, SLs, BLs and storage units may also be useful.

FIG. 2g shows another embodiment of a device 200. The memory cell is similar to that described, for example, in FIGS. $2d_{1-2}$. Common elements may not be described or described in detail. The memory cell, in one embodiment, is a PCRAM cell. As shown, the cell stack layer 254 is connected to BL connection units by cell stack connectors 226. The cell stack connectors, for example, serve as heaters. In one embodiment, the cell stack connectors serve as heaters for the PCRAM cell. The cell stack connectors, for example, are formed of an ECM. The cell stack connectors, in one embodiment, are formed of an ECM with high conductivity, such as TiN. Other types of ECMs may also be useful. In such cases, the connector liner 230 may be formed of an ECM having bad thermal conductivity. For example, the connector liner may be TaN. Other types of ECMs or a combination of ECMs may also be useful for the connector liner. In one embodiment, thin insulator layer may be disposed on the side of the liner of the BL connection units adjacent to the first side of the cell stack. As such, the insulator layer is in contact with the cell stack connectors. The insulator, for example, may be silicon oxide. The thin insulator layer may serve as a high voltage breakdown layer for initializing the memory cell.

As described, the memory cell is flexible. For example, the memory cell can be configured as a dual-bit memory cell with dual-port function or a single port four-bit memory cell. Multi-bit memory cell with dual-read ports improves performance. Furthermore, providing multi-bit memory cells facilitates forming high density memory arrays without incurring large area. Additionally, the memory cell includes four PCM bits via four terminals, with two terminals sharing a via. This advantageously facilitates providing a compact memory cell. Although the memory cell may require additional reticles, these are non-CD reticles. The use of non-CD reticles increases uniformity, which increases chip capacity as well as reducing cost.

FIGS. 3a-i show cross-sectional views of a process of forming an embodiment of a device 300. The process includes forming a memory cell. The memory cell, in one embodiment, is a resistive-type memory cell. The memory cell is similar to that described in FIGS. 2a-b. Common elements may not be described or described in detail. The cross-sectional views are along the wordline direction. Although the cross-sectional views show one memory cell, it is understood that the device includes a plurality of memory cells of, for example, a memory array.

Figure 3A:
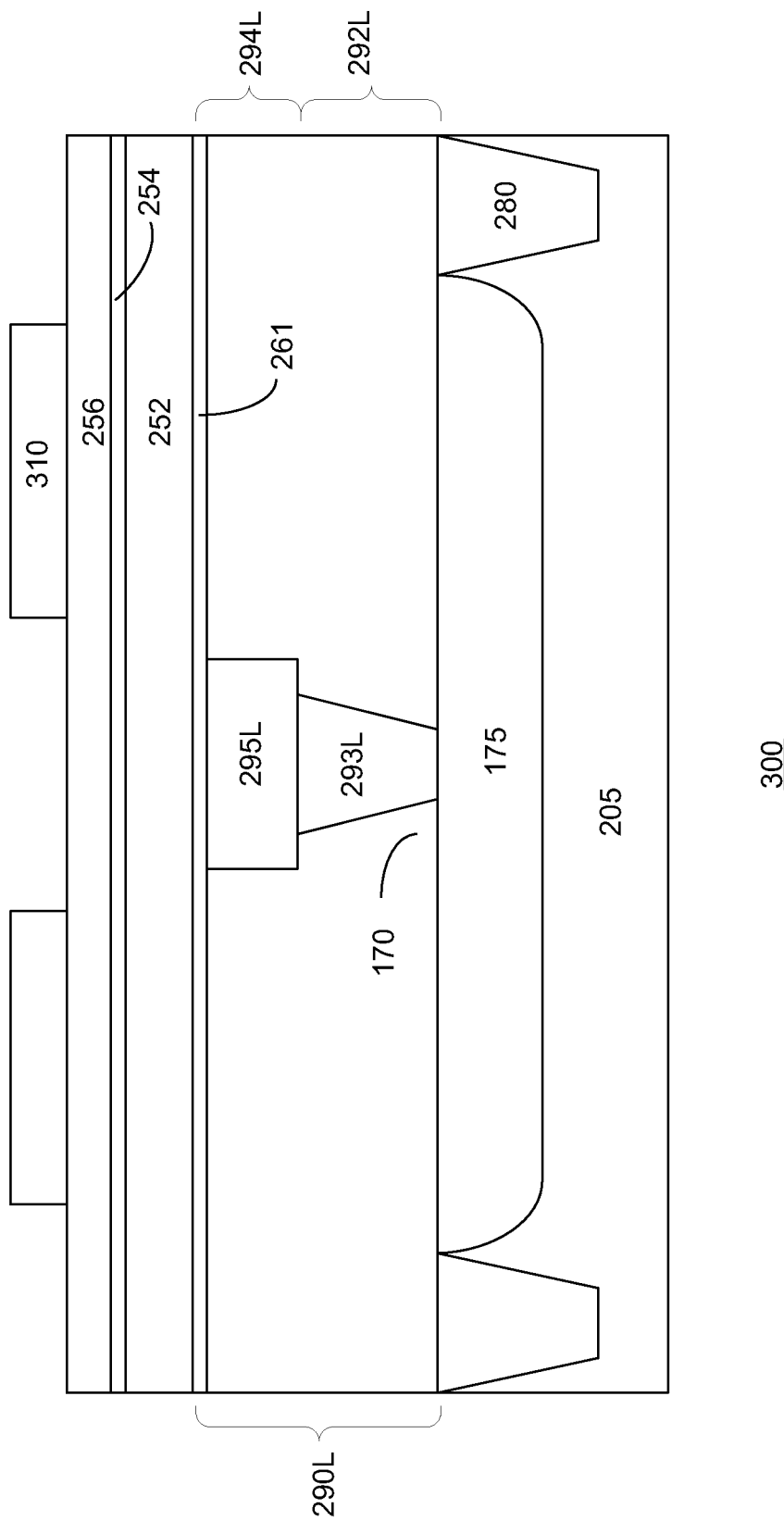

Referring to FIG. 3a, a substrate 205 is provided. The substrate, for example, is a semiconductor substrate, such as a silicon substrate. Other types of semiconductor substrates, including silicon-germanium (SiGe), germanium (Ge), gallium-arsenic (GaAs) or any other suitable semiconductor materials as well as COI, may also be useful. The substrate may include a substrate component level. The substrate component level may include circuit components, such as transistors. Other circuit components may also useful.

In one embodiment, the substrate includes a cell selector 170 for the memory cell. The cell selector may be a transistor. For example, the cell selector is a MOS transistor. The transistor, in one embodiment, includes a gate, a first diffusion region 175 and a second diffusion region. The diffusion regions, for example, are source/drain (S/D) regions. The first diffusion region, for example, is a drain region and the second diffusion region is a source region. The gate is disposed on the substrate between the first and second S/D regions in the substrate. A channel of the transistor is disposed below the gate between the S/D regions. The gate may be a gate conductor which is a common gate for a row of memory cells in the wordline direction.

A lower ILD layer 290L is disposed over the substrate covering the cell selector. The lower ILD layer may include a lower contact level 292L and lower metal level 294L. In one embodiment, the lower contact level is the CA level and the lower metal level is the M1 level. Contacts are provided to the S/D regions in the contact level of the lower ILD layer. A SL is disposed in the lower metal level of the lower ILD layer and coupled to the second S/D region by a source contact. As for the first S/D region, a drain contact 293L in the lower contact level couples it to a drain connector 295L in the lower metal level.

Isolation regions 280 are prepared. In one embodiment, the isolation region is a shallow trench isolation (STI) region prepared in trenches formed in the substrate. Other types of isolation regions may also be useful. The isolation regions are provided to separate columns of memory cells in the bitline direction and adjacent drain regions of select transistors of memory cells in the wordline direction.

In one embodiment, the lower ILD layer is formed of silicon oxide. The lower ILD layer, for example, may be formed by Chemical Vapor Deposition (CVD). Other techniques may also be useful. A planarizing process may be performed. The planarizing process, for example, may include chemical mechanical polishing (CMP). Other types of planarizing process may also be useful.

A dielectric liner 261 may be formed over the lower ILD layer. The dielectric liner, for example, serves as an etch stop layer. In one embodiment, the dielectric liner is formed of a low k dielectric. For example, the dielectric liner may be an nBLOK layer. Other types of dielectric liner materials may also be useful. The dielectric liner, for example, may be formed by blanket deposition using CVD. Other techniques of forming the dielectric liner may also be useful.

In one embodiment, the various layers of a cell stack are formed on the substrate. For example, a lower stack dielectric layer 252, a cell stack layer 254 and an upper stack dielectric layer 256 are formed on the substrate. The layers of the cell stack may be formed over the dielectric liner. The stack dielectric layers, for example, may be formed of silicon oxide. Other types of dielectric materials may also be useful for the stack dielectric layers. It is understood that the upper and lower stack dielectric layers need not be formed of the same material. The stack dielectric layers, for example, may be formed CVD. Other techniques may also be useful.

As for the cell stack layer, it may be formed by physical vapor deposition (PVD). Forming the cell stack layer using other techniques, such as CVD, may also be useful. As discussed, the cell stack layer may include capping or protective layers. For example, one or more capping layers are provided on the top and/or the bottom surface of the cell stack layer. The capping layers may be employed to reduce oxidation or poor interface viscosity between layers. The capping layer, for example, may be silicon nitride or silicon oxynitride. Other types of capping layers may also be useful.

A first mask layer 310 is formed on the substrate. The first mask layer, for example, is formed over the cell stack layers. In one embodiment, the mask layer is a soft mask layer, such as a photoresist layer. An exposure source may selectively expose the photoresist layer through a reticle containing the desired pattern. For example, a first reticle or mask is used. After selectively exposing the photoresist layer, it is developed to form openings corresponding to location where the cell stack layers are to be removed. To improve lithographic resolution, an anti-reflective coating (not shown) may be used below the photoresist layer. In other embodiments, the mask layer may be a hard mask layer. For example, the hard mask layer may be TEOS layer. Patterning the hard mask layer may be achieved using a soft mask layer, such as photoresist.

Figure 3B:
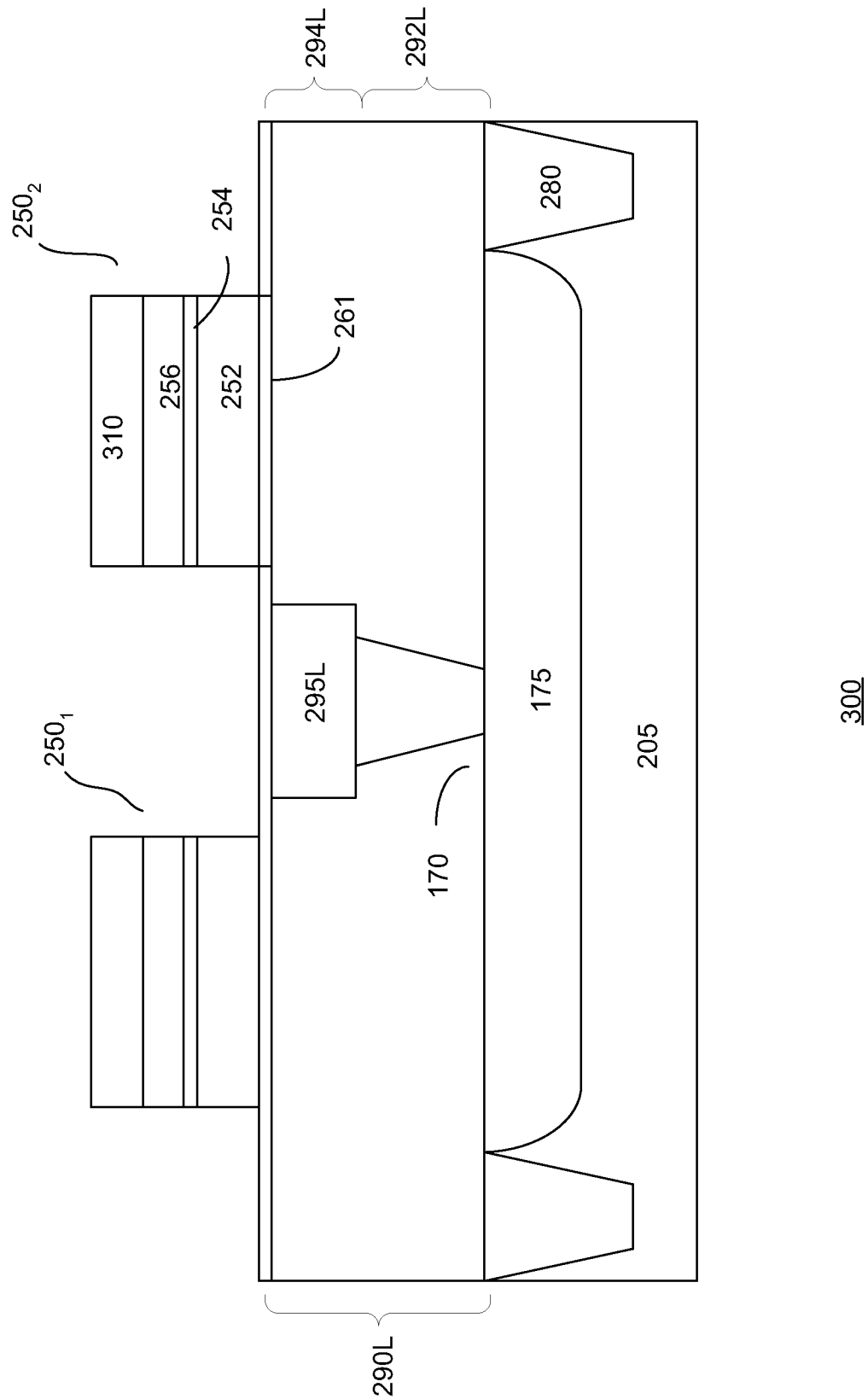

In FIG. 3b, the patterned mask layer is used to pattern the cell stack layers. In one embodiment, an anisotropic etch, such as reactive ion etch (RIE), is used to remove exposed portions of the cell stack layers. Other types of etch processes may also be useful. The etch transfers the pattern of the mask layer to the underlying cell stack layers. Patterning the cell stack layers form first and second cell stacks 255$_{1-2}$.

Figure 3C:
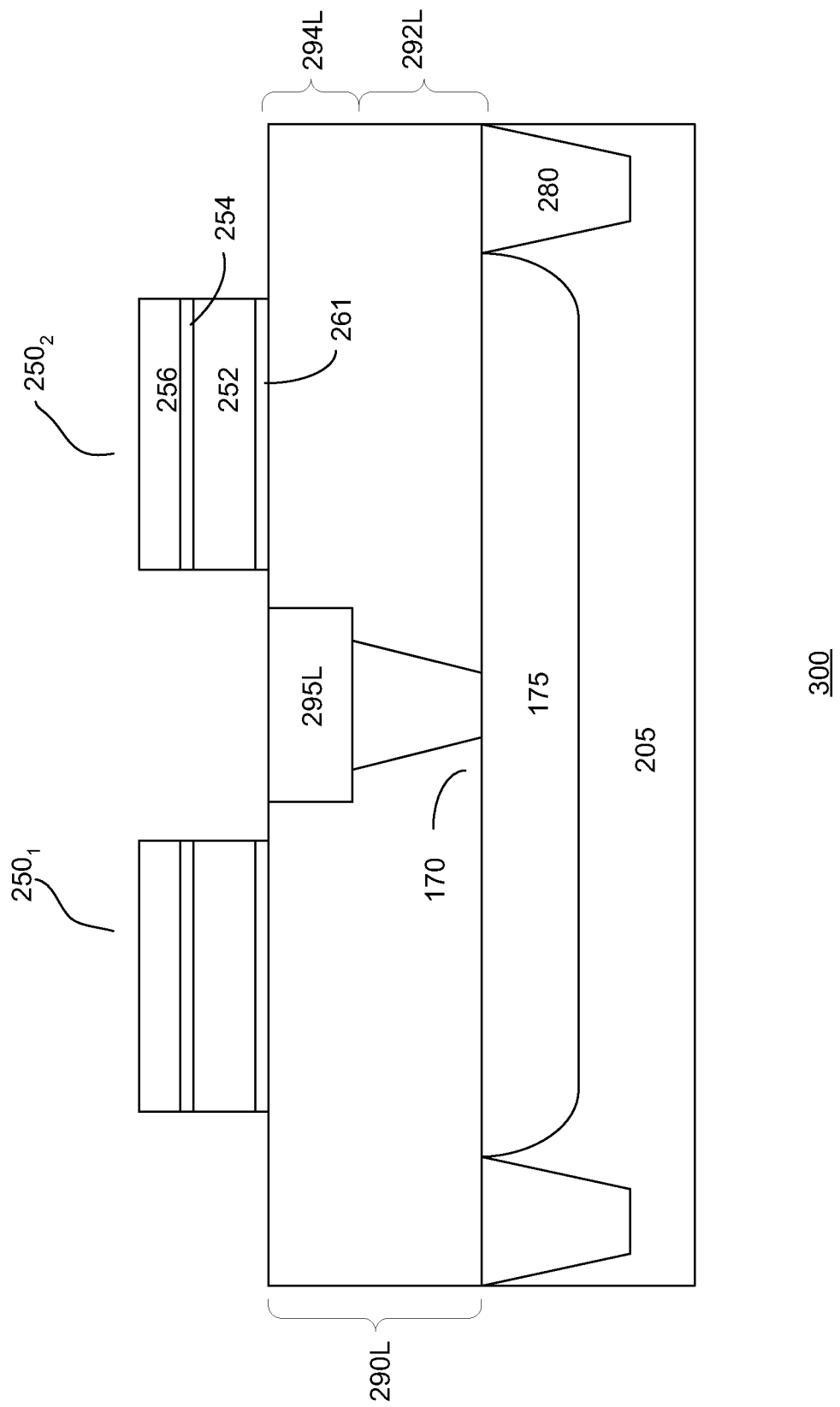

After the patterning of the cell stack layers, the mask layer is removed, as shown in FIG. 3c. In one embodiment, the mask layer is removed by ashing. Other techniques of removing the mask layer may also be useful. For example, in the case of a hard mask, a wet etch may be employed to remove the mask.

The dielectric liner 261 is then patterned. The dielectric liner is patterned by a second mask layer (not shown). The second mask layer includes openings to expose portions of the dielectric liner to be removed. The second mask layer exposes at least portions of the dielectric liner when electrical connections to the lower ILD layer below are desired. Electrical connections include, for example, the cell connector between the cell stack.

In one embodiment, the pattern of the second mask layer may include exposing other portions of the dielectric liner. In one embodiment, the pattern of the second mask layer is the reverse pattern of the pattern of the storage unit. For example, the portion of the dielectric liner which is removed is the same as that of the shape of the storage unit. Providing the second mask layer having a pattern which is the reverse of the shape of the storage unit advantageously enables the reticle to be reused in a subsequent process to define the storage unit.

Figure 3D:
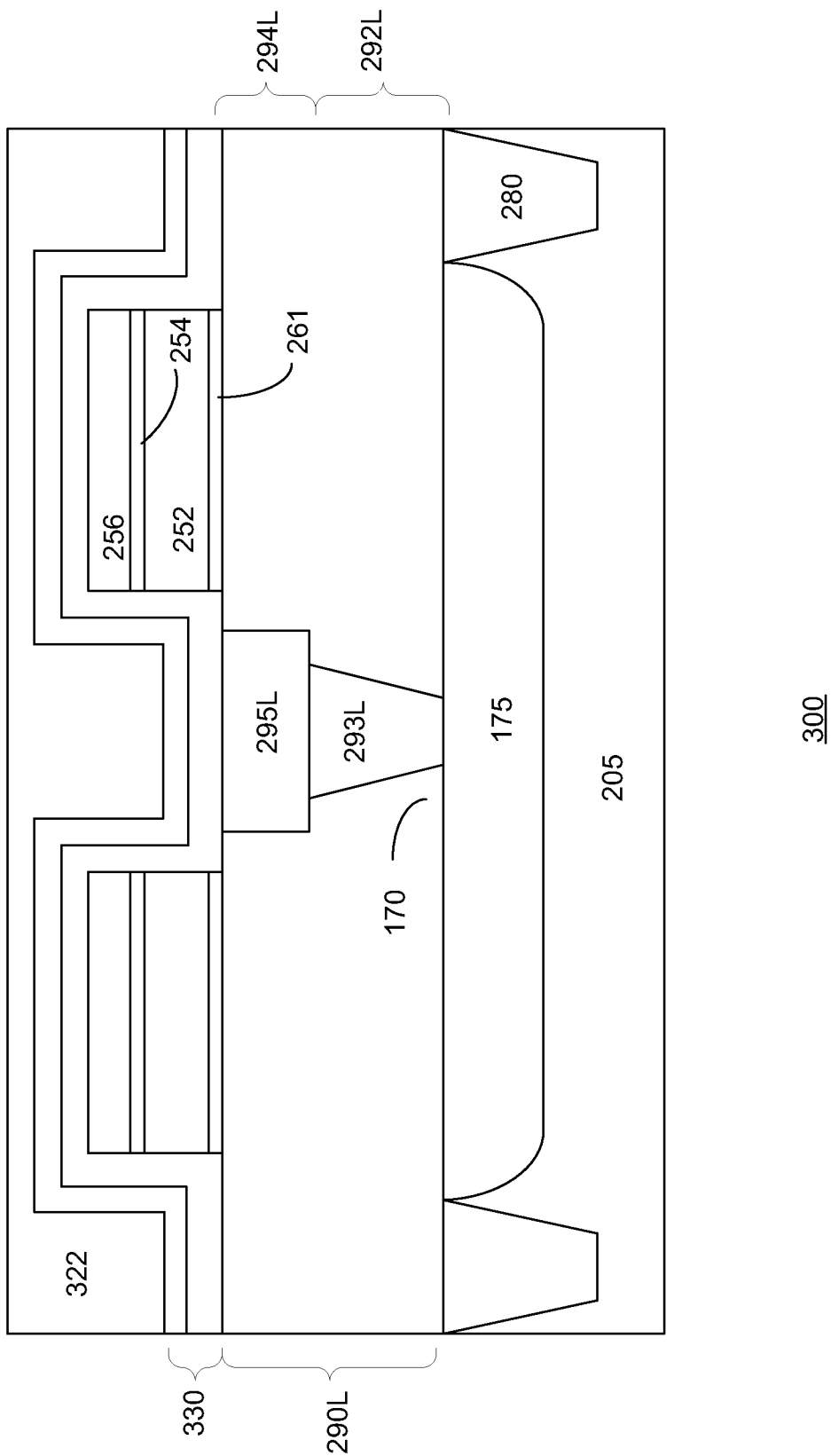
Figure 3E:
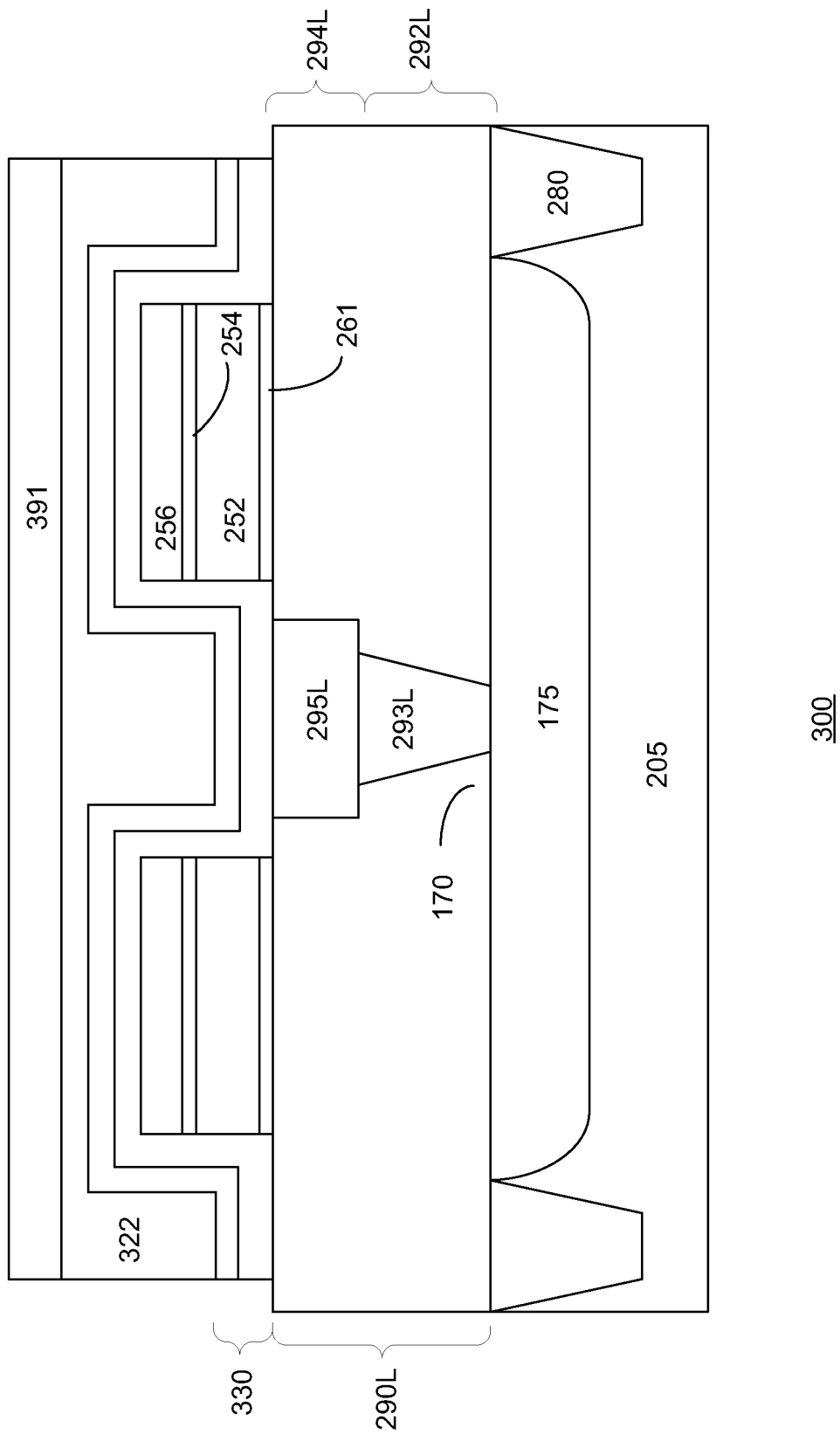
Figure 3F:
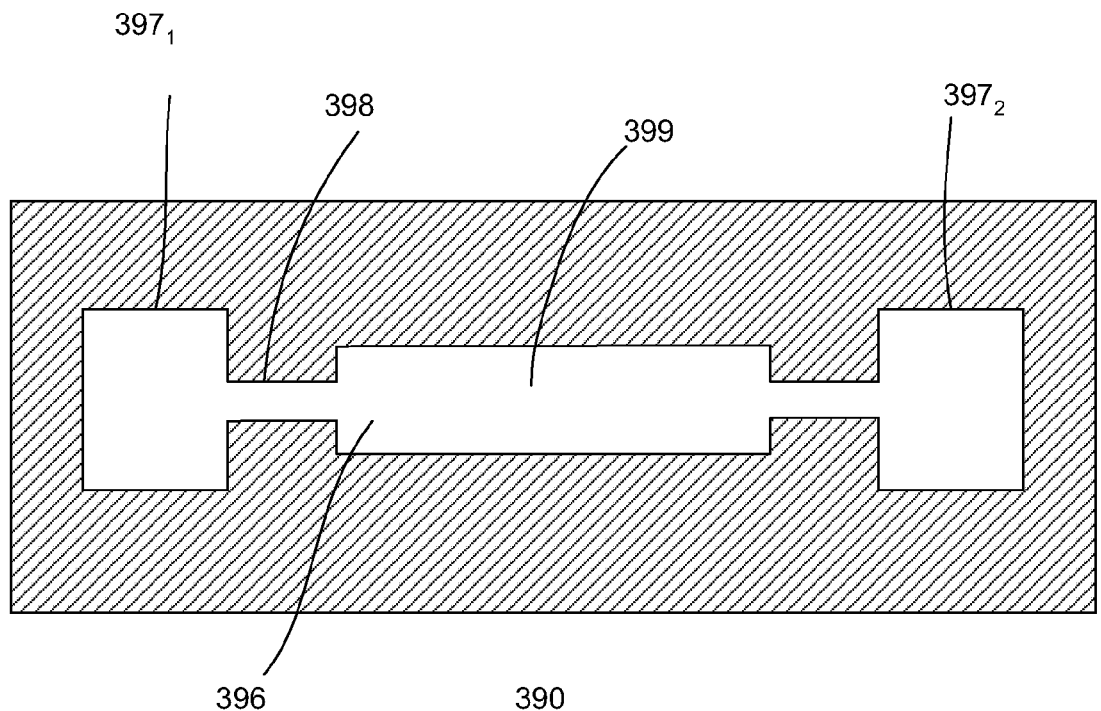
Figure 3F:
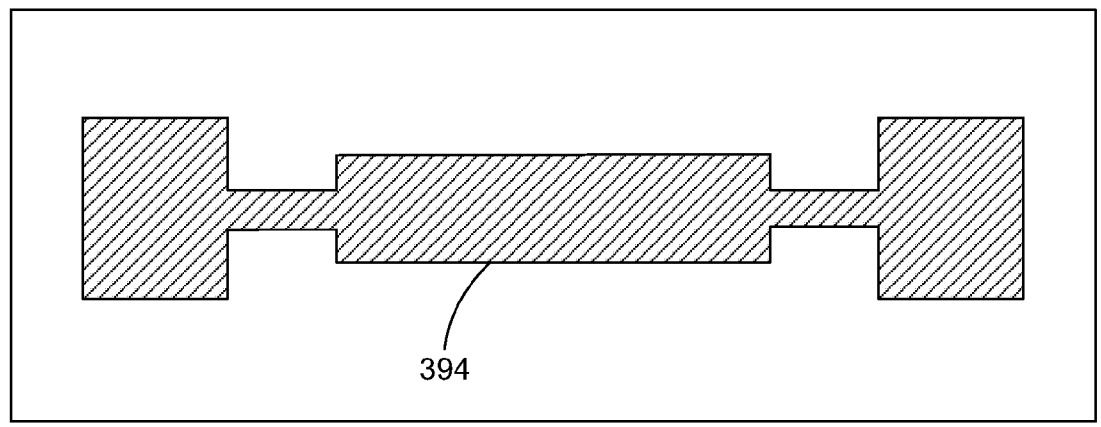

FIG. 3f shows an embodiment of a pattern 390 of the second mask layer. As shown, the second mask layer includes an opening 396 which is the shape of the storage unit. The shape of the storage unit includes end portions 397$_{1-2}$ corresponding to BL connection units. The end portions include a narrowed neck portion 398 which connects to a body portion 399. The body portion, for example, defines the area for the cell connector. The body portion may also define the cell stack. As for the neck portion, it defines the width of the cross-sectional area of the interface between the cell stack layer and BL connection unit. Providing a narrowed or neck portion connecting to the cell connector reduces the cross-sectional or surface area of the resistive element to the electrode or programmer. Other storage unit shapes may also be useful. The BLs, for example, are connected to the end portions.

After the patterning of the dielectric liner, the second mask layer is removed. In one embodiment, the mask layer is removed by ashing. Other techniques of removing the mask layer may also be useful.

Referring to FIG. 3d, the layers of the BL connection units are deposited on the substrate. The layers of the BL connection unit, in one embodiment also serve to form a cell connector. In one embodiment, a connection liner 330 is formed on the substrate. These layers, along with the cell stacks, form layers of a storage unit. The connection liner lines the cell stacks and lower ILD layer. The connection liner may be a liner stack, having a plurality of liner layers. The liner layer or layers, for example, may be formed by PVD, CVD, other deposition techniques or a combination of deposition techniques.

A bulk connector layer 322 is formed over the substrate, filling the spaces between the recesses surrounding the cell stack and covering the connection liner. The bulk connector layer, for example, is an ECM layer. In one embodiment, the bulk connector layer is an ECM with high conductivity. For example, the ECM layer may be TiN. Other types of ECMs with high conductivity may also be useful. The ECM layer, for example, is formed by CVD. Other techniques of forming the ECM layer may also be useful.

The substrate may be planarized to form a planar top surface. For example, the bulk connector layer is planarized by, for example, CMP to form a planar top surface. Other types of planarizing process may also be useful.

In some embodiments, a thin insulator layer may be formed prior to forming the connection liner layer. The thin insulator layer, for example, is silicon oxide. Other types of insulating or dielectric materials may also be useful. The insulator may be formed by, for example, CVD. Other techniques for forming the insulator layer may also be useful. The thin insulator layer, for example, may be employed to initialize resistive elements of the memory cell. For example, the insulator layer may be employed to initialize the resistive element using high breakdown voltage. The insulator layer may be less than about 10 nm thick. For example, the insulator layer may be about 1-5 nm thick. Other thicknesses may also be useful.

In FIG. 3e, a third mask layer 391 is formed on the substrate. The mask layer, as shown, is formed over the bulk connector layer. In one embodiment, the mask layer is a soft mask layer, such as a photoresist layer. An exposure source may selectively expose the photoresist layer through a reticle containing the desired pattern. For example, a reticle is used to form the third mask layer. After selectively exposing the photoresist layer, it is developed to form openings corresponding to location where the bulk connector and connector liner layers are to be removed. To improve lithographic resolution, an anti-reflective coating (not shown) may be used below the photoresist layer. In one embodiment, the patterned mask layer may be a patterned hard mask layer.

The patterned mask layer is used to pattern the layers of the storage unit. For example, the patterned mask layer is used to pattern the bulk connector and connector liner layers. The patterned mask layer defines the area of the storage unit. In one embodiment, an anisotropic etch, such as RIE, is used to remove exposed portions of the storage unit layers to define the area of the storage unit. Other types of etch processes may also be useful. The etch transfers the pattern of the mask layer to the underlying bulk connector and connector liner layers. After the patterning the layers, the mask layer is removed. In one embodiment, the mask layer is removed by ashing. Other techniques of removing the mask layer may also be useful. Etching of the layers creates recesses or gaps above the top surface of lower ILD layer.

In one embodiment, the BL connection units may include a neck portion which is narrower than the main portion. The neck portion of the BL connection units contacts the cell stack layer. Providing a neck portion advantageously reduce the cross-sectional area of the interface between the BL connection unit and cell stack layer.

FIG. 3f shows a top view of an embodiment of a pattern 391 of the third mask layer. As shown, the third mask pattern is the reverse of the second mask pattern 390. For example, the mask includes an opening 396 surrounding the resist material 394 corresponding to the storage unit. This can be achieved using the same reticle, except one uses a positive photoresist while the other uses a negative photoresist. Alternatively, a distinct reticle may be used for patterning the third mask layer. The reticle, for example, is the reverse reticle of the second mask reticle.

Figure 3G:
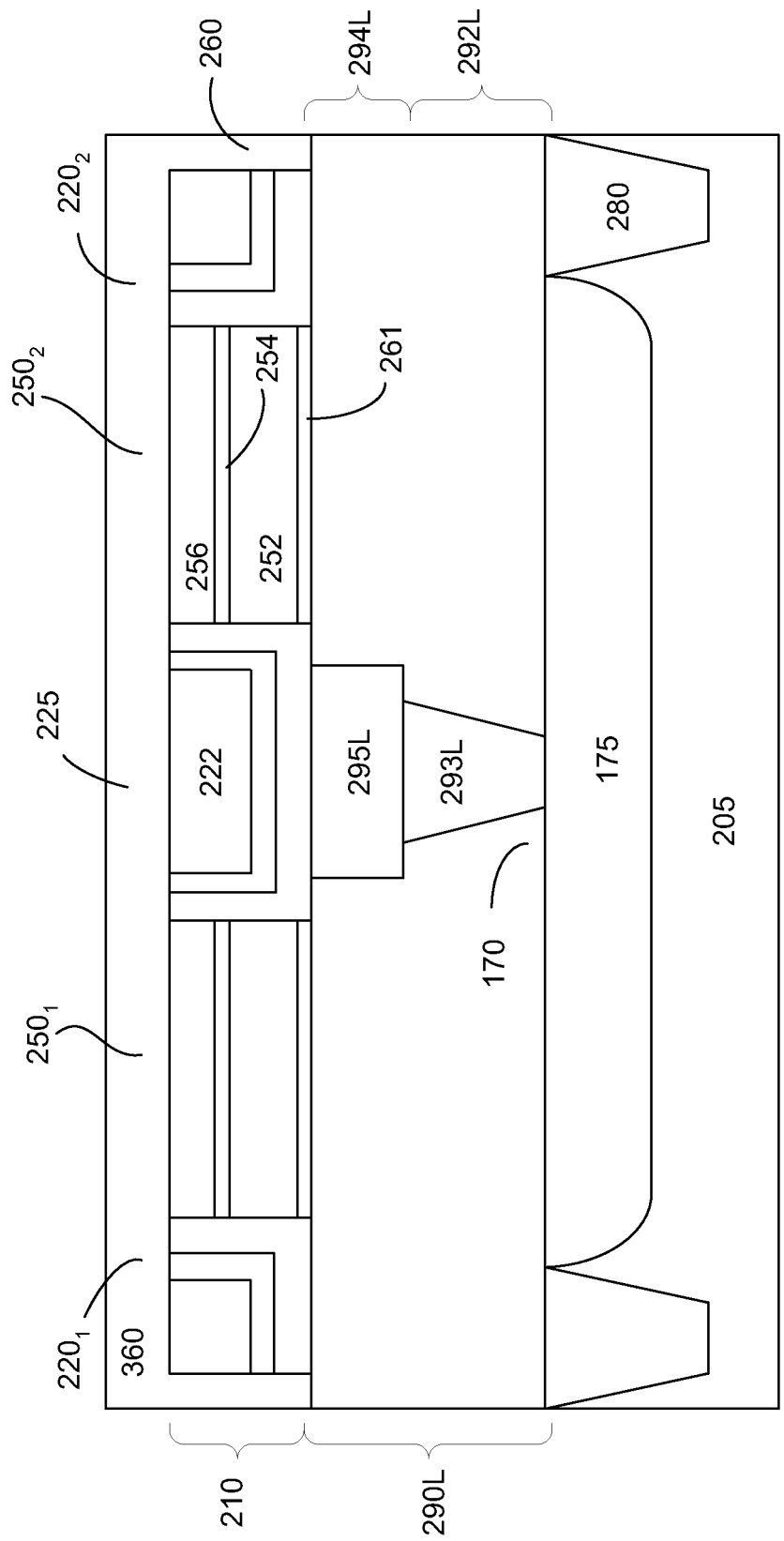

Referring to FIG. 3g, a dielectric layer 360 is formed on the substrate, filling the recesses as well as covering the defined layers of the storage unit. The dielectric layer is used to form the cell dielectric layer. The dielectric layer, for example is silicon oxide. Other types of dielectric materials may also be useful. In one embodiment, the dielectric layer may be the same as the stack dielectric layers. The dielectric layer, for example, may be formed by CVD. Other techniques for forming the dielectric layer may also be useful.

Figure 3H:
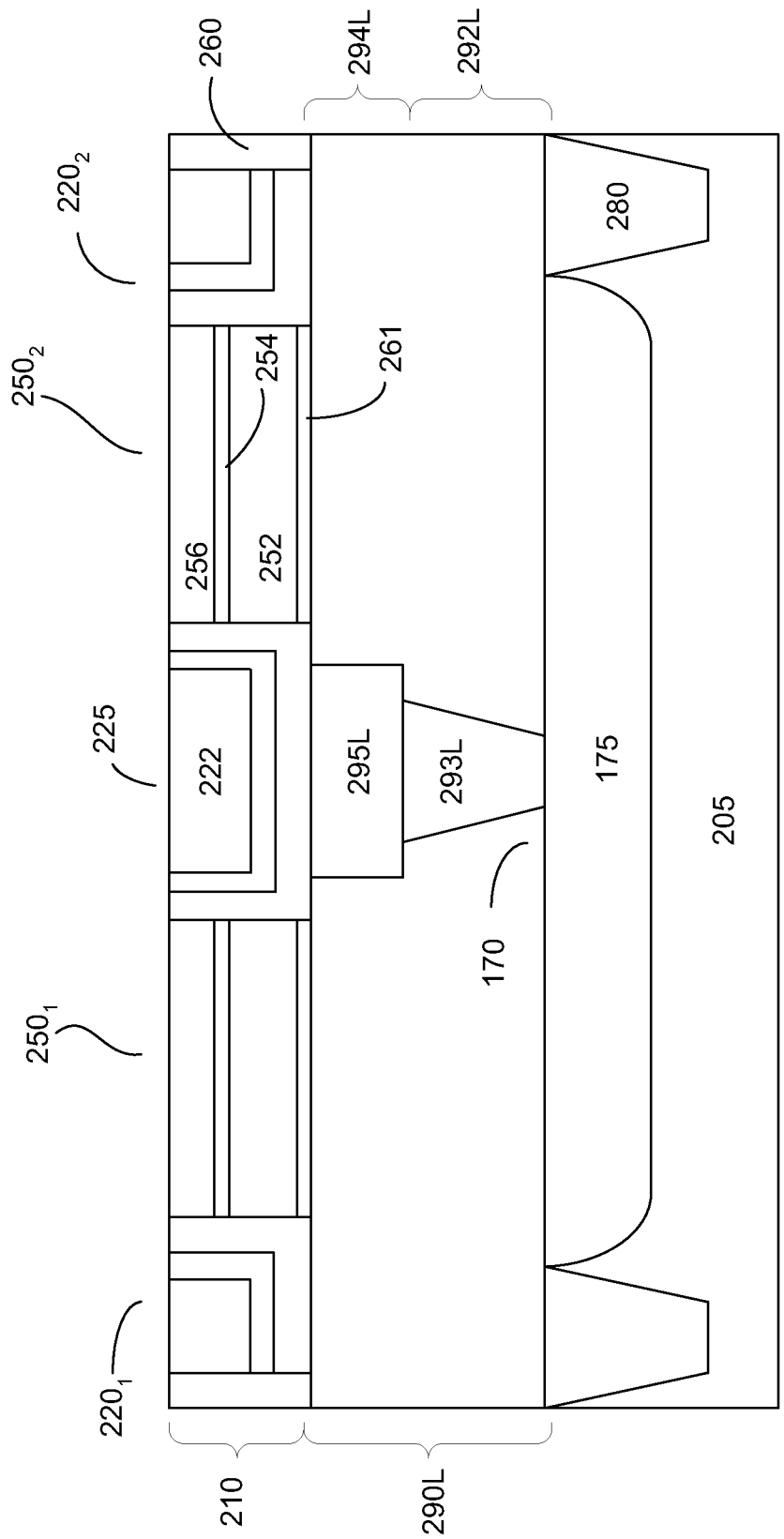

In FIG. 3h, excess dielectric material may be removed by a planarizing process. The planarizing process, for example, may be CMP. Other types of planarizing process may also be useful. Additionally, excess bulk connector and connector liner materials over the cell stacks are removed. The planarizing forms a planar surface over the substrate. For example, the top surfaces of the dielectric layer, cell stacks, bulk connector and connector liner layers are co-planar. As such, the planarization process forms a storage unit 210 with a cell connector 225, first and second BL connection units $220_{1-2}$ and first and second cell stacks $255_{1-2}$. The storage unit is disposed in the cell dielectric layer 260.

Figure 3I:
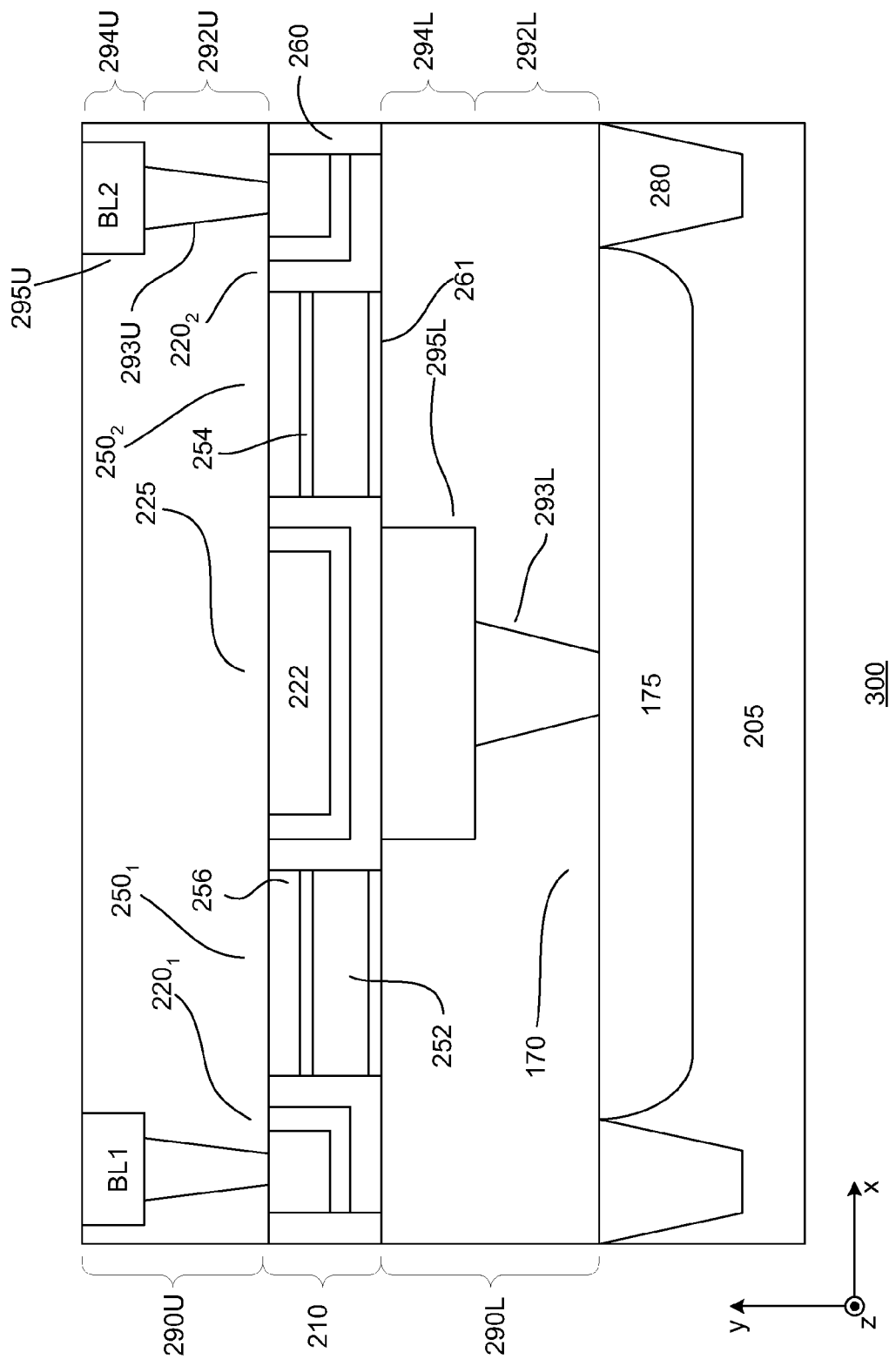

Referring to FIG. 3i, an upper ILD layer 290U is formed over the cell dielectric layer. The upper ILD layer may be silicon oxide. Other types of dielectric layers may also be useful. Various techniques may be used to form the upper ILD layer. For example, the upper ILD layer may be formed by CVD. First and second bitlines BL1 and BL2 are formed in the metal level of the upper ILD layer. BL1 and BL2 are coupled to first and second BL connection units by first and second bitline contacts in the upper contact level. The bitlines and contacts may be formed of copper or copper alloy. Other types of conductive materials may also be useful. The bitlines and contacts may be formed by dual damascene techniques. Other techniques for forming the bitlines and contacts may also be useful. The process continues to complete forming the device. The process may include, for example, forming additional metal levels, final passivation, dicing, packaging and testing. Other processes may also be included.

In other embodiments, the process may include forming one or more additional storage units stacked above the upper ILD layer. The additional storage units may be formed similarly as described. This forms a memory cell as described in, for example, FIGS. 2e-f.

As discussed, one embodiment of the memory cell is a PCRAM cell. In the case of a PCRAM cell, the cell stack layer is a resistive layer. The resistive layer, in one embodiment, is a PCM layer. The PCM layer, for example, may be formed of a chalcogenide material. In one embodiment, the chalcogenide material is a germanium-antimony-tellurium (GeSbTe) alloy. In one embodiment, the chalcogenide material is $Ge_2Sb_2Te_5$ (GST). Other types of chalcogenide or PCMs may also be employed. The PCM layer may include one or more capping or protective layers on top and/or bottom surfaces. The protective layers reduce oxidation as well as to provide good interface forming. The protective layer, for example, may be silicon nitride or oxynitride. Other types of protective layers may also be useful.

In some embodiments, to further increase programming efficiency, the PCM layer may be doped with insulating islands. For example, the PCM layer may be doped with silicon oxide or other insulating materials. The presence of the insulating islands in the PCM layer effectively lowers the contact area between the PCM layer and liner, making current crowding effect more obvious. As a result, lower programming (heating) current is needed for achieving melting and crystallization temperatures. Reduced programming current facilitates the use of smaller transistors, thereby reducing cell size. Alternatively, the PCM layer may be doped with heating islands, such as an ECM with high conductivity. For example, the ECM may be TiN. The heating islands act as heaters within the PCM layer and to reduce the heat loss during the heating of the PCM layer contacting the BL connection units, therefore improving heating efficiency. The insulating or heating islands may be incorporated into the PCM layer by, for example, in situ doping. Other techniques for incorporating the insulating or heating islands, such as by ion implantation, may also be useful. The islands may be about 10-20 mole percent of the PCM layer. Other mole percentages may also be useful.

As for the liner of a BL connection unit, it serves as a programmer. A programmer is employed to program the PCM layers. For example, the programmer is used to SET and RESET the PCM layers. The programmer also facilitates read accesses. The programmer, for example, is a heater which is used to SET and RESET the PCM layers.

In one embodiment, the liner is a liner stack, having multiple liner layers. For example, the liner stack may be a 2 or 3 layered stack. Providing the liner stack having other number of layers may also be useful. The liner stack may be formed of ECMs. The liner stack may be configured to be in direct contact with the PCM or disposed between an ECM with high conductivity. For example, the liner may be a 2 layered stack, such as TiN/TaN, with TaN in direct contact with the PCM or a 3 layered stack, such as TiN/TaN/TiN, with TiN in direct contact with the PCM. Other configurations of the liner may also be useful.

In other embodiments, the cell stack layer may serve as electrode layers for one electrode of the resistive elements R1 and R2. For example, in the case of a 2-terminal based RAM cell which uses a resistor's changeable resistance to represent a "0" or a "1", such as a ReRAM or a STT-RAM, the cell stack layer serves as an electrode layer for an electrode of the resistive elements. As for the liner layer, it includes one or more layers used for the storage elements. Additionally, it may also include an electrode layer between the bulk connector and the storage layers, serving as another electrode of the resistive elements.

In the case of a ReRAM cell, the cell stack layer serves as electrodes. The cell stack layer, for example, is formed of platinum (Pt) or iridium (Ir). Other types of electrode materials may also be useful. As for the liner, it includes a resistive layer which can form filaments, such as a non-stoichiometric metal oxide. For example, the resistive material may be $Ta_2O_{5-x}$ or $TaO_x$, where x is not an integer. Other types of resistive materials which can form filaments may also be useful. The liner also includes an electrode layer, such as Pt or Ir, forming the liner stack. The electrode layer of the liner stack contacts the bulk connector while the resistive layer contacts the electrode layers of the cell stack.

In the case of a STT-RAM cell, the cell stack layer, similar to ReRAM, serves as an electrode. For example, the cell stack layer is formed of PtMn, IrMn or Co/Pd. Other types of electrode layers may also be useful. As for the liner, it includes a MRM stack. The MRM stack includes first and second MRM layers separated by an insulating or tunneling layer layer. The first MRM layer, for example, is a fixed or pinned layer having a fixed magnetization polarity or direction while the second MRM layer is a free layer with a switchable magnetization polarity. In one embodiment, the pinned layer is CoFeB, the insulating layer is MgO and the free layer is a stack which includes CoFeB/Ru/CoFeB. Other configurations of MRM stack may also be useful. The first or second MRM layer may be configured to contact the ends of the cell stack layer. An electrode layer may be disposed between the MRM layer and bulk connector.

FIGS. 4a-j show cross-sectional views of a process of forming an embodiment of a device 400. The process includes forming a memory cell. The memory cell, in one embodiment, is a resistive-type memory cell, similar to that described in FIGS. $2d_{1-2}$. The process is similar to that described in FIGS. 3a-i. Common elements may not be described or described in detail. The cross-sectional views are along the wordline direction. Although the cross-sectional views show one memory cell, it is understood that the device includes a plurality of memory cells of, for example, a memory array.

Figure 4A:
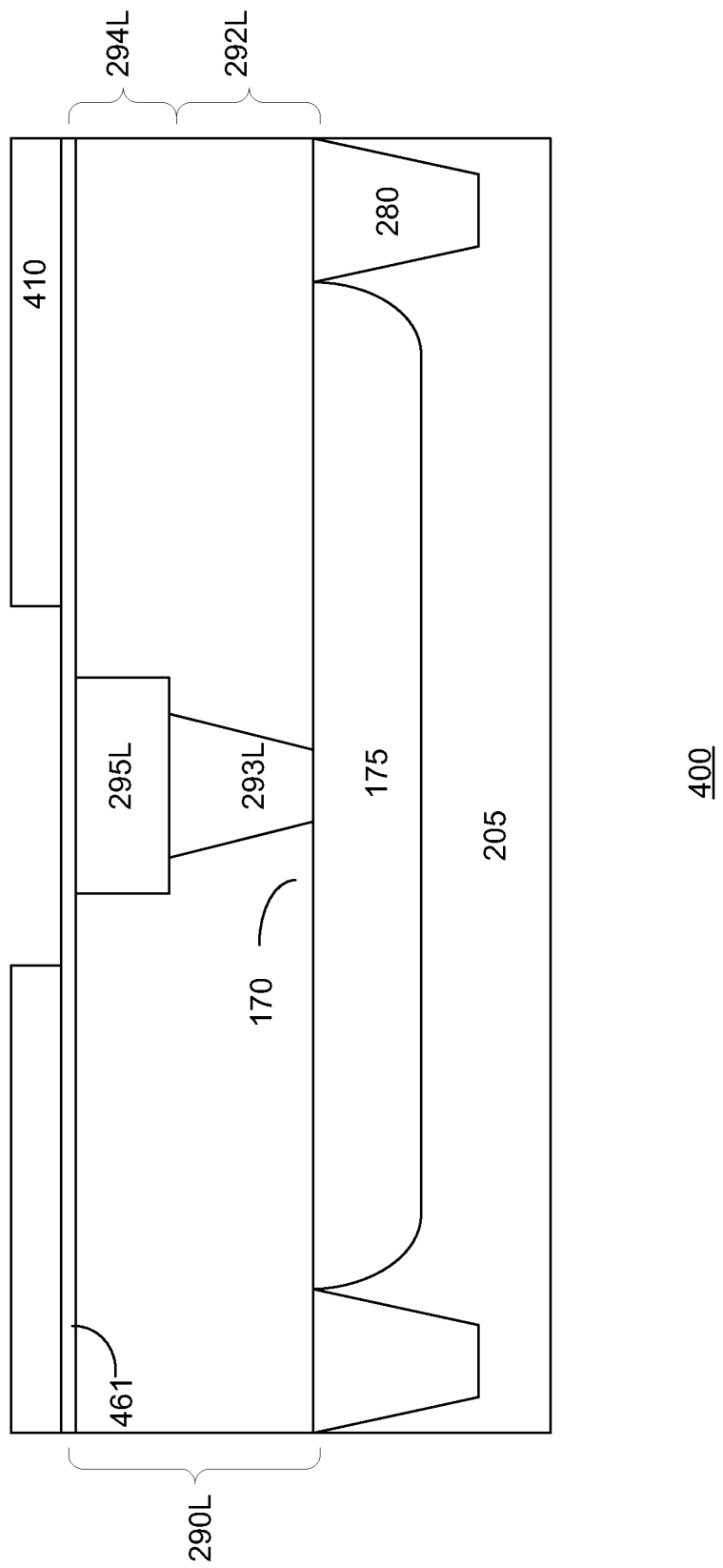

Referring to FIG. 4a, a substrate 205 is provided. The substrate, for example, is a semiconductor substrate, such as a silicon substrate. Other types of semiconductor substrates may also be useful. The substrate may include a cell selector 170 for the memory cell. The cell selector may be a transistor. For example, the cell selector is a MOS transistor. The transistor, in one embodiment, includes a gate, a first diffusion region 175 and a second diffusion region. The diffusion regions, for example, are source/drain S/D regions. The first diffusion region, for example, is a drain region and the second diffusion region is a source region. The gate is disposed on the substrate between the first and second S/D regions in the substrate. A channel of the transistor is disposed below the gate between the S/D regions. The gate may be a gate conductor which is a common gate for a row of memory cells in the wordline direction.

A lower ILD layer 290L is disposed over the substrate covering the cell selector. The lower ILD layer may include a lower contact level 292L and lower metal level 294L. In one embodiment, the lower contact level is the CA level and the lower metal level is the M1 level. Other metal levels may also be useful. Contacts are provided to the S/D regions in the contact level of the lower ILD layer. A SL is disposed in the lower metal level of the lower ILD layer and coupled to the second S/D region by a source contact. As for the first S/D region, a drain contact 293L in the lower contact level couples it to a drain connector 295L in the lower metal level.

Isolation regions 280 are prepared. In one embodiment, the isolation region is a shallow trench isolation (STI) region prepared in trenches formed in the substrate. Other types of isolation regions may also be useful. The isolation regions are provided to separate columns of memory cells in the bitline direction and adjacent drain regions of select transistors of memory cells in the wordline direction.

In one embodiment, the lower ILD layer is formed of silicon oxide. The cell dielectric layer, for example, may be formed by Chemical Vapor Deposition (CVD). Other techniques may also be useful.

A dielectric liner 261 may be formed over the lower ILD layer. The dielectric liner, for example, serves as an etch stop layer. In one embodiment, the dielectric liner is formed of a low k dielectric. For example, the dielectric liner may be an nBLOK layer. Other types of dielectric liner materials may also be useful. The dielectric liner, for example, may be formed by blanket deposition using CVD. Other techniques of forming the dielectric liner may also be useful.

A first mask layer 410 is provided over the substrate. The mask layer, for, is formed over the dielectric liner. In one embodiment, the mask layer is a soft mask layer, such as a photoresist layer. Other types of mask layers may also be useful. An exposure source may selectively expose the photoresist layer through a reticle containing the desired pattern. For example, a first reticle or mask is used. To improve lithographic resolution, an anti-reflective coating (not shown) may be used below the photoresist layer. After selectively exposing the photoresist layer, it is developed to form an opening corresponding to the location where the dielectric liner is to be removed. The mask opening layer includes openings exposes at least a portion of the liner layer where electrical connections to the lower ILD layer below are desired. Electrical connections include, for example, the cell connector between the cell stack.

In one embodiment, the pattern of the first mask may include exposing other portions of the dielectric liner. In one embodiment, the pattern of the first mask is the reverse pattern of the pattern of the storage unit. For example, the portion of the dielectric liner which is exposed and removed is the same as that of the shape of the storage unit. Providing the first mask pattern which is the reverse of the shape of the storage unit advantageously enables the reticle to be reused in a subsequent process to define the storage unit.

Figure 4B:
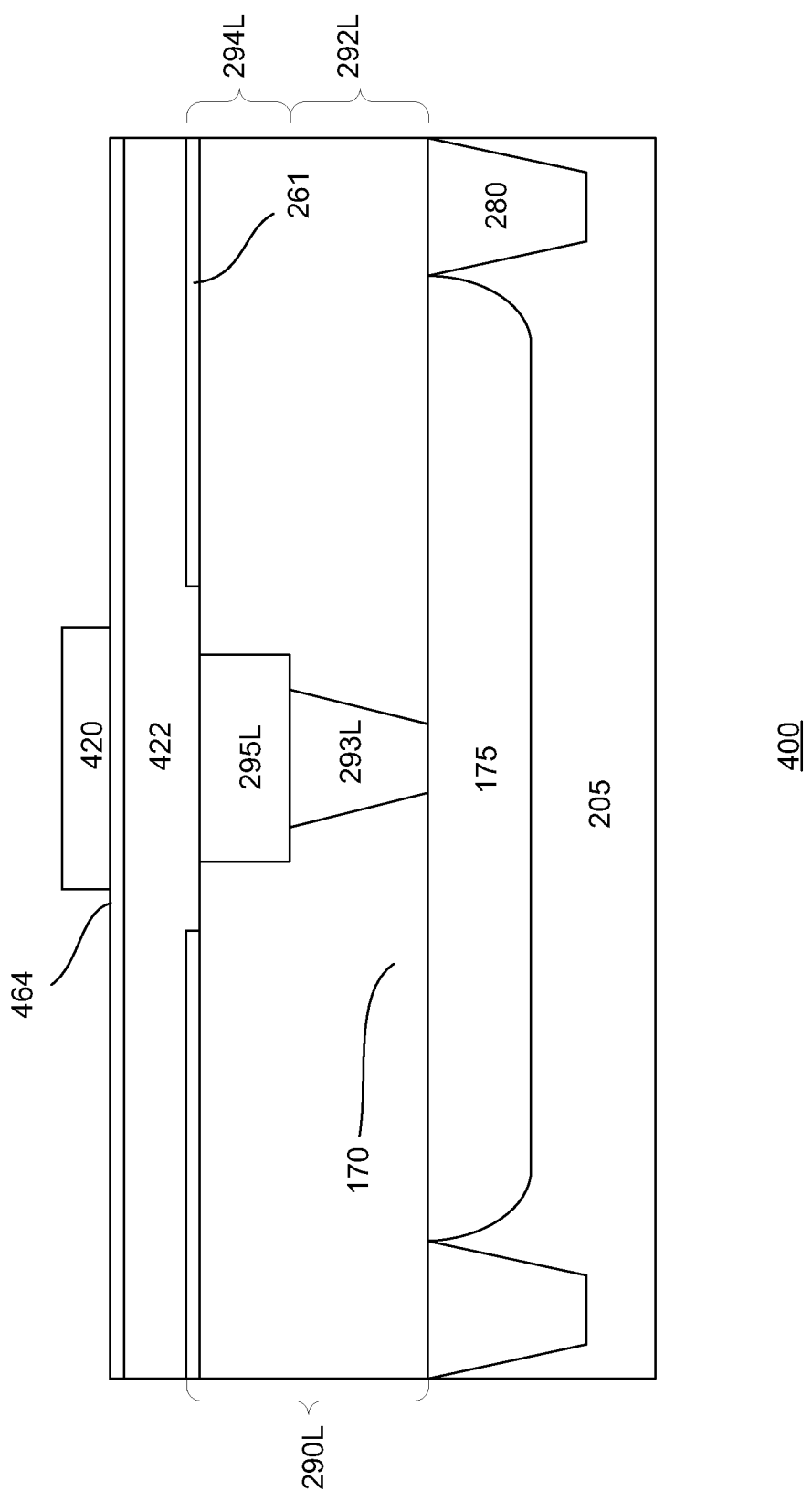

As shown in FIG. 4b, the dielectric liner is patterned using the first mask layer. For example, an anisotropic etch, such as RIE, is performed to remove exposed portion of the dielectric liner. Other techniques for patterning the dielectric liner are also useful. The etch removes portion of the dielectric liner unprotected by the first mask layer.

The process continues to form the cell connector. For example, layers of the cell connector are deposited on the substrate. In one embodiment, a bulk connector layer 422 and a liner 462 are formed on the substrate. The bulk connector layer, for example, is an ECM layer. In one embodiment, the bulk connector layer is an ECM with high conductivity. For example, the ECM layer may be TiN. Other types of ECMs with high conductivity may also be useful. The liner may be an ECM layer. The liner, for example, may be an ECM with low thermal conductivity. For example, the liner may be TaN. Other types of ECMs may also be useful. The liner layer, for example, may be formed by PVD, CVD or other deposition techniques.

In one embodiment, a planarization process is performed after forming the bulk connector layer. The planarization process, for example, may be CMP. The planarization process forms a planar top surface prior to forming the liner layer.

A second mask layer 420 is formed on the substrate. The second mask layer, for example, is formed over the cell connector layers. In one embodiment, the mask layer is a soft mask layer, such as a photoresist layer. The mask layer is patterned, protecting the cell connector layers where the cell connector is to be formed.

Figure 4C:
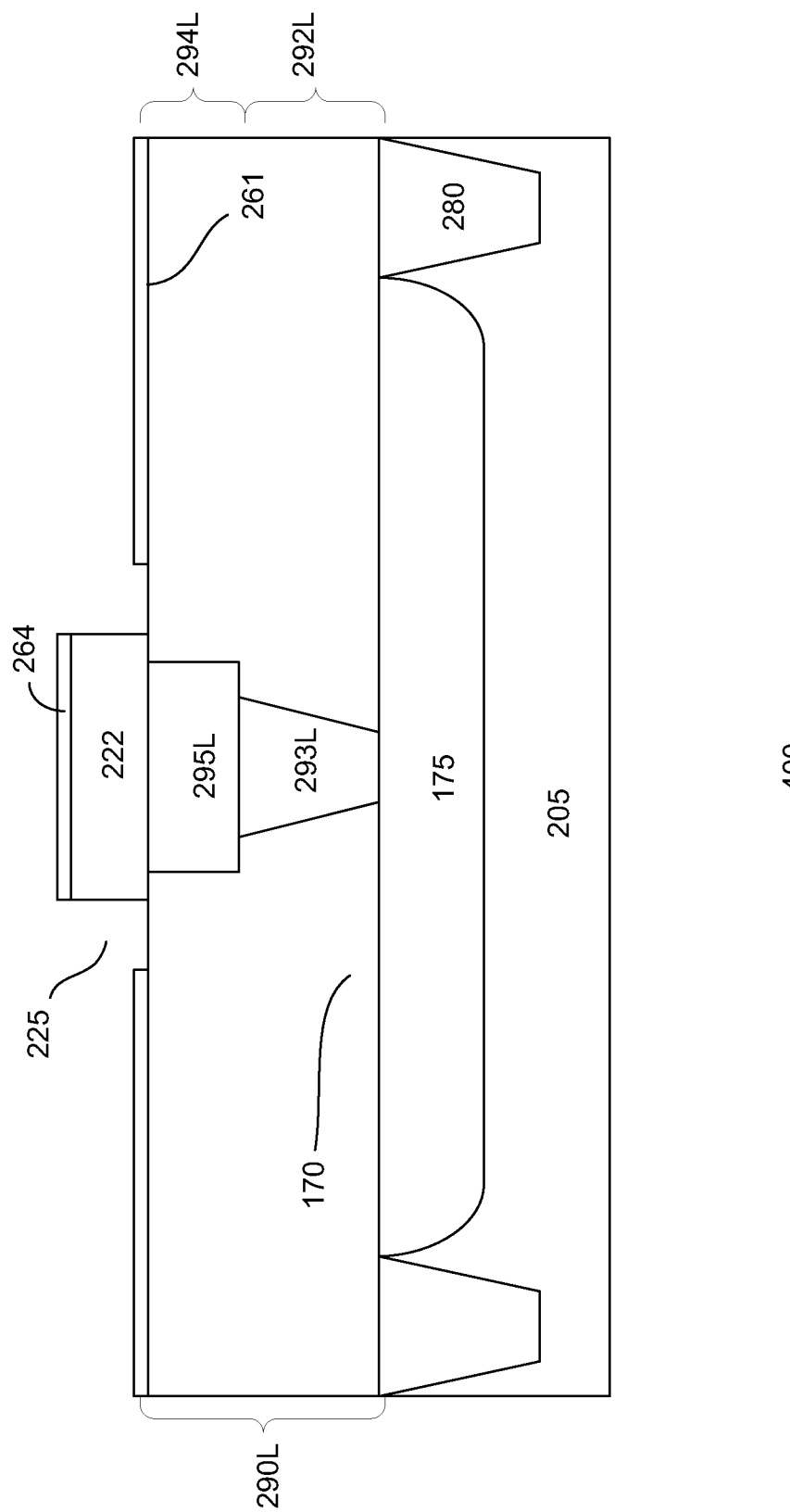

In FIG. 4c, the patterned mask layer is used to pattern the cell connector layers. In one embodiment, an anisotropic etch, such as RIE, is used to remove exposed portions of the cell connector layers. Other types of etch processes may also be useful. The etch transfers the pattern of the mask layer to the underlying cell connector layers. Patterning the cell connector layers forms a cell connector 225.

After the patterning of the cell connector layers, the mask layer is removed. In one embodiment, the mask layer is removed by ashing. Other techniques of removing the mask layer may also be useful.

Figure 4D:
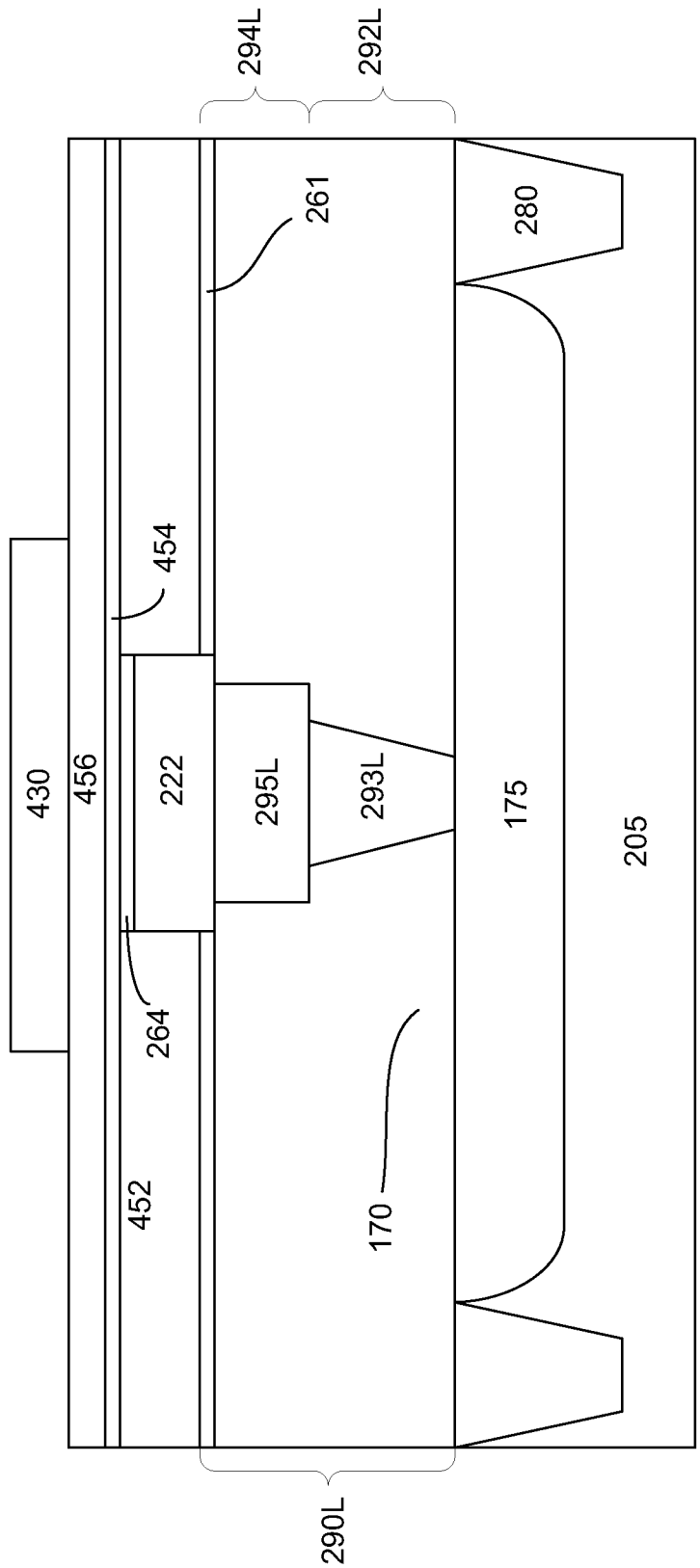

In one embodiment, the various layers of a cell stack are formed on the substrate, as shown in FIG. 4d. For example, a lower stack dielectric layer 452, a cell stack layer 454 and an upper stack dielectric layer 456 are sequentially formed on the substrate. The layers of the cell stack may be formed over the dielectric liner. The cell stack dielectric layers, for example, may be formed of silicon oxide. Other types of dielectric materials may also be useful for the stack dielectric layers. It is understood that the upper and lower cell stack dielectric layer need not be formed of the same material. The stack dielectric layers, for example, may be formed by CVD. Other techniques may also be useful.

As for the cell stack layer, it may be formed by physical vapor deposition (PVD). Forming the cell stack layer using other techniques, such as CVD, may also be useful. As discussed, the cell stack layer may include capping or protective layers. For example, one or more capping layers are provided on the top and/or the bottom surface of the cell stack layer. The capping layers may be employed to reduce oxidation or poor interface viscosity between layers. The capping layer, for example, may be silicon nitride or silicon oxynitride. Other types of capping layers may also be useful.

In one embodiment, the lower stack dielectric layer is formed on the substrate, filling the gaps between and covering the cell connector. The substrate is polished to remove excess dielectric material and to expose the cell connector. For example, the substrate is polished by CMP to expose the liner of the cell connector. The polishing process forms a coplanar top surface between the lower cell stack dielectric layer and cell connector. Other techniques for removing the excess dielectric material may also be useful.

The cell stack layer is formed over the lower stack dielectric layer. The cell stack layer contacts the lower cell stack dielectric layer and cell connector. For example, the cell stack layer contacts the liner of the cell connector. The upper cell stack dielectric layer is formed over the cell stack layer. The top of the cell stack dielectric layer, for example, defines a top of the cell stack. In one embodiment, the thickness of the cell stack layer is about 10-20 nm, or lower.

A third mask layer 430 is formed on the substrate. The third mask layer, for example, is formed over the cell stack layers. In one embodiment, the mask layer is a soft mask layer, such as a photoresist layer. Other types of mask layers may also be useful. An exposure source may selectively expose the photoresist layer through a reticle containing the desired pattern. For example, a first reticle or mask is used. After selectively exposing the photoresist layer, it is developed to form openings corresponding to location where the cell stack layers is to be removed. To improve lithographic resolution, an anti-reflective coating (not shown) may be used below the photoresist layer.

Figure 4E:
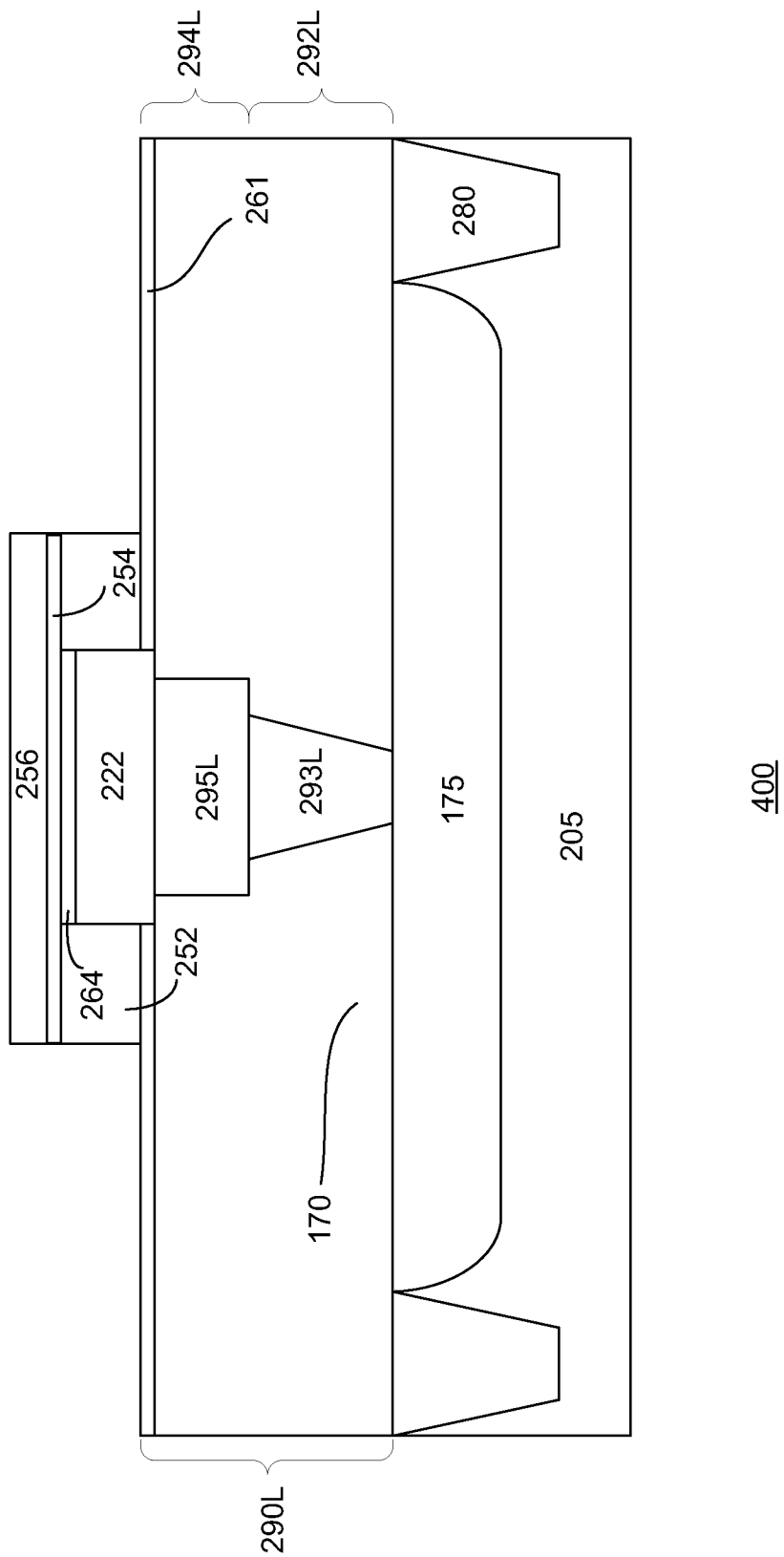

In FIG. 4e, the patterned mask layer is used to pattern the cell stack layers. In one embodiment, an anisotropic etch, such as reactive ion etch (RIE), is used to remove exposed portions of the cell stack layers. Other types of etch processes may also be useful. The etch transfers the pattern of the mask layer to the underlying cell stack layers. Patterning the cell stack layers forms a cell stack 250. As shown, the cell stack includes the cell connector. In one embodiment, the cell stack should have a width in the bitline direction which is wider than its desired width.

After the patterning of the cell stack layers, the mask layer is removed. In one embodiment, the mask layer is removed by ashing. Other techniques of removing the mask layer may also be useful. For example, in the case of a hard mask, a wet etch may be employed to remove the mask.

Figure 4F:
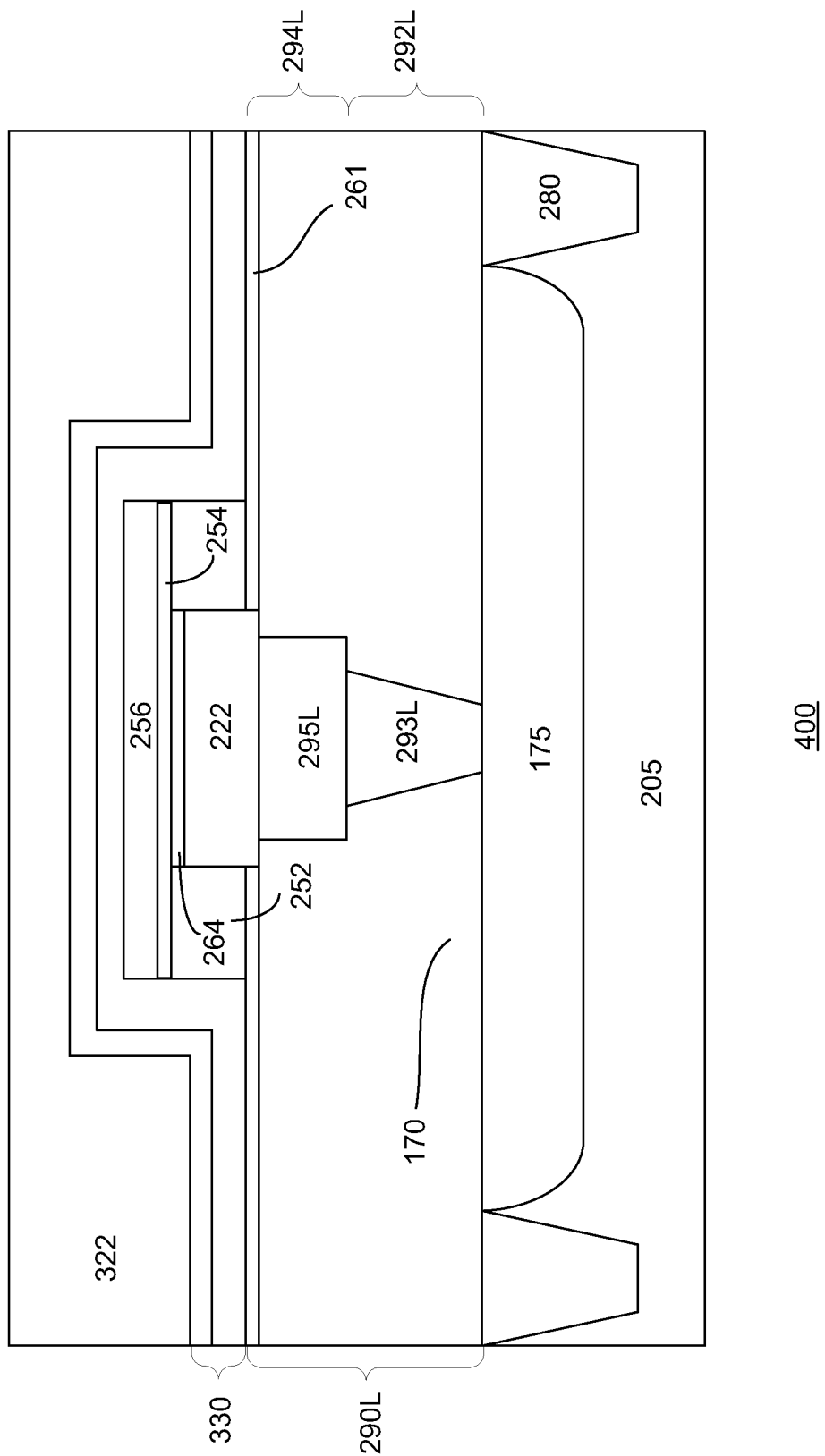

Referring to FIG. 4f, the layers of the BL connection units are deposited on the substrate. In one embodiment, a connection liner 330 is formed on the substrate. These layers, along with the cell stack, form layers of a storage unit. The connection liner lines the cell stack and dielectric liner. The connection liner may be a liner stack, having a plurality of liner layers. The liner layer or layers, for example, may be formed by PVD, CVD, other deposition techniques or a combination of deposition techniques.

A bulk connector layer 322 is formed over the substrate, filling the spaces between the recesses surrounding the cell stack and covering the connection liner. The bulk connector layer, for example, is an ECM layer. In one embodiment, the bulk connector layer is an ECM with high conductivity. For example, the ECM layer may be TiN. Other types of ECMs with high conductivity may also be useful. The ECM layer, for example, is formed by CVD. Other techniques of forming the ECM layer may also be useful. In one embodiment, the ECM layer is polished by a planarizing process. The planarizing process, for example, may be CMP. Other types of planarizing process may also be useful. The planarizing forms a planar surface over the substrate.

In some embodiments, a thin insulator layer may be formed prior to forming the connector liner layer. The thin insulator layer, for example, is silicon oxide. Other types of insulating or dielectric materials may also be useful. The insulator may be formed by, for example, CVD. Other techniques for forming the insulator layer may also be useful. The thin insulator layer, for example, may be employed to initialize resistive elements of the memory cell. For example, the insulator layer may be employed to initialize the resistive element using high breakdown voltage. The insulator layer may be less than about 10 nm thick. For example, the insulator layer may be about 1-5 nm thick. Other thicknesses may also be useful.

Figure 4G:
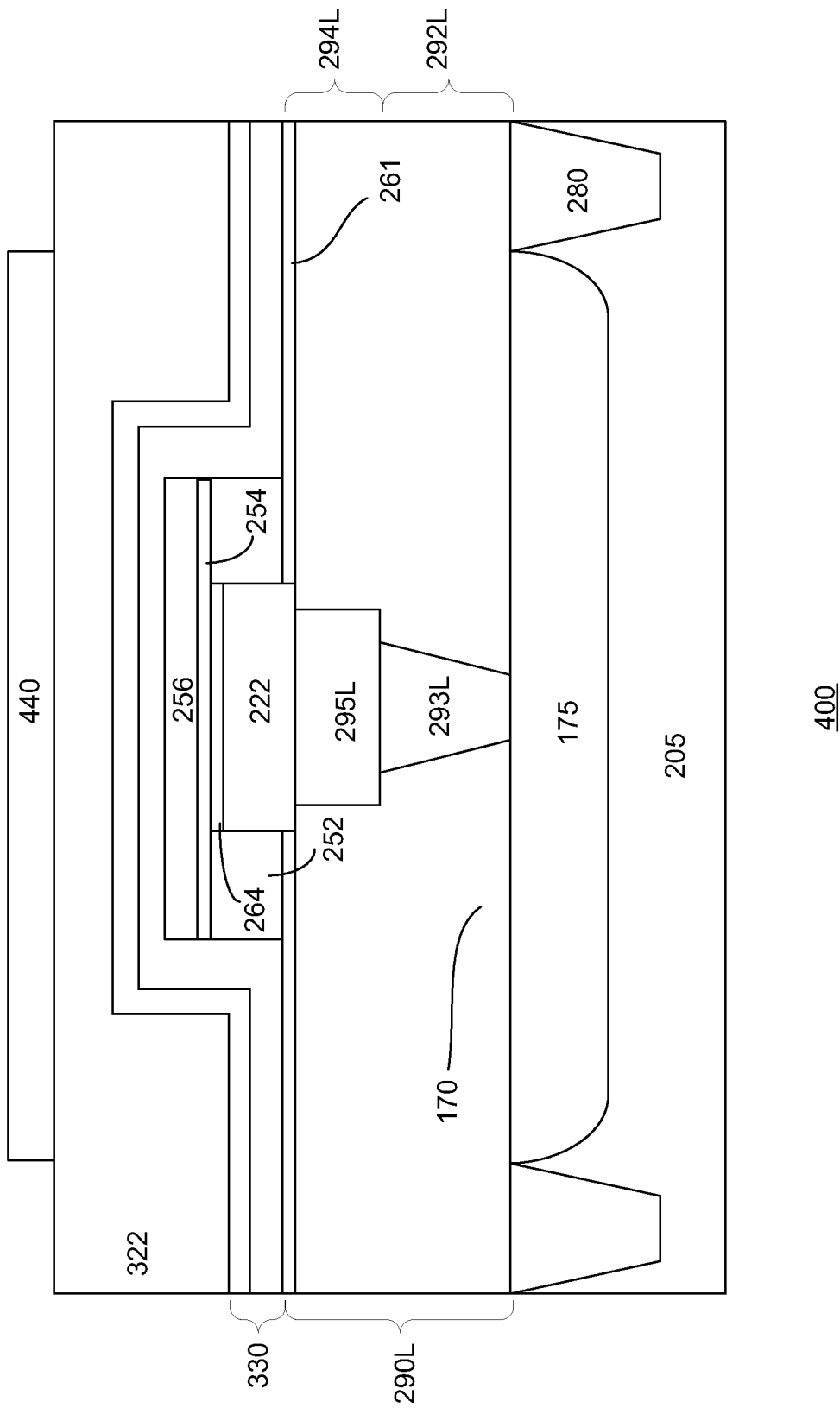

In FIG. 4g, a fourth mask layer 440 is formed on the substrate. The mask layer, as shown, is formed over the bulk connector layer. In one embodiment, the mask layer is a soft mask layer, such as a photoresist layer. An exposure source may selectively expose the photoresist layer through a reticle containing the desired pattern. For example, a reticle is used to form the fourth mask. After selectively exposing the photoresist layer, it is developed to form openings corresponding to location where the bulk connector layers are to be removed. To improve lithographic resolution, an anti-reflective coating (not shown) may be used below the photoresist layer. In one embodiment, the patterned mask layer may be a patterned hard mask layer.

The patterned mask layer is used to pattern the layers of the storage unit, as shown in FIG. 4g. For example, the patterned mask layer is used to pattern the bulk connector and connector liner layers as well as the cell stack. The patterned mask layer defines the area of the storage unit. In one embodiment, an anisotropic etch, such as RIE, is used to remove exposed portions of the storage unit layers and cell stack to define the area of the storage unit. Other types of etch processes may also be useful. The etch transfers the pattern of the mask layer to the underlying bulk connector and connector liner layers. After the patterning the layers, the mask layer is removed. In one embodiment, the mask layer is removed by ashing. Other techniques of removing the mask layer may also be useful. Etching of the layers creates recesses or gaps above the top surface of lower ILD layer.

In one embodiment, the pattern of the fourth mask is the reverse of the first mask pattern. This can be achieved using the same reticle, except one uses a positive photoresist while the other uses a negative photoresist. Alternatively, a distinct reticle may be used for patterning the fourth mask layer. The reticle, for example, is the reverse reticle of the first mask reticle.

Figure 4H:
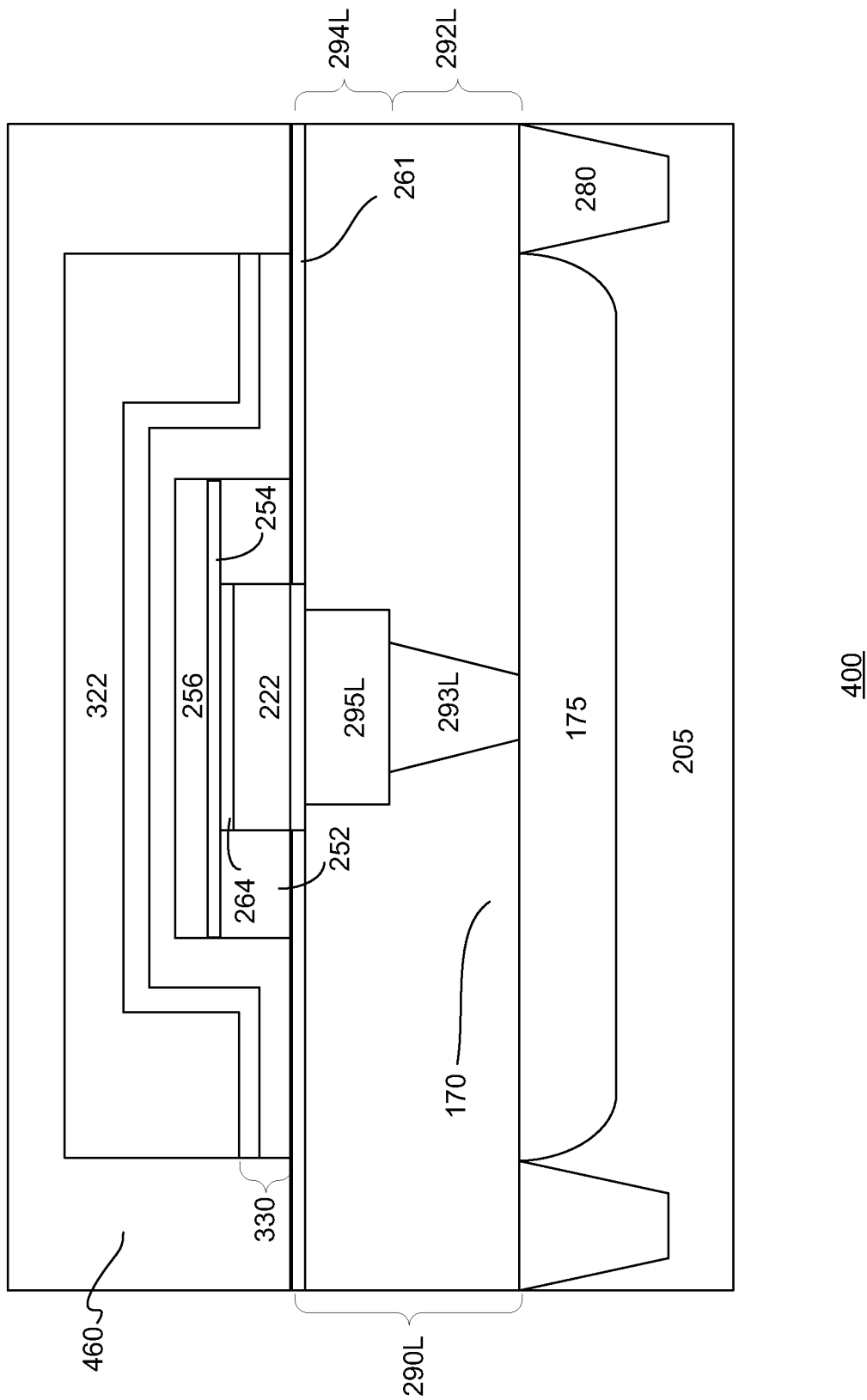

Referring to FIG. 4h, a dielectric layer 460 is formed on the substrate, filling the recesses as well as covering the defined layers of the storage unit. The dielectric layer is used to form the cell dielectric layer. The dielectric layer, for example is silicon oxide. Other types of dielectric materials may also be useful. In one embodiment, dielectric layer may be the same as the stack dielectric layers. The dielectric layer, for example, may be formed by CVD. Other techniques for forming the dielectric layer may also be useful.

Figure 4I:
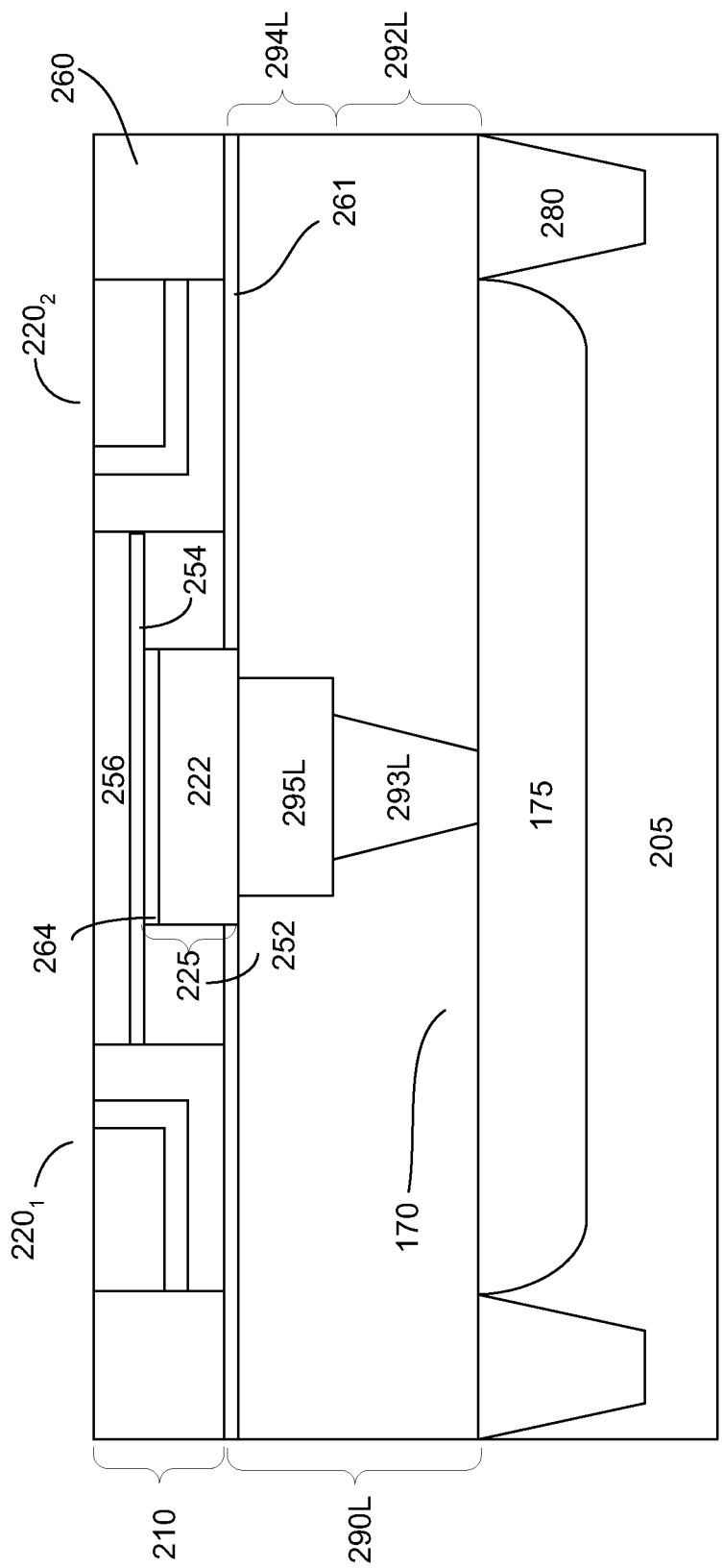

In FIG. 4i, excess dielectric material may be removed by a planarizing process. The planarizing process, for example, may be CMP. Other types of planarizing process may also be useful. Additionally, excess bulk connector and connector liner materials over the cell stacks are removed. The planarizing forms a planar surface over the substrate. For example, the top surfaces of the dielectric layer, cell stack, bulk connector and connector liner layers are co-planar. As such, the planarization process forms a storage unit 210 with first and second BL connection units $220_{1-2}$ and a cell stack with a cell connector 225 therebetween. The storage unit is disposed in the cell dielectric layer 260.

Figure 4J:
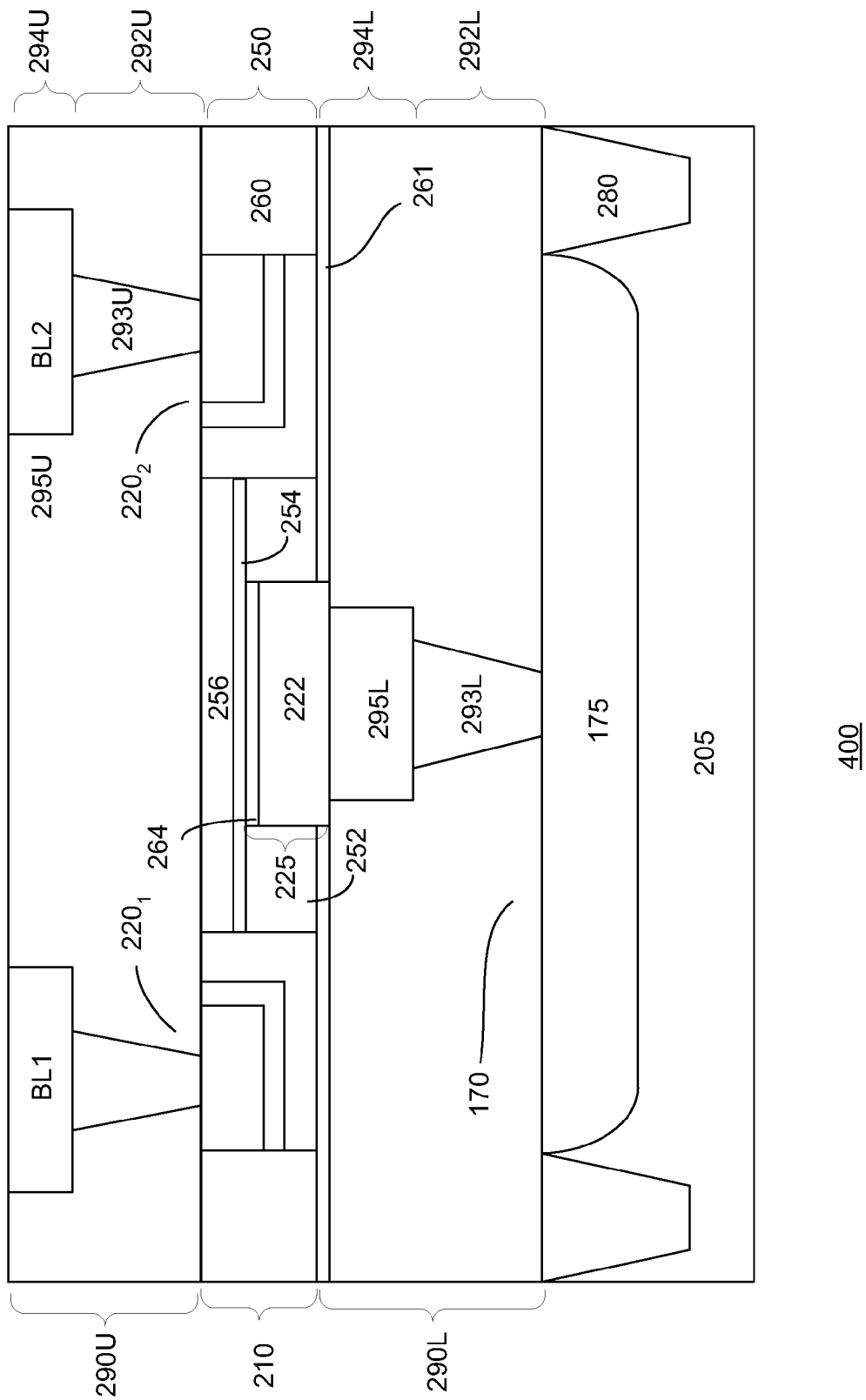

Referring to FIG. 4j, an upper ILD layer 290U is formed over the cell dielectric layer. The upper ILD layer may be silicon oxide. Other types of dielectric layers may also be useful. Various techniques may be used to form the upper ILD layer. For example, the upper ILD layer may be formed by CVD. First and second bitlines BL1 and BL2 are formed in the metal level of the upper ILD layer. BL1 and BL2 are coupled to first and second BL connection units by first and second bitline contacts in the upper contact level. The bitlines and contacts may be formed of copper or copper alloy. Other types of conductive materials may also be useful. The bitlines and contacts may be formed by dual damascene techniques. Other techniques for forming the bitlines and contacts may also be useful. The process continues to complete forming the device. The process may include, for example, forming additional metal levels, final passivation, dicing, packaging and testing. Other processes may also be included.

In other embodiments, the process may include forming one or more additional storage units stacked above the upper ILD layer. The additional storage units may be formed similarly as described. This forms a memory cell as described in, for example, FIGS. 2e-f.

The process of FIGS. 4a-j can be adopted to form a PCRAM, an ReRAM or a STT-RAM cell, similarly as described in FIGS. 3a-i.

With respect to the embodiment described in FIG. 2g, the process is similar to that described in FIGS. 4a-j. The difference is that the cell stack layer is patterned after its formation. The patterning of the cell stack layer forms recesses above the top surface of the lower stack dielectric layer. After patterning the cell stack layer, a cell stack connector layer is deposited and planarized to form a planar surface with the cell stack layer. The cell stack connector layer, for example, is an ECM layer, such as TiN. The cell stack connector layer, for example, serves as a heater layer. The cell stack connector layer may be formed by, for example, CVD. The planarizing process may be, for example, CMP. These process steps are performed after forming the cell stack layer. In one embodiment, thin insulator layer may be formed on the side of the liner of the BL connection units adjacent to the first side of the cell stack. As such, the insulator layer is in contact with the cell stack connectors. The thin insulator layer is formed after the patterning of the cell stack layers as shown in FIG. 4e. The insulator layer, for example, may be silicon oxide. The thin insulator layer may serve as a high voltage breakdown layer for initializing the memory cell. Other parts of the process are similar to that of FIGS. 4a-j.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:
1. A memory cell of a memory array having a plurality of memory cells interconnected by wordlines and bitlines comprising:
    a storage unit having at least first and second resistive elements R1 and R2, wherein a resistive element includes first and second storage terminals, the first storage terminal of R1 is coupled to a first bitline of the memory array at node N1 of the memory cell, and the first storage terminal of R2 is coupled to a second bitline of the memory array at node N2 of the memory cell;

a cell selector comprising first and second selector terminals, wherein the first selector terminal is coupled to a wordline of the memory array, and the second selector terminal is commonly coupled to the second storage terminals of R1 and R2 of the storage unit at node N3, the cell selector, when active, selects the memory cell for access; and when appropriate signals are applied to the memory cell, the cell selector selects an appropriate resistive element from the first and second resistive elements R1 and R2 of the storage unit.

2. The memory cell of claim 1 wherein the cell selector comprises a selector diode with first and second diode terminals, the first diode terminal serves as the first selector terminal and the second diode terminal serves as the second selector terminal.

3. The memory cell of claim 1 wherein the cell selector comprises a transistor having first, second and third transistor terminals, wherein the first transistor terminal serves as the first selector terminal, the second transistor terminal serves as the second selector terminal, and the third transistor terminal serves as a third selector terminal, the third selector terminal is coupled to a select line of the memory array interconnecting the memory cells.

4. The memory cell of claim 3 wherein:

the transistor comprises a field effect transistor having a source terminal, a gate terminal and a drain terminal, wherein:

the gate terminal serves as the first transistor terminal;

the drain terminal serves as the second transistor terminal; and the source terminal serves as the third transistor terminal.

5. The memory cell of claim 1 wherein:

the storage unit is disposed in a first storage dielectric layer disposed between first and second interlevel dielectric (ILD) layers on a substrate of the device; and the storage module is coupled to the selector at N3 disposed in the first storage dielectric layer.

6. The memory cell of claim 5 further comprises:

an additional storage module disposed in an additional storage dielectric layer disposed above the first storage dielectric layer; and the additional storage module includes an additional N3 in the additional storage dielectric layer which is coupled to N3 in the first storage dielectric layer to couple the storage modules to the cell selector, forming a stacked memory cell having a plurality of stacked memory modules coupled to a common cell selector.

7. The memory cell of claim 1 wherein the memory cell comprises:

a dual port dual-bit memory cell, wherein the first port is the first bitline and the second port is the second bitline; or a single port dual-bit memory cell, wherein the resistive elements represent a bit of the memory cell.

8. The memory cell of claim 1 comprises a PCRAM memory cell.

9. The memory cell of claim 1 comprises a ReRAM or STT-RAM memory cell.

10. A method of forming a memory cell comprising:

providing a substrate;

forming a cell stack, the cell stack includes a cell stack layer disposed between upper and lower cell stack dielectric layers; and forming first and second bitline (BL) connection units at opposing first sides of the cell stack, the BL connection units are coupled to the cell stack layer, wherein at least first and second resistive elements R1 and R2 are disposed at the interfaces of the cell stack layer and the first and second BL connection units, R1 and R2 having first and second terminals, wherein the first terminal of R1 is coupled to the first BL connection unit, and the first terminal of R2 is coupled to the second BL connection unit.

11. The method of claim 10 wherein forming the first and second BL connection units comprises forming a cell connector simultaneously.

12. The method of claim 11 wherein the cell connector is disposed between the first and second BL connection units, wherein:

the cell connector divides the cell stack into first and second cell stack sub-layers, the first cell stack sub-layer contacts adjacent sides of the first BL connection unit and the cell connector, while the second cell stack sub-layer contacts adjacent sides of the second BL connection unit and the cell connector; or the cell connector is disposed within the cell stack, wherein the cell stack layer is disposed on top of the cell connector and ends connected to the BL connection units.

13. The method of claim 12 wherein the memory cell comprises first and second resistive elements disposed at the interfaces of the cell stack layer and the first and second BL connection units, and wherein the BL connection units include a neck portion which is narrower than a main portion to reduce the cross-sectional area of the interface between the BL connection units and the cell stack layer.

14. The method of claim 12 wherein the cell stack layer comprises a phase change material to form a phase change random access memory (PCRAM) cell.

15. The method of claim 14 wherein the BL connection units comprise an insulator layer in contact with the cell stack layer for initializing breakdown of the memory cell.

16. The method of claim 14 wherein the BL connection units comprise a bulk connector and a connector liner, wherein the connector liner lines at least a side of the BL connection units contacting the cell stack layer.

17. The method of claim 16 wherein:

the bulk connector comprises an electrical connection material (ECM) with high conductivity; and the connector liner comprises a connector liner stack having a first ECM layer with bad thermal conductivity and a second ECM layer with high thermal conductivity, wherein second ECM layer contacts the cell stack layer.

18. The method of claim 17 wherein the top and bottom cell stack layers are doped with insulating islands or heating islands.

19. The method of claim 16 wherein:

the cell stack layer comprises cell stack end connectors which contact the connector liner of the BL connection units, wherein the end connectors comprise ECM with high thermal conductivity to serve as heating elements; and the connector liner of the BL connection units comprises ECM with bad thermal conductivity to serve as a heat shield.

20. A method of forming a memory cell comprising:
providing a substrate with a lower metal level;
forming a cell stack over the lower metal level, the cell stack includes a cell stack layer disposed between upper and lower cell stack dielectric layers, the cell stack layer comprises a phase change material; and
forming first and second bitline (BL) connection units at opposing first sides of the cell stack, wherein the BL connection units include a neck portion which is narrower than a main portion and are coupled to the cell stack layer by cell stack connectors disposed between the ends of the cell stack layer and BL connection units, the cell stack connectors serve as heaters for the cell stack layer.

21. The method of claim 20 wherein the BL connection units comprise an insulator layer in contact with the cell stack connectors for initializing breakdown of the memory cell.

22. The method of claim 20 wherein the cell stack layer is doped with insulating islands or heating islands.

23. A memory cell of a memory array having a plurality of memory cells interconnected by wordlines and bitlines, the memory cell comprising:

a storage unit having a plurality of resistive elements, wherein a resistive element includes
   a first storage terminal couples to a bitline or bitlines of the memory array,
wherein different first terminals of the plurality of resistive elements of the storage unit are coupled to different bitlines of the memory array,
   a second storage terminal, the second storage terminal is commonly coupled to the second terminals of other storage elements in the storage unit, the second storage terminals of the plurality of resistive elements form a common storage unit node;
a cell selector comprising first and second selector terminals, wherein the first selector terminal is coupled to a wordline of the memory array, the second selector terminal is coupled to the storage unit through the common storage unit node, the cell selector, when active, selects the memory cell for access; and
when appropriate signals are applied to the memory cell, the cell selector selects an appropriate resistive element from the first and second resistive elements of the storage unit.

* * * * *